(12) United States Patent
Arigane et al.

(10) Patent No.: US 8,385,124 B2
(45) Date of Patent: Feb. 26, 2013

(54) SEMICONDUCTOR DEVICE AND MANUFACTURING METHOD THEREOF

(75) Inventors: Tsuyoshi Arigane, Akishima (JP); Digh Hisamoto, Kokubunji (JP); Yasuhiro Shimamoto, Tokorozawa (JP); Yutaka Okuyama, Kokubunji (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 141 days.

(21) Appl. No.: 13/075,169

(22) Filed: Mar. 29, 2011

(65) Prior Publication Data

US 2011/0242888 A1    Oct. 6, 2011

(30) Foreign Application Priority Data

Mar. 30, 2010   (JP) ................................ 2010-077538

(51) Int. Cl.
*G11C 16/04* (2006.01)

(52) U.S. Cl. ......... 365/185.18; 365/185.14; 365/185.26; 365/185.27

(58) Field of Classification Search ............. 365/185.18, 365/185.14, 185.26, 185.27
See application file for complete search history.

(56) References Cited

U.S. PATENT DOCUMENTS

| | | | |
|---|---|---|---|
| 7,751,255 B2 | 7/2010 | Hisamoto et al. | |
| 8,138,537 B2* | 3/2012 | Sato | 257/296 |
| 8,189,397 B2* | 5/2012 | Eitan et al. | 365/185.25 |
| 8,222,687 B2* | 7/2012 | Yaegashi | 257/321 |
| 8,278,695 B2* | 10/2012 | Kidoh et al. | 257/314 |
| 2002/0140023 A1 | 10/2002 | Ohba et al. | |
| 2005/0265080 A1 | 12/2005 | Hisamoto et al. | |
| 2007/0183206 A1 | 8/2007 | Hisamoto et al. | |
| 2010/0224927 A1* | 9/2010 | Ishihara et al. | 257/324 |
| 2010/0232231 A1 | 9/2010 | Hisamoto et al. | |
| 2010/0246269 A1* | 9/2010 | Kan et al. | 365/185.18 |

FOREIGN PATENT DOCUMENTS

| | | |
|---|---|---|
| JP | 2002-289710 A | 10/2002 |
| JP | 2006-12382 A | 1/2006 |
| JP | 2009-105426 A | 5/2009 |

* cited by examiner

*Primary Examiner* — Pho M Luu
(74) *Attorney, Agent, or Firm* — Miles and Stockbridge P.C.

(57) ABSTRACT

The semiconductor device includes the nonvolatile memory cell in the main surface of a semiconductor substrate. The nonvolatile memory cell has a first insulating film over the semiconductor substrate, a conductive film, a second insulating film, the charge storage film capable of storing therein charges, a third insulating film over the charge storage film, a first gate electrode, a fourth insulating film in contact with the set of stacked films from the first insulating film to the foregoing first gate electrode, a fifth insulating film juxtaposed with the first insulating film over the foregoing semiconductor substrate, a second gate electrode formed over the fifth insulating film to be adjacent to the foregoing first gate electrode over the side surface of the fourth insulating film, and source/drain regions with the first and second gate electrodes interposed therebetween. The conductive film and the charge storage film are formed to two-dimensionally overlap.

30 Claims, 45 Drawing Sheets

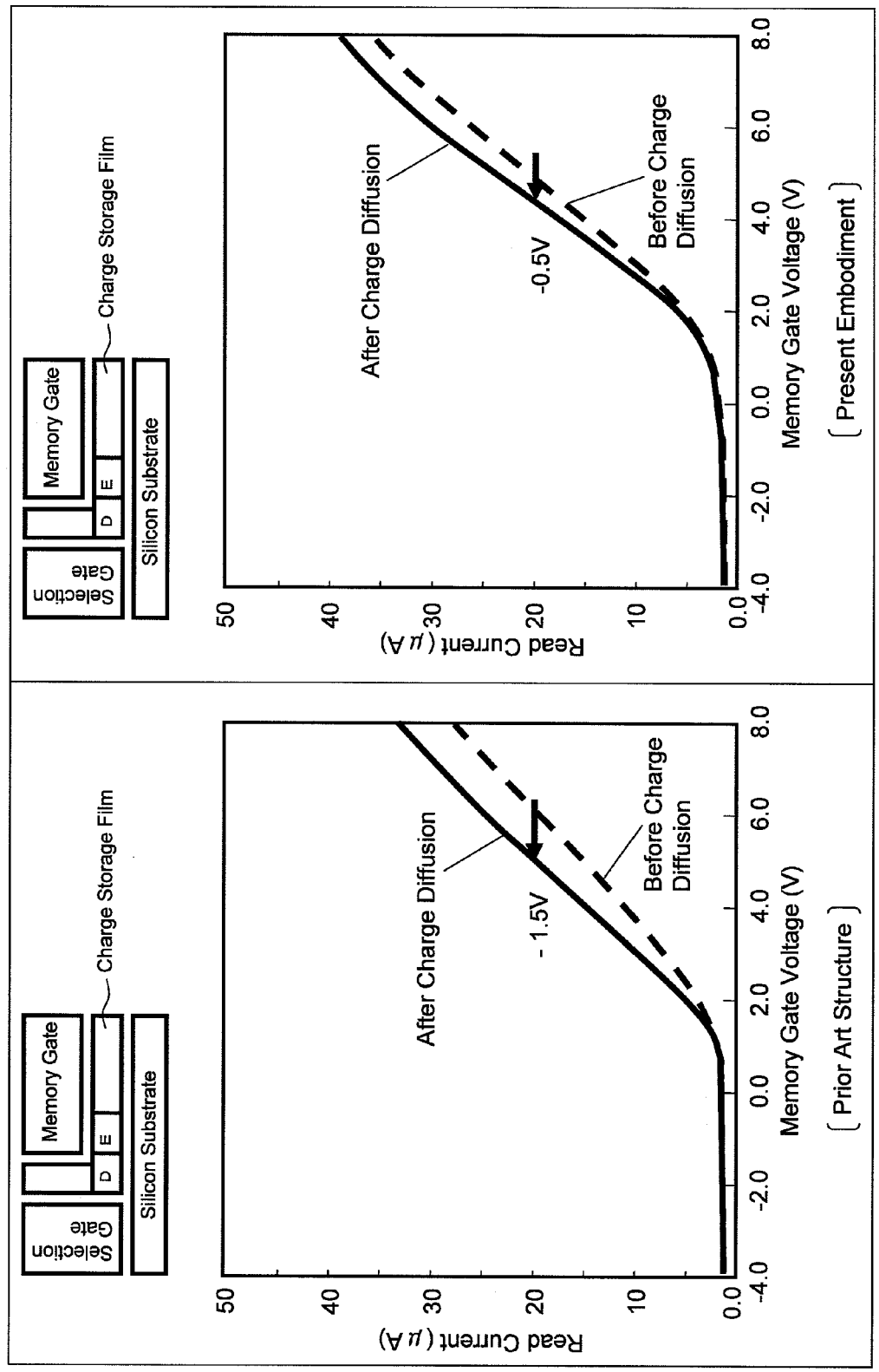

SEMICONDUCTOR DEVICE AND MANUFACTURING METHOD THEREOF

CROSS-REFERENCE TO RELATED APPLICATIONS

The present application claims priority from Japanese patent application JP 2010-077538 filed on Mar. 30, 2010, the content of which is hereby incorporated by reference into this application

BACKGROUND

The present invention relates to a semiconductor device including a nonvolatile memory, particularly a semiconductor device including a nonvolatile memory cell having a charge storage film formed of an insulating film capable of storing therein charges, e.g., a semiconductor device including a MONOS (Metal Oxide Nitride Oxide Semiconductor) nonvolatile memory cell, and a manufacturing method thereof.

Semiconductor memories can be roughly divided into a "volatile memory" which loses a memory content when a power supply is turned off and a "nonvolatile memory" which retains a memory content even when a power supply is turned off. Nonvolatile memories have been developed as storage media mainly for storing data and programs for devices such as a personal digital assistant, a digital camera, and a personal computer. Nonvolatile memories include products of which higher reliability is required than that required of a typical nonvolatile memory, which are for, e.g., in-vehicle use, medical equipment, and the like. The products use memory cells each having a stacked insulating film structure in which a silicon nitride film is interposed between silicon oxide films, and are known as MONOS (Metal Oxide Nitride Oxide Semiconductor) nonvolatile memories. In a method of storing charges in a floating gate, which is generally widely used for a nonvolatile memory, a defective bit resulting from a defect in a tunnel oxide film may occur. By contrast, the MONOS nonvolatile memory uses a discrete storage method which stores charges in a silicon nitride film, and is therefore characterized by having a high-reliability charge retention property without depending on the state of the tunnel oxide film.

In Patent Document 1 (Japanese Unexamined Patent Publication No. 2006-12382), a so-called split-gate MONOS nonvolatile semiconductor memory device is disclosed in which a memory gate for operating a memory and a selection gate for performing cell selection are separately formed.

In Patent Documents 2 and 3 (Japanese Unexamined Patent Publications Nos. 2002-289710 and 2009-105426), it is stated that, in a nonvolatile memory, silicon dots are discretely formed in a tunnel insulating film between a silicon substrate and a charge storage portion. Thus, a technology is disclosed which uses a Coulomb blockade effect to reduce the likelihood of charge loss, and improves the data retention property of a memory cell.

PRIOR ART DOCUMENTS

Patent Documents

[Patent Document 1]
Japanese Unexamined Patent Publication No. 2006-12382
[Patent Document 2]
Japanese Unexamined Patent Publication No. 2002-289710
[Patent Document 3]
Japanese Unexamined Patent Publication No. 2009-105426

SUMMARY

As described above, a semiconductor device is occasionally required of high quality and reliability even in a situation where an external environment is harsh, such as, e.g., when used in a vehicle. A MONOS nonvolatile memory also has had need of a technology which allows higher reliability to be obtained in future.

In Patent Document 1 described above, as basic operations of a MONOS nonvolatile memory cell, four operations of (1) Data Writing, (2) Data Erasing, (3) Data Retention, and (4) Data Reading are disclosed.

As a result of study performed by the present inventors, it has been found that, in the semiconductor memory device of Patent Document 1, different charges are injected from different directions into an insulating film (silicon nitride film) during the respective operations of (1) Data Writing and (2) Data Erasing so that there is room for an improvement as shown below.

During (1) Data Writing, a positive potential is given to a memory-gate-side diffusion layer and, to a selection-gate-side diffusion layer, the same ground potential as that of a substrate is given. By applying a high gate over-drive voltage to the memory gate, a channel under the memory gate is brought into an ON state. Here, by setting the potential of the selection gate to a value higher than the threshold by, e.g., 0.1 V to 0.2 V, the ON state is achieved. At this time, in the vicinity of the boundary between the two gates, a most intense electric field is formed so that numerous hot electrons are generated, and injected into a memory-gate-side. A conceptual image of the data writing operation is shown in FIG. 48.

This phenomenon is known as a source side injection. Hot electron injection in accordance with this method is characterized in that, since the electric field is concentrated on the vicinity of the boundary between the selection gate and the memory gate, charges (electrons) are injected in a concentrated manner into the selection-gate-side end portion of the memory gate.

It has been found that, after the data writing, charges are retained in a biasedly distributed state in an insulating film (silicon nitride film), and the distribution of the electric field between the insulating film (silicon nitride film) and a silicon substrate becomes non-uniform. As a result, when a memory cell in a written state is allowed to stand, electrons and holes are diffused in the silicon nitride film and recombined due to the self-fields thereof. This reduces the threshold of the memory cell, and may cause the degradation of the data retention property.

During (2) Data Erasing, a negative potential is given to the memory gate, and a positive potential is given to the memory-gate-side diffusion layer, resulting in the occurrence of strong inversion in the region of the end portion of the diffusion layer where the memory gate and the diffusion layer overlap. This induces a band-to-band tunneling phenomenon, and allows holes to be generated.

In the memory cell, the generated holes are accelerated in the direction of the channel, and attracted by a bias applied to the memory gate. The charges (holes) are injected in a concentrated manner into the diffusion-layer-side (drain-region-side) end portion of the memory gate, thereby allowing an erase operation to be performed. A conceptual image of the data erasing operation is shown in FIG. 48. That is, the threshold of the memory gate that has risen due to the charges of electrons can be reduced with the charges of injected holes.

It has been found that, during data erasing also, the charges are retained in a biasedly distributed state in the insulating film (silicon nitride film) so that the distribution of the electric field between the insulating film (silicon nitride film) and the silicon substrate becomes non-uniform. As a result, the electrons and the holes are diffused in the silicon nitride film and recombined due to the self-fields thereof. In the same manner as during data writing, this also reduces the threshold of the memory cell, and may cause the degradation of the data retention property.

According to the result of another study performed by the present inventors, charges are uniformly injected in an insulating film (silicon nitride film) in a so-called NROM nonvolatile memory cell structure disclosed in each of Patent Documents 2 and 3 described above. Therefore, a charge distribution immediately after writing or erasing has reduced non-uniformity compared with that in a nonvolatile memory having a so-called split-gate structure as disclosed in Patent Document 1. However, it may be considered that, after any of charges is detrapped (stripped), the charge distribution shifts to a non-uniform state with density unevenness. A conceptual image of the detrapping (stripping) of the charge is shown in FIG. 49. It has been found that, when the memory cell is allowed to stand in such a state, charges are diffused due to the self-fields thereof so as to uniformize the distribution with density unevenness. As a result, the threshold of the memory cell increases, and may cause the degradation of the data retention property.

An object of the present invention is to suppress the degradation of a data retention property in a semiconductor device including a nonvolatile memory cell having a charge storage film capable of storing therein charges, and improve the reliability thereof.

The above and other objects and novel features of the present invention will become apparent from a statement in the present specification and the accompanying drawings.

The following is a brief description of the outline of a representative aspect of the invention disclosed in the present application.

That is, in a semiconductor device having a MONOS nonvolatile memory cell, a conductive film is provided between a semiconductor substrate and a charge storage film.

The following is a brief description of effects achievable by the representative aspect of the invention disclosed in the present application.

That is, in the semiconductor device including the nonvolatile memory cell having the charge storage film capable of storing therein charges, it is possible to improve the degraded data retention property, and improve the reliability thereof.

BRIEF DESCRIPTION OF THE DRAWINGS

FIG. 9 is a view showing a current-voltage characteristic;

DETAILED DESCRIPTION

Summary of the Embodiments

Figure 1:
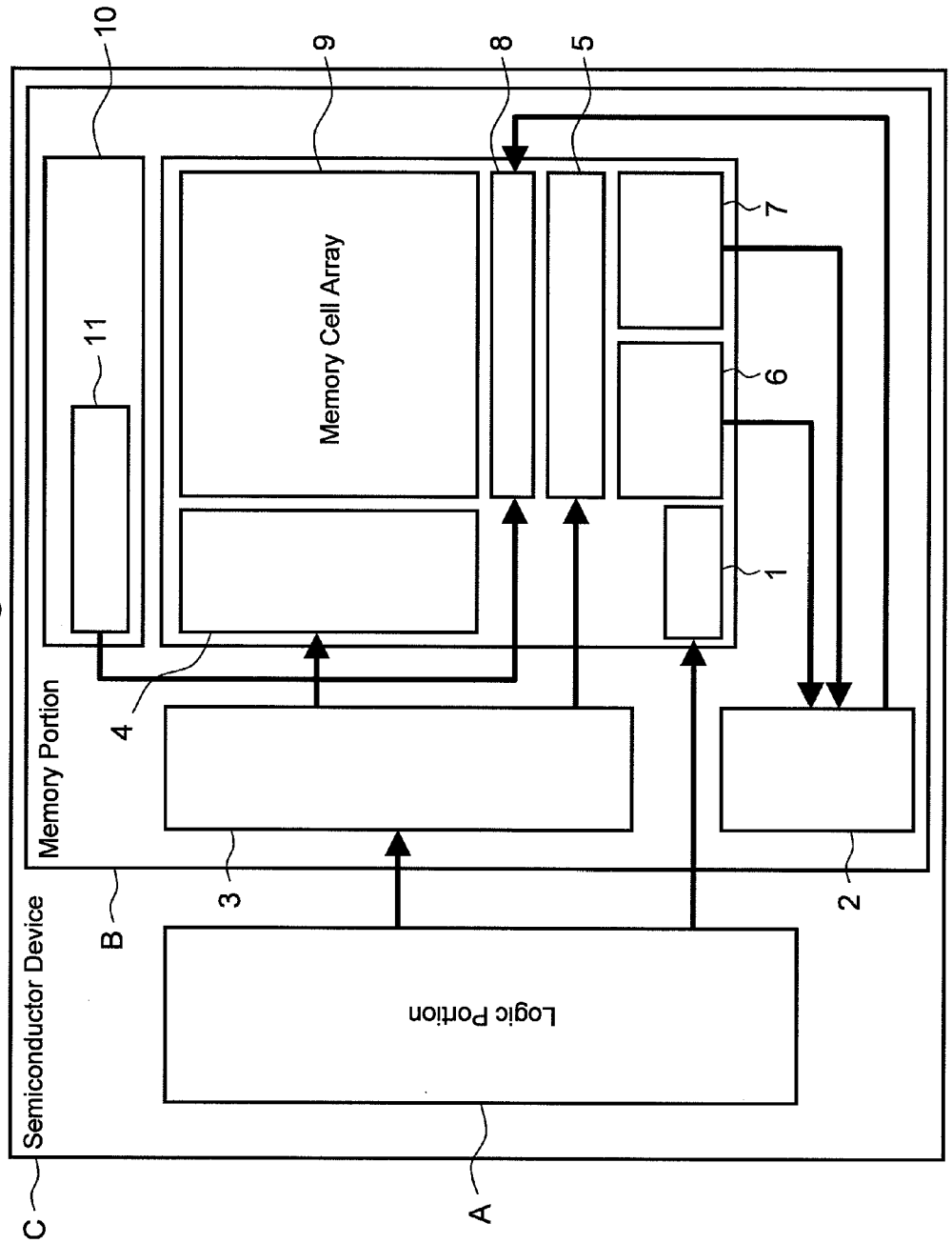
FIG. 1 is a block diagram of a semiconductor device according to a first embodiment.

First, the summary of representative embodiments of the invention disclosed in the present application will be described. Reference numerals in the drawings which are parenthetically referenced in the description of the summary of the representative embodiments only show examples of those included in the concept of the components to which the reference numerals are added.

1. First Embodiment

A semiconductor device includes a nonvolatile memory cell formed in a main surface of a semiconductor substrate. The foregoing nonvolatile memory cell has a first insulating film formed over the foregoing semiconductor substrate, a conductive film formed over the foregoing first insulating film, a second insulating film formed over the foregoing conductive film, and a charge storage film formed over the foregoing second insulating film to be capable of storing therein charges. The foregoing nonvolatile memory cell also has a third insulating film formed over the foregoing charge storage film, a first gate electrode formed over the foregoing third insulating film, a fourth insulating film formed to come in contact with the set of stacked films from the foregoing first insulating film to the foregoing first gate electrode, and a fifth insulating film formed over the foregoing semiconductor substrate so as to be juxtaposed with the foregoing first insulating film. The foregoing nonvolatile memory cell further has a second gate electrode formed over the foregoing fifth insulating film and a side surface of the foregoing fourth insulating film so as to be adjacent to the foregoing first gate electrode, and source/drain regions formed in the foregoing semiconductor substrate such that the foregoing first gate electrode and the foregoing second gate electrode are each interposed therebetween. In the foregoing semiconductor device, the foregoing conductive film and the foregoing charge storage film are formed to two-dimensionally overlap each other.

2. Range of Overlap between Conductive Film and Charge Storage Film

In the semiconductor device of Claim 1 described above, the foregoing conductive film and the foregoing charge storage film are each formed to extend from the foregoing source/drain region adjacent to the foregoing first insulating film to the foregoing fourth insulating film.

3. Material of Conductive Film

In the semiconductor device of Claim 1 described above, the foregoing conductive film is a doped polysilicon film doped with a p-type impurity or an n-type impurity.

4. Material of Charge Storage Film

In the semiconductor device of Claim 1 described above, the foregoing charge storage film is a silicon nitride film.

5. Thickness of Conductive Film

In the semiconductor device of Claim 1 described above, the foregoing conductive film has a thickness of 1 to 10 nm.

6. Relationship between Thicknesses of Tunnel Insulating Films

In the semiconductor device of Claim 1 described above, a sum of respective thicknesses of the foregoing first insulating film and the foregoing second insulating film is smaller than a thickness of the foregoing third insulating film.

7. Selection Gate Having Sidewall Shape

In the semiconductor device of Claim 1 described above, the foregoing second gate electrode has a sidewall shape.

8. Hot Electron Writing Using Injected Charge Distribution with Density Unevenness In the semiconductor device of Claim 1 described above, a first voltage, a second voltage, a third voltage, and a fourth voltage lower than the foregoing third voltage are respectively applied to the foregoing first gate electrode, the foregoing second gate electrode, the foregoing drain region closer to the foregoing first gate electrode, and the foregoing source region closer to the foregoing second gate electrode to cause transfer of charges to and from the foregoing charge storage film.

9. Second Embodiment

A semiconductor device includes a nonvolatile memory cell formed in a main surface of a semiconductor substrate. The foregoing nonvolatile memory cell has a first insulating film formed over the foregoing semiconductor substrate, a conductive film formed over the foregoing first insulating film, a second insulating film formed over the foregoing conductive film, and a charge storage film formed over the foregoing second insulating film to be capable of storing therein charges. The foregoing nonvolatile memory cell also has a third insulating film formed over the foregoing charge storage film, a first gate electrode formed over the foregoing third insulating film, and a fourth insulating film formed over the foregoing semiconductor substrate so as to be juxtaposed with the foregoing first insulating film. The foregoing nonvolatile memory cell further has a second gate electrode formed over the foregoing fourth insulating film and a side surface of the foregoing first insulating film so as to be adjacent to the foregoing first gate electrode, and source/drain regions formed in the foregoing semiconductor substrate such that the foregoing first gate electrode and the foregoing second gate electrode are each interposed therebetween. In the foregoing semiconductor device, the set of stacked films from the foregoing first insulating film to the foregoing third insulating film have respective portions each extending along the main surface of the foregoing semiconductor substrate and respective portions each extending along a side surface of the foregoing second gate electrode.

10. Range of Overlap between Conductive Film and Charge Storage Film

In the semiconductor device of Claim 9 described above, the set of stacked films from the foregoing first insulating film to the foregoing third insulating films are formed to extend from the foregoing source/drain region adjacent to the foregoing first insulating film to a vicinity of an uppermost portion of a surface of the foregoing second gate electrode in contact with the foregoing first insulating film.

11. Material of Conductive Film

In the semiconductor device of Claim 9 described above, the foregoing conductive film is a doped polysilicon film doped with a p-type impurity or an n-type impurity.

12. Material of Charge Storage Film

In the semiconductor device of Claim 9 described above, the foregoing charge storage film is a silicon nitride film.

13. Thickness of Conductive Film

In the semiconductor device of Claim 9 described above, the foregoing conductive film has a thickness of 1 to 10 nm.

14. Relationship between Thicknesses of Tunnel Insulating Films

In the semiconductor device of Claim 9 described above, a sum of respective thicknesses of the foregoing first insulating film and the foregoing second insulating film is smaller than a thickness of the foregoing third insulating film.

15. Memory Gate Having Sidewall Shape

In the semiconductor device of Claim 9 described above, the foregoing first gate electrode has a sidewall shape.

16. Hot Electron Writing Using Injected Charge Distribution with Density Unevenness In the semiconductor device of Claim 9 described above, a first voltage, a second voltage, a third voltage, and a fourth voltage lower than the foregoing third voltage are respectively applied to the foregoing first gate electrode, the foregoing second gate electrode, the foregoing drain region closer to the foregoing first gate electrode, and the foregoing source region closer to the foregoing second gate electrode to cause transfer of charges to and from the foregoing charge storage film.

17. Third Embodiment

A semiconductor device includes a nonvolatile memory cell formed in a main surface of a semiconductor substrate. The foregoing non-volatile memory cell has a first insulating film formed over the foregoing semiconductor substrate, a conductive film formed over the foregoing first insulating film, a second insulating film formed over the foregoing conductive film, and a charge storage film formed over the foregoing second insulating film to be capable of storing therein charges. The foregoing non-volatile memory cell also has a third insulating film formed over the foregoing charge storage film, a first gate electrode formed over the foregoing third insulating film, a fourth insulating film formed to come in contact with the set of stacked films from the foregoing first insulating film to the foregoing charge storage film, and a fifth insulating film formed over the foregoing semiconductor substrate so as to be juxtaposed with the foregoing first insulating film. The foregoing non-volatile memory cell further has a second gate electrode formed over the foregoing fifth insulating film and a side surface of the foregoing fourth insulating film so as to be adjacent to the foregoing first gate electrode, and source/drain regions formed in the foregoing semiconductor substrate such that the foregoing first gate electrode and the foregoing second gate electrode are each interposed therebetween. In the foregoing semiconductor device, the foregoing charge storage film and the foregoing third insulating film have respective portions each extending along the main surface of the foregoing semiconductor substrate and respective portions each extending along a side surface of the foregoing second gate electrode.

18. Range of Overlap between Conductive Film and Charge Storage Film

In the semiconductor device of Claim 17 described above, the foregoing conductive film is formed to extend from the foregoing source/drain region adjacent to the foregoing first insulating film to the foregoing fourth insulating film.

19. Material of Conductive Film

In the semiconductor device of Claim 17 described above, the foregoing conductive film is a doped polysilicon film doped with a p-type impurity or an n-type impurity.

20. Material of Charge Storage Film

In the semiconductor device of Claim 17 described above, the foregoing charge storage film is a silicon nitride film.

21. Thickness of Conductive Film

In the semiconductor device of Claim 17 described above, the foregoing conductive film has a thickness of 1 to 10 nm.

22. Relationship between Thicknesses of Tunnel Insulating Films

In the semiconductor device of Claim 17 described above, a sum of respective thicknesses of the foregoing first insulating film and the foregoing second insulating film is smaller than a thickness of the foregoing third insulating film.

23. Memory Gate and Selection Gate Both Having Sidewall Shapes

In the semiconductor device of Claim 17 described above, the foregoing first gate electrode has a sidewall shape.

24. Hot Electron Writing Using Injected Charge Distribution with Density Unevenness In the semiconductor device of Claim 17 described above, a first voltage, a second voltage, a third voltage, and a fourth voltage lower than the foregoing third voltage are respectively applied to the foregoing first gate electrode, the foregoing second gate electrode, the foregoing drain region closer to the foregoing first gate electrode, and the foregoing source region closer to the foregoing second gate electrode to cause transfer of charges to and from the foregoing charge storage film.

25. Fourth Embodiment

A semiconductor device includes a nonvolatile memory cell formed in a main surface of a semiconductor substrate. The foregoing non-volatile memory cell has a first insulating film formed over the foregoing semiconductor substrate, a first gate electrode formed over the foregoing first insulating film, and a second insulating film and a third insulating film formed along side surfaces of the foregoing first gate electrode and the main surface of the foregoing semiconductor substrate. The foregoing non-volatile memory cell also has a first conductive film and a second conductive film respectively formed over the foregoing second insulating film and the foregoing third insulating film, a fourth insulating film and a fifth insulating film respectively formed over the foregoing first conductive film and the foregoing second conductive film, and a first charge storage film and a second charge storage film respectively formed over the foregoing fourth insulating film and the foregoing fifth insulating film to be capable of storing therein charges. The foregoing non-volatile memory cell further has a sixth insulating film and a seventh insulating film respectively formed over the foregoing first charge storage film and the foregoing second charge storage film, a second gate electrode and a third gate electrode respectively formed over the foregoing sixth insulating film and the foregoing seventh insulating film, and source/drain regions formed in the foregoing semiconductor substrate such that the foregoing first gate electrode, the foregoing second gate electrode, and the foregoing third gate electrode are each interposed therebetween. In the foregoing semiconductor device, the set of films from the foregoing second insulating film to the foregoing seventh insulating film have respective portions each extending along the main surface of the foregoing semiconductor substrate and respective portions each extending along a side surface of the foregoing second gate electrode.

26. Fifth Embodiment

A semiconductor device includes a nonvolatile memory cell formed in a main surface of a semiconductor substrate. The foregoing nonvolatile memory cell has a first insulating film formed over the foregoing semiconductor substrate, a conductive film formed over the foregoing first insulating film, a second insulating film formed over the foregoing conductive film, and a charge storage film formed over the foregoing second insulating film to be capable of storing therein charges. The foregoing nonvolatile memory cell also has a third insulating film formed over the foregoing charge storage film, a gate electrode formed over the foregoing third insulating film, and source/drain regions formed in the foregoing semiconductor substrate such that the foregoing gate electrode is interposed therebetween. In the foregoing semiconductor device, the foregoing conductive film and the foregoing charge storage film are formed to two-dimensionally overlap each other.

27. Manufacturing Method of First Embodiment

A method of manufacturing a semiconductor device including a nonvolatile memory cell, includes the steps of: (a) forming a first insulating film over a semiconductor substrate; (b) forming a conductive film over the foregoing first insulating film; (c) forming a second insulating film over the foregoing conductive film; (d) forming a charge storage film capable of storing therein charges over the foregoing second insulating film; (e) forming a third insulating film over the foregoing charge storage film; (f) forming a first gate electrode film over the foregoing third insulating film; (g) processing the set of stacked films from the foregoing first insulating film to the foregoing first gate electrode film by dry etching to form a first gate electrode; (h) after the foregoing step (g), forming a fourth insulating film over a side surface of the foregoing first gate electrode; (i) after the foregoing step (h), forming a fifth insulating film over the foregoing semiconductor substrate; (j) after the foregoing step (i), forming a second gate electrode film over the foregoing fifth insulating film; (k) after the foregoing step (j), processing the foregoing second gate electrode film into a sidewall shape by dry etching to form a second gate electrode; and (l) after the foregoing step (k), introducing an impurity into the foregoing semiconductor substrate to form source/drain regions of the foregoing nonvolatile memory cell.

28. Material of Conductive Film

In the foregoing step (b) in the method of manufacturing the semiconductor device of Section 27 described above, the foregoing conductive film is formed of a doped polysilicon film doped with a p-type impurity or an n-type impurity.

29. Material of Charge Storage Film

In the foregoing step (d) in the method of manufacturing the semiconductor device of Section 27 described above, the charge storage film is formed of a silicon nitride film.

30. Thickness of Conductive Film

In the foregoing step (b) in the method of manufacturing the semiconductor device of Section 27 described above, the conductive film is formed to have a thickness of 1 to 10 nm.

Further Detailed Description of the Embodiments

The embodiments will be described in greater detail. In each of the drawings, the same or similar parts are denoted by the same or similar symbols or reference numerals, and description thereof will not be repeated in principle.

In the accompanying drawings, hatching or the like may be omitted even in a cross section when hatching or the like results in complicated illustration or when the distinction between a portion to be hatched and a vacant space is distinct. In relation thereto, even a two-dimensionally closed hole may have a background outline thereof omitted when it is obvious from the description that the hole is two-dimensionally closed and so on. On the other hand, even a portion other than a cross section may be hatched to clearly show that the hatched portion is not a vacant space.

First Embodiment

Hereinbelow, a semiconductor device according to a first embodiment will be described using FIGS. 1 to 10.

Figure 2:
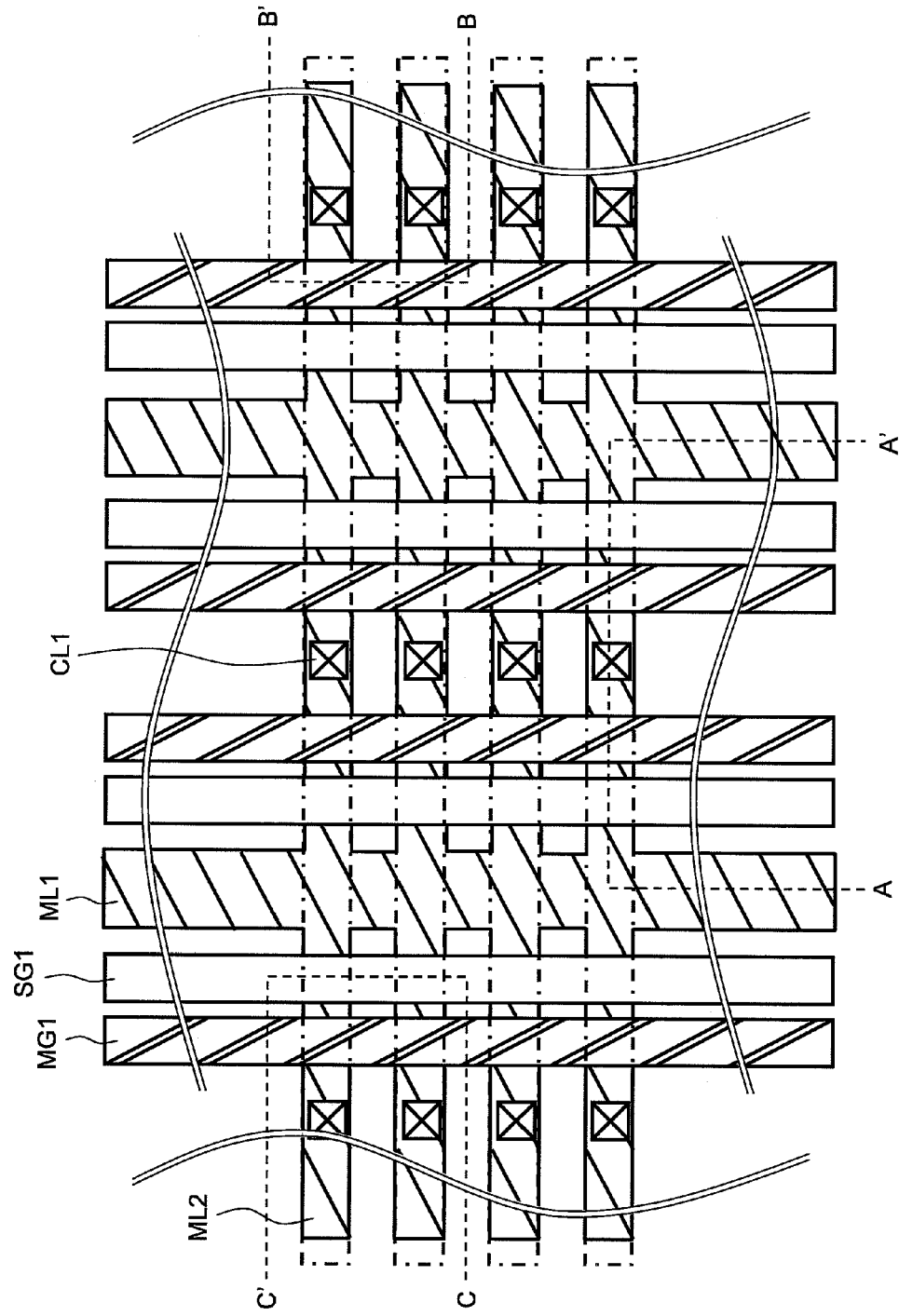
FIG. 2 is a partial plan view of a memory cell array in the semiconductor device according to the first embodiment.
Figure 3:
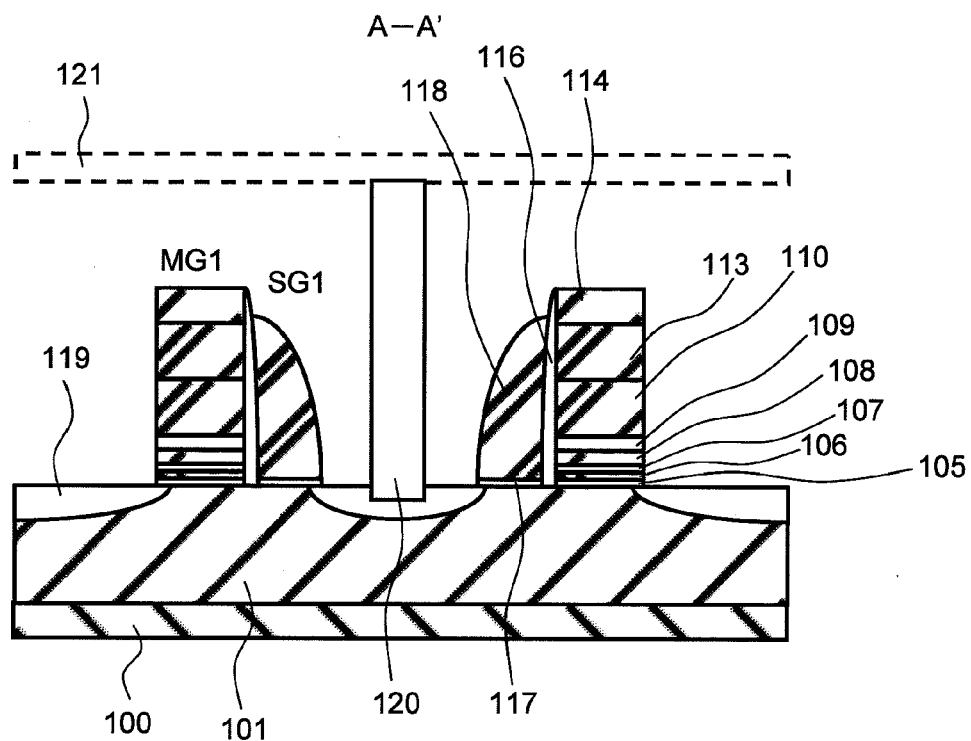
FIG. 3 is a partial cross-sectional view of the semiconductor device along the line A-A' in FIG. 2.
Figure 4:
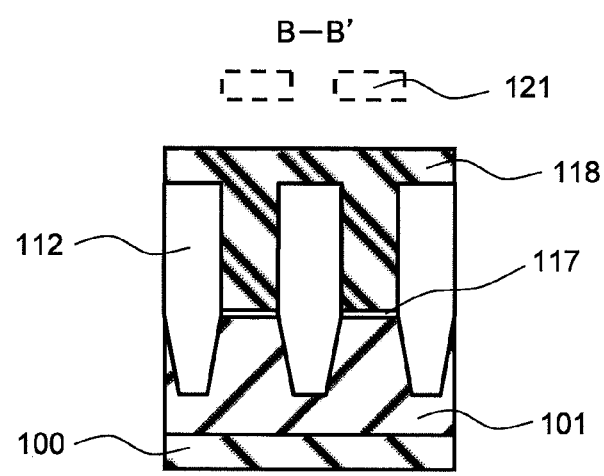
FIG. 4 is a partial cross-sectional view of the semiconductor device along the line B-B' in FIG. 2.
Figure 5:
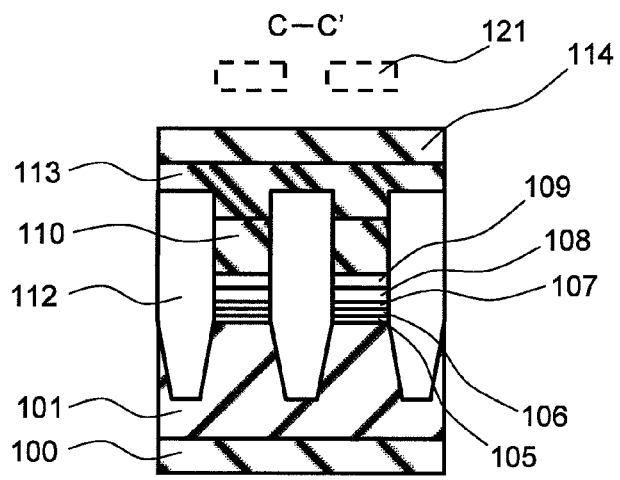
FIG. 5 is a partial cross-sectional view of the semiconductor device along the line C-C' in FIG. 2.
Figure 6:
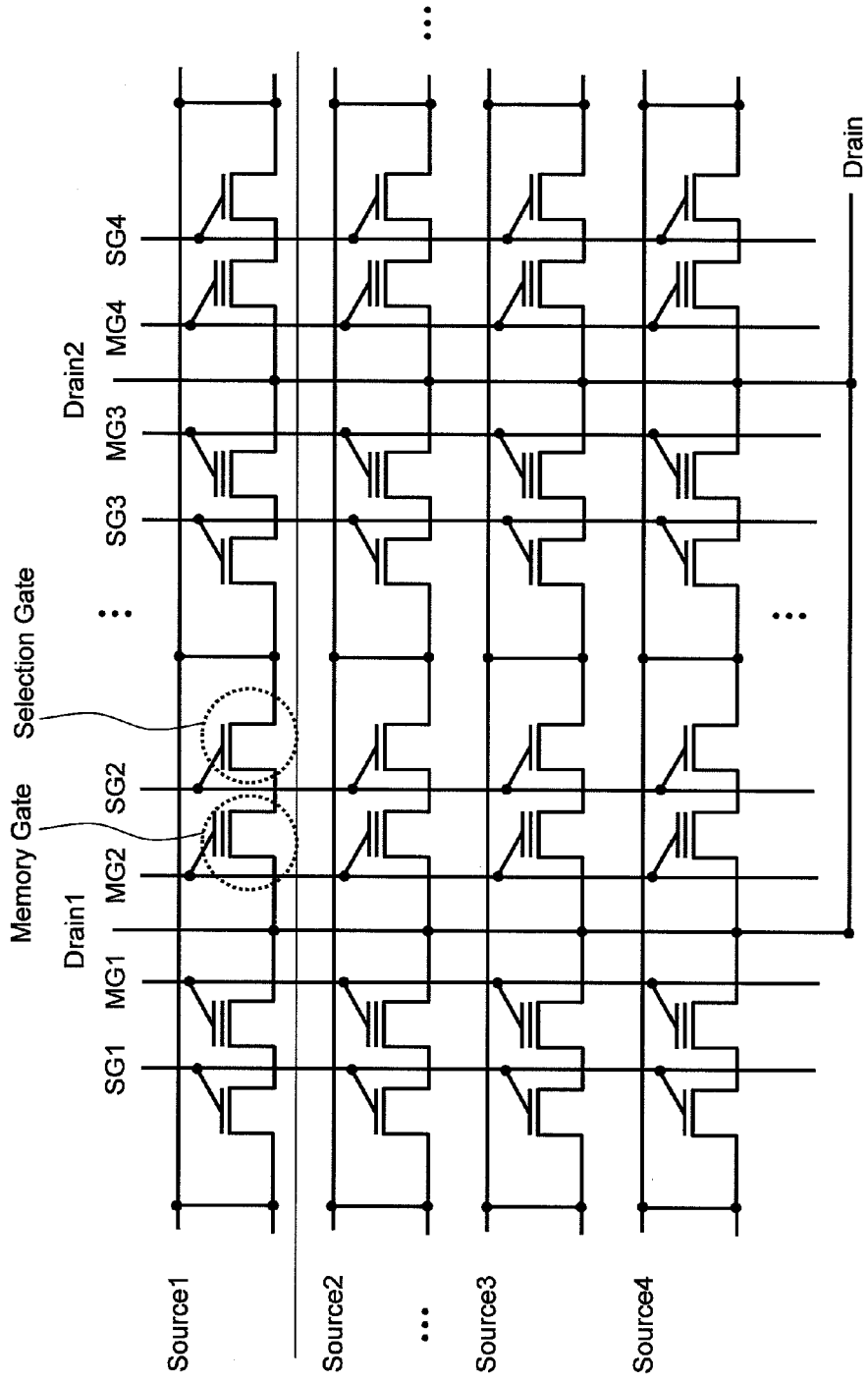
FIG. 6 is an equivalent circuit diagram corresponding to FIG. 2.

FIG. 1 is a block diagram of a semiconductor device according to the present embodiment. FIG. 2 is a partial plan view showing an example of a memory cell array in FIG. 1. FIGS. 3 to 5 are partial cross-sectional views along the respective lines A-A', B-B', and C-C' in FIG. 2. FIG. 6 is an equivalent circuit diagram corresponding to the memory cell array of FIG. 2.

First, using FIG. 1, a structure of the semiconductor device according to the present embodiment will be described. A semiconductor device C of the present embodiment includes a logic portion A and a memory portion B.

The memory portion B includes a control circuit 1, an input/output circuit 2, an address buffer 3, a row decoder 4, a column decoder 5, a verify sense amplifier circuit 6, a high-speed read sense amplifier circuit 7, a write circuit 8, a memory cell array 9, a power supply circuit 10, and the like.

The control circuit 1 performs temporary storage/control of a control signal inputted thereto from the logic portion A. The control circuit 1 performs control of the potentials of the gate electrodes of memory cells in the memory cell array 9. To and from the input/output circuit 2, various data including data to be read from or written to the memory cell array 9 is inputted and outputted. The address buffer 3 temporarily stores therein an address inputted thereto from the logic portion A.

To the address buffer 3, the row decoder 4 and the column decoder 5 are each coupled. The row decoder 4 performs decoding based on a row address outputted from the address buffer 3. The column decoder 5 performs decoding based on a column address outputted from the address buffer 3. The verify sense amplifier circuit 6 is a sense amplifier for a read/write verify operation. The high-speed read sense amplifier circuit 7 is a sense amplifier for reading used during data reading.

The write circuit 8 latches to-be-written data inputted via the input/output circuit 2, and performs control of data writing. The power supply circuit 10 includes a voltage generation circuit for generating various voltages used during data writing, data erasing, a verify operation, and the like, a current trimming circuit 11 for generating and supplying an arbitrary voltage value to the write circuit, and the like. In the memory cell array 9, memory cells as minimum storage units are arranged in an array.

Next, using FIG. 2, a structure of the memory cell array in FIG. 1 will be described. In the memory cell array in the semiconductor device of the present embodiment, memory gates MG1 and selection gates SG1 are disposed in juxtaposition. Also, wiring lines ML1 and ML2 electrically coupled to source/drain regions, which will be described later, via contact lines CL1 are arranged in a matrix.

Next, using FIG. 3, a cross-sectional structure along the line A-A' in FIG. 2 will be described. Over a silicon substrate 100 formed with a p-type/n-type well 101, the memory gates MG1 and the selection gates SG1, each described above, are formed in juxtaposition via a silicon oxide film 116 as an insulating film. Each of the memory gates MG1 has a stacked film structure including a silicon oxide film 105 as an insulating film, a doped polysilicon film 106 as a conductive film, a silicon oxide film 107 as an insulating film, a silicon nitride film 108 as an insulating film serving as a charge storage film, a silicon oxide film 109 as an insulating film, polysilicon films 110 and 113 each serving as a gate electrode film, and a silicon nitride film 114 as an insulating film, which are mentioned in order of increasing distance from the silicon substrate 100 as a semiconductor substrate.

With reference to FIG. 2, the stacked films mentioned above, i.e., the stacked films including the silicon oxide film 105 as the insulating film, the doped polysilicon film 106 as the conductive film, the silicon oxide film 107 as the insulating film, the silicon nitride film 108 as the insulating film serving as the charge storage film, the silicon oxide film 109 as the insulating film, the polysilicon films 110 and 113 each serving as the gate electrode film, and the silicon nitride film 114 as the insulating film have the pattern shape of each of the memory gates MG1, and overlap one another.

That is, in a MONOS nonvolatile memory cell structure, a sandwiched structure such that the conductive film is sandwiched between the silicon oxide films is observed between the silicon nitride film serving as the charge storage film and the silicon substrate. On the other hand, each of the selection gates SG1 has a stacked film structure including a silicon oxide film 117 as an insulating film and a polysilicon film 118 serving as a gate electrode film, which are mentioned in order of increasing distance from the silicon substrate 100. The polysilicon film 118 is processed into a sidewall shape. Over the silicon substrate 100, the source/drain regions 119 are formed such that the memory gate MG1 and the selection gate SG1 are interposed therebetween.

Over the memory gates MG1 and the selection gates SG1, wiring 121 is formed via an interlayer insulating film (not shown). The wiring 121 is electrically coupled to the source/drain regions 119 via the contact line 120.

Next, examples of the operations of each of the memory cells of the semiconductor device in the first embodiment will be described.

During a data write operation, a voltage of, e.g., 10.3 V is applied to the memory gate MG1, a voltage of, e.g., 1.0 V is applied to the selection gate SG1, a voltage of, e.g., 4.4 V is applied to the drain region 119 closer to the memory gate MG1, and a voltage lower than the voltage applied to the drain region 119, e.g., a voltage of 0.4 V is applied to the source region 119 closer to the selection gate SG1. In this manner, charges (electrons) are injected in a concentrated manner into the end portion of the memory gate MG1 closer to the selection gate SG1.

During a data erase operation, a voltage of, e.g., −7.2 V is applied to the memory gate MG1, a voltage of, e.g., 0 V is applied to the selection gate SG1, and a voltage of, e.g., 7.1 V is applied to the drain region 119 closer to the memory gate MG1, while the source region 119 closer to the selection gate SG1 is brought into an electrically Open state. In this manner, charges (holes) are injected in a concentrated manner into the end portion of the memory gate MG1 closer to the drain region.

Figure 7:
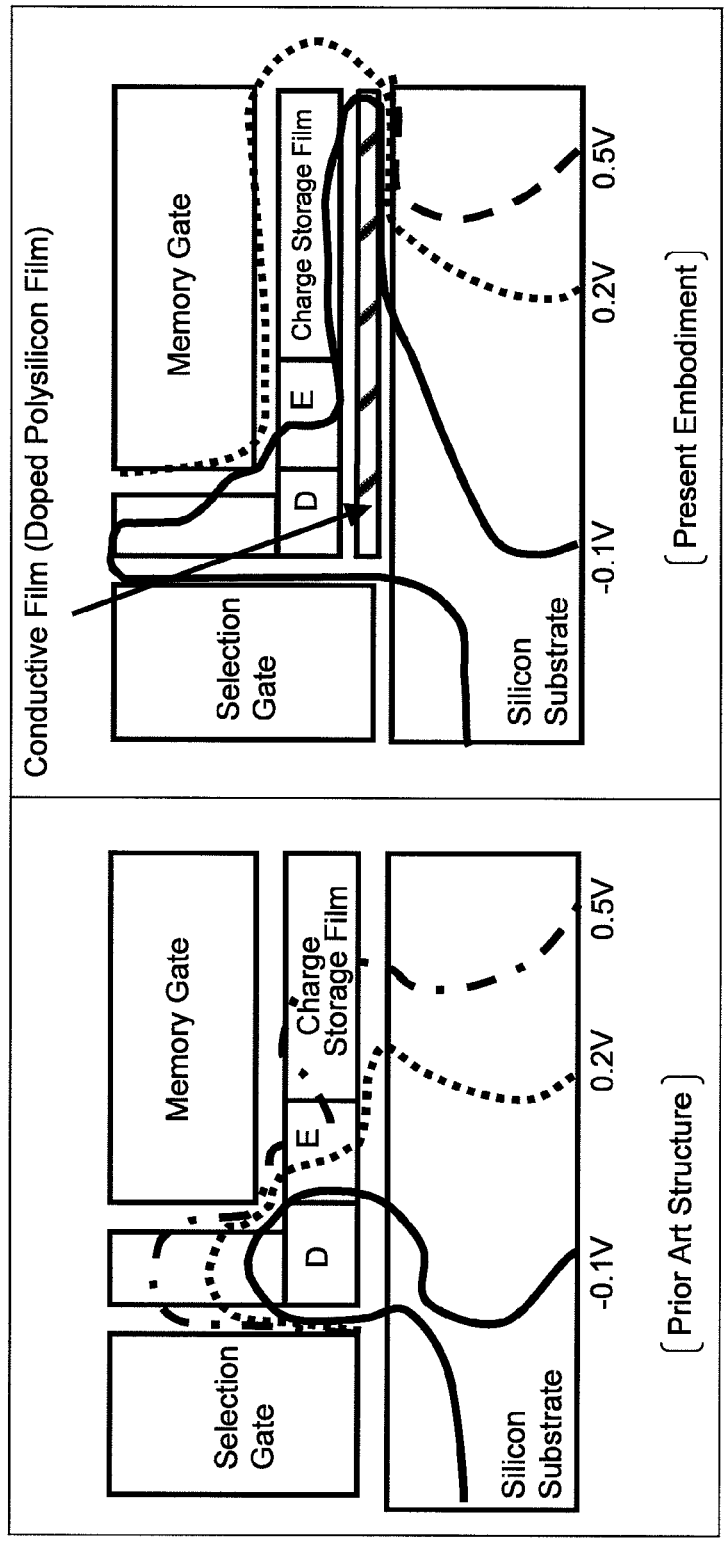
FIG. 7 is a view showing the result of simulating a distribution of an electric field potential.

Here, a description will be given of a reason that the memory cell structure of the semiconductor device in the present embodiment is considered to be more excellent than a prior-art MONOS nonvolatile memory cell in terms of a data retention property (charge retention property). FIG. 7 shows the result of simulating a distribution of an electric field potential due to charges stored in the charge storage film using equipotential lines in the prior-art MONOS nonvolatile memory cell structure and the memory cell structure of the present embodiment. Calculation is performed by assuming that conditions for the simulation are as follows. That is, a structure of the charge storage film (silicon nitride film) and the gate insulating film in a MONOS nonvolatile memory cell structure is such that, in the prior art structure, a 4 nm silicon oxide film, a 10 nm silicon nitride film, and a 4 nm silicon oxide film are stacked in order of increasing distance from the silicon substrate while, in the structure of the present embodiment, a 1.5 nm silicon oxide film, a 3 nm polysilicon film, a 1.5 nm silicon oxide film, a 10 nm silicon nitride film, and a 4 nm silicon oxide film are stacked in order of increasing distance from the silicon substrate.

Amounts of charges stored in the silicon nitride films are calculated by assuming a state where electrons are present at a density of $1.5 \times 10^{19}$ cm$^{-3}$ in each of the regions D of the charge storage films, and holes are present at a density of $0.5 \times 10^{19}$ cm$^{-3}$ in each of the regions E thereof, as shown in FIG. 7.

The region D is a region of the charge storage film having a width of 15 nm from the selection-gate-side end portion thereof, into which charges (electrons) have been injected in a concentrated manner by the source side injection described above. The region E is a region adjacent to the memory gate side of the region D and having a width of 15 nm, into which holes have been injected.

In the prior art structure, the electric field potential between the silicon substrate and the charge storage film on the selection gate side is as low as –0.1 V, and increases with approach toward the memory gate side to show 0.5 V in the vicinity of the memory-gate-side end portion of the charge storage film. That is, a steep distribution of the electric field potential extends from the selection-gate-side end portion of the charge storage film toward the memory-gate-side end portion thereof.

By contrast, in the structure of the present embodiment, it can be seen that the range in which the electric field potential is –0.1 V extends from the selection-gate-side end portion of the charge storage film to the memory-gate-side end portion thereof. That is, from the selection-gate-side end portion of the charge storage film to the memory-gate-side end portion thereof, a gentle distribution of the electric field potential with a small potential difference extends.

Figure 8:
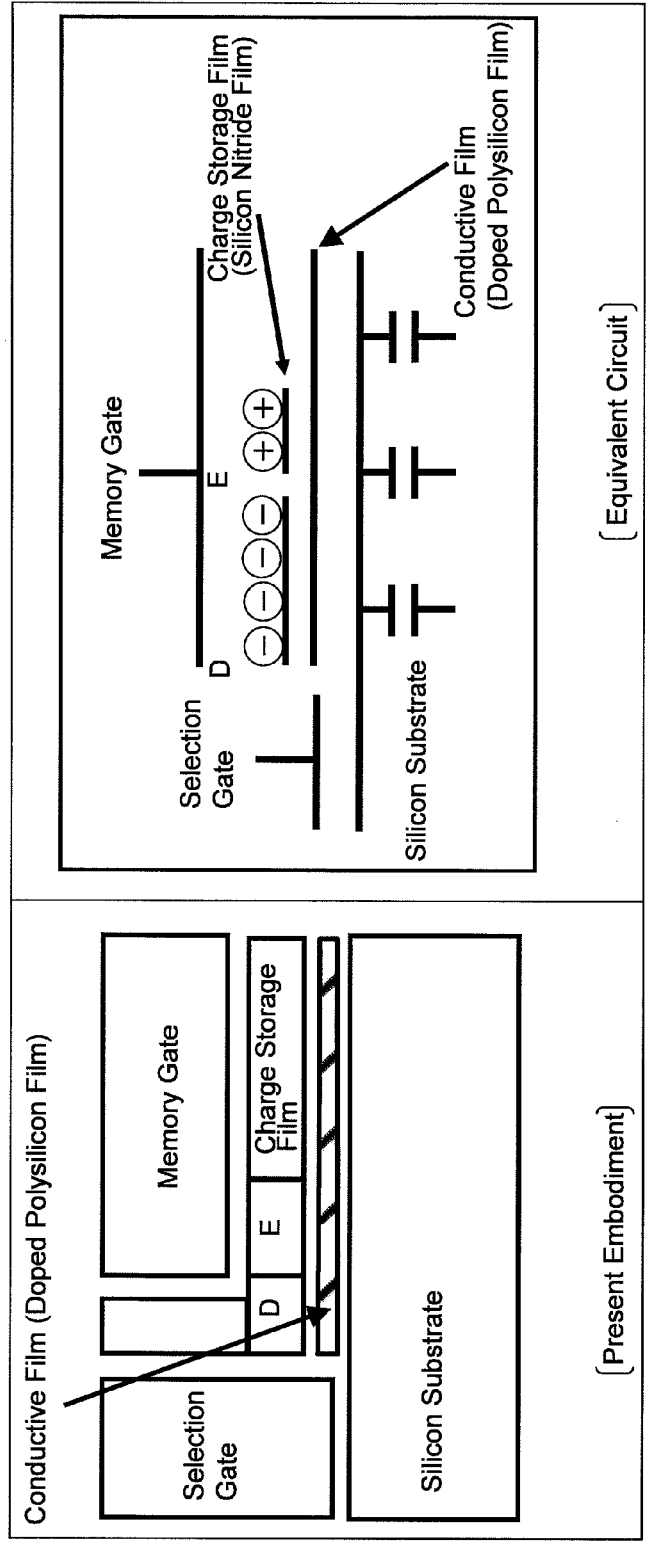
FIG. 8 is a view showing a memory cell structure and an equivalent circuit thereof.

FIG. 8 is an equivalent circuit diagram of the memory cell structure of the present embodiment. It can be considered that, by providing the doped polysilicon film as the conductive film between the silicon nitride film as the charge storage film and the silicon substrate, even when diffusion or recombination of charges occurs in the charge storage film, the intensity of the electric field (potential difference) is reduced by the charge storage film and the conductive film formed with a capacitor (capacitance), and the electric field potential shows a gentle distribution.

It can be considered that, due to a reduction in the intensity of the electric field as described above, the diffusion and recombination of electrons and holes in the silicon nitride film are more likely to be suppressed. As a result, a threshold shift during data retention (during charge retention) is suppressed.

Next, current-voltage characteristics in the prior art structure and the present embodiment shown in FIG. 7 before and after the diffusion of charges in the charge storage films are simulated for comparison. The result of the simulation is shown in FIG. 9. Here, calculation is performed on the assumption that the same diffusion and recombination have occurred in the prior art structure and in the present embodiment.

Conditions for the simulation are set such that charge densities in a state before charges are diffused in the foregoing regions D and E of the charge storage films (silicon nitride films) include $1.5 \times 10^{19}$ cm$^{-3}$ as a density at which electrons are present in each of the regions D and $0.5 \times 10^{19}$ cm$^{-3}$ as a density at which holes are present in each of the regions E. These are the same conditions as in FIG. 7.

Calculation is also performed on the assumption that charge densities in a state after the diffusion of charges is a state where electrons are present at a density of $1.0 \times 10^{19}$ cm$^{-3}$ in each of the regions D, and no charge is present in the regions E (the regions E are chargeless).

From FIG. 9, it can be seen that, when a comparison is made between memory gate voltage values with a read current of, e.g., 20 µA, the threshold has decreased by about 1.5 V due to the diffusion of charges in the prior art structure while, in the structure of the present invention, the threshold decrease is suppressed to about 0.5 V.

This shows that, in the present embodiment, even when the charge density shows a different distribution due to the diffusion of charges, the presence of the conductive film suppresses a threshold change.

Figure 10:
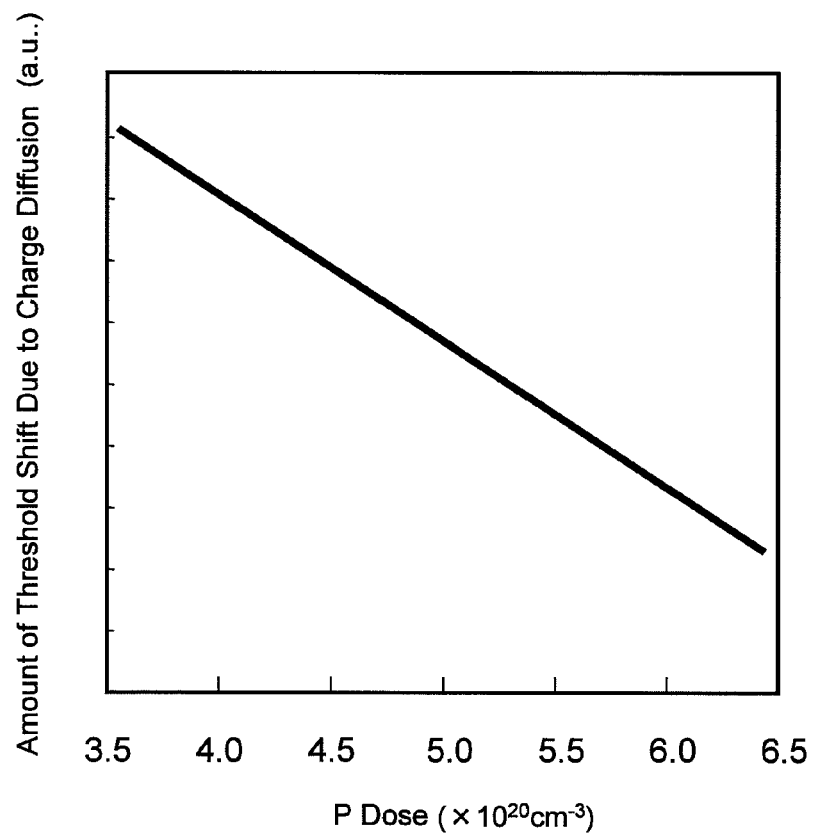
FIG. 10 is a view showing a relationship between a P dose of a polysilicon film and an amount of threshold shift.

FIG. 10 shows the relationship between a phosphorous (P) dose of the doped polysilicon film as the conductive film between the charge storage film and the silicon substrate and an amount of threshold shift resulting from charge diffusion. It can be seen that, by increasing the P dose, the amount of threshold shift can be reduced. That is, as the conductivity of the conductive film is higher, the data retention property (charge retention property) can be improved.

In the present embodiment, the doped polysilicon film as the conductive film between the charge storage film and the silicon substrate is formed to have a P dose in the range of $3.5 \times 10^{20}$ cm$^{-3}$ to $6.5 \times 10^{20}$ cm$^{-3}$.

Here, a more effective upper limit value is a critical concentration at which P is solid-solved in polysilicon, which is about $6.5 \times 10^{20}$ cm$^{-3}$ according to the study performed by the present inventors.

Thus, according to the present embodiment, in the semiconductor device having the MONOS nonvolatile memory cells, by providing the conductive film between the charge storage film and the semiconductor substrate, the threshold shift can be suppressed. This can improve the data retention property and the reliability of the semiconductor device.

Next, using FIGS. 11 to 21, a manufacturing method of the semiconductor device according to the present embodiment will be described.

Figure 11:
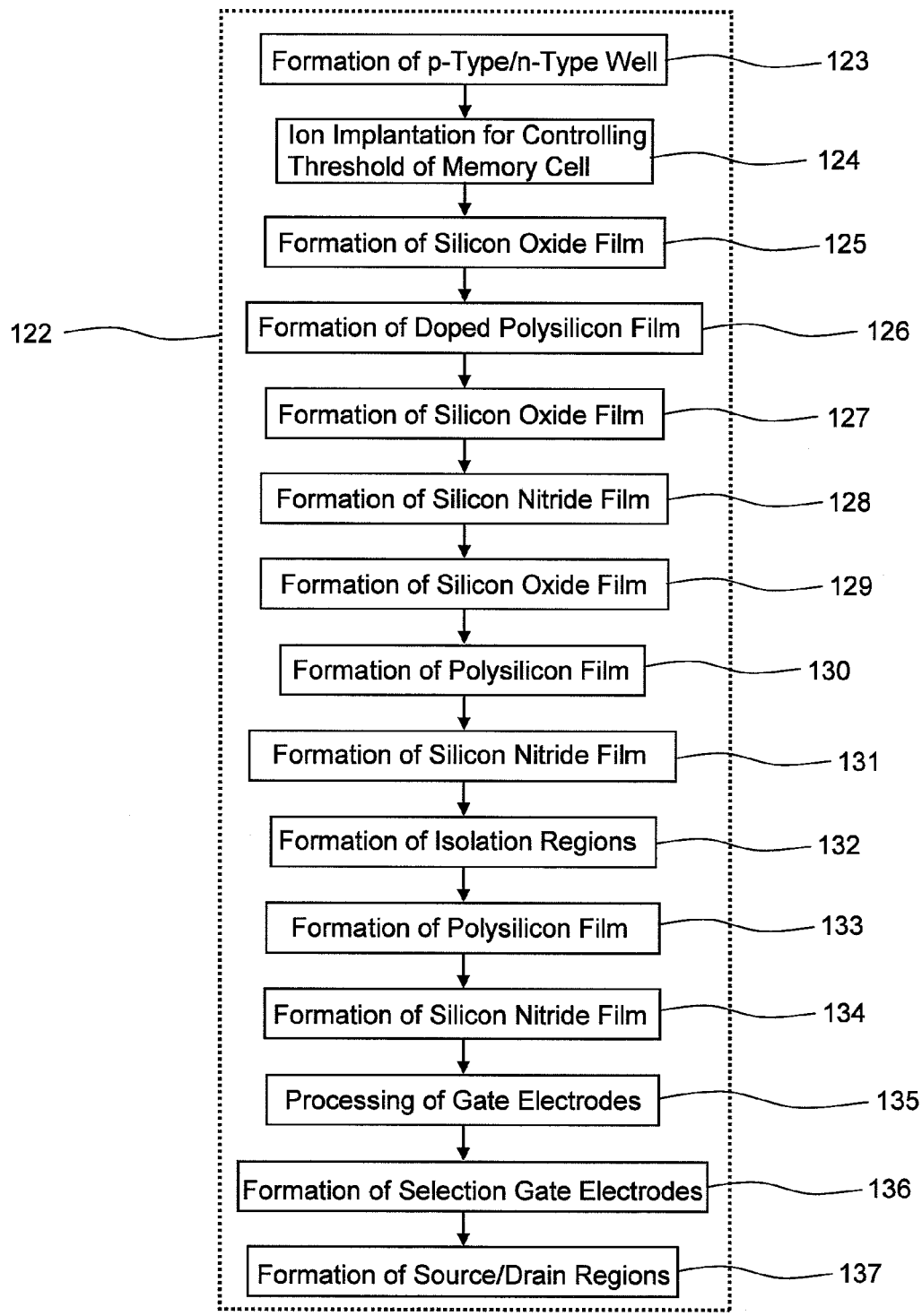
FIG. 11 is a process flow chart showing the steps of forming memory gate electrodes in the semiconductor device according to the first embodiment.

FIG. 11 is a process flow chart showing details of the steps of forming the memory gate electrodes as a main portion of the manufacturing method of the semiconductor device according to the present embodiment. FIGS. 12 to 21 show the process flow of FIG. 12 using partial cross-sectional views of the semiconductor substrate. In the drawings of FIGS. 12 to 21 showing the manufacturing method, a nonvolatile memory cell region and a peripheral circuit region are separately shown.

Figure 12:
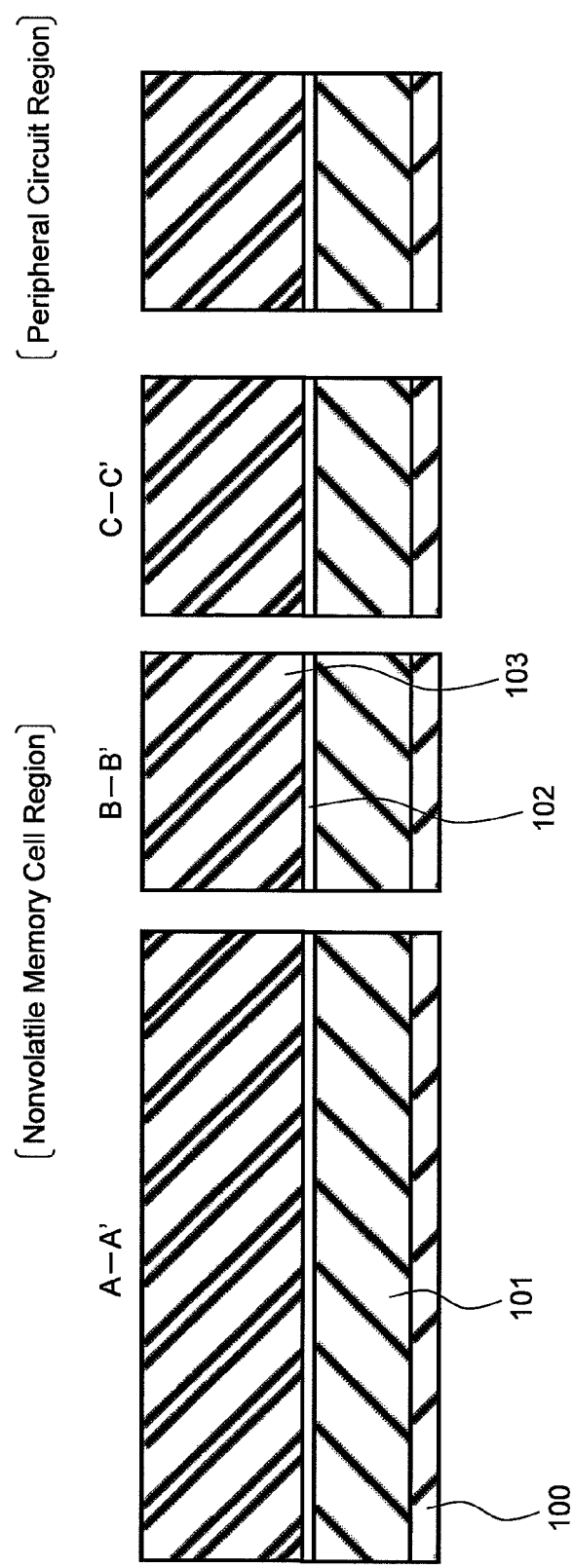
FIG. 12 is a view showing a part of a manufacturing method of the semiconductor device according to the first embodiment.

First, as shown in FIG. 12, the p-type/n-type well 101 is formed over the silicon substrate 100.

Subsequently, by a thermal oxidation method, a silicon oxide film 102 serving as the gate oxide film of a MOS transistor in the peripheral circuit region is formed, and a polysilicon film 103 serving as the gate electrode thereof is formed over the silicon oxide film 102 by a CVD (Chemical Vapor Deposition) method.

Figure 13:
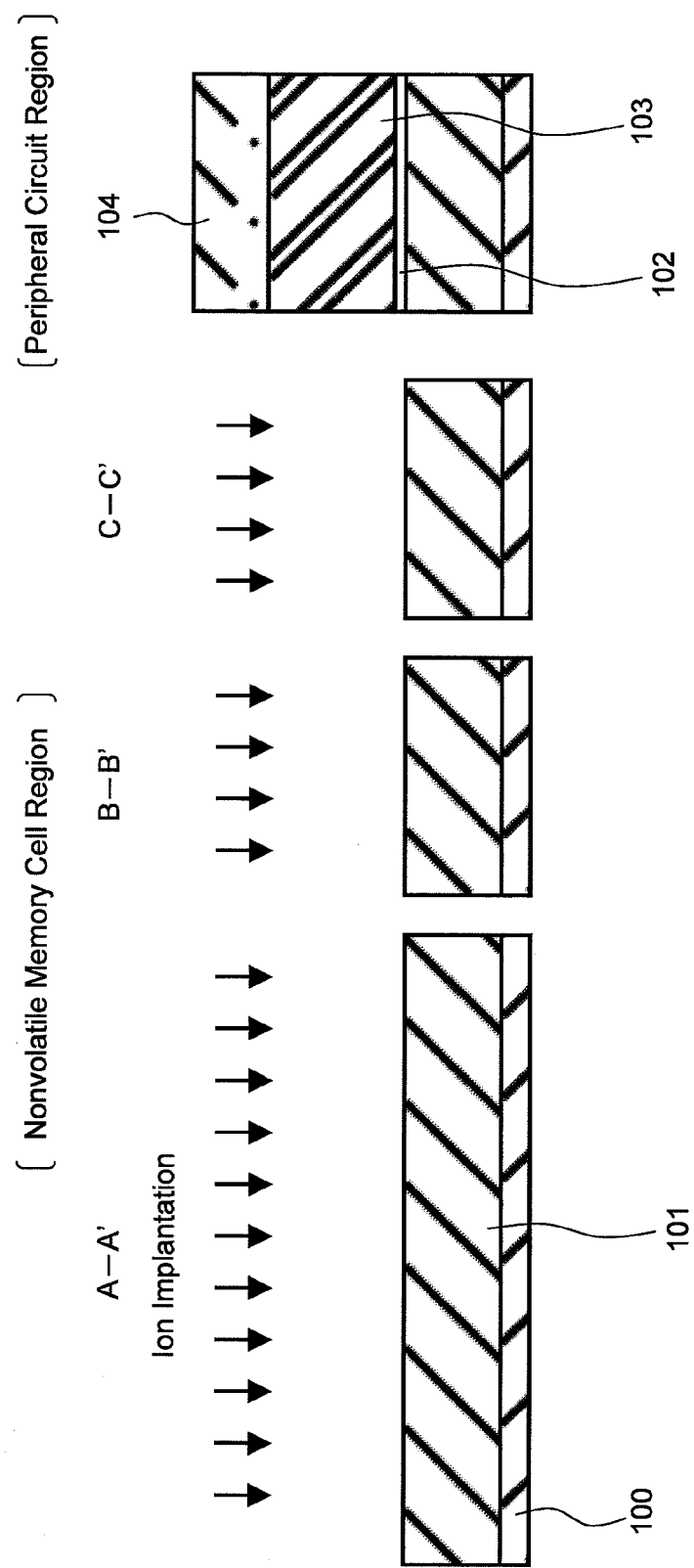
FIG. 13 is a view showing a part of the manufacturing method of the semiconductor device according to the first embodiment, which is subsequent to FIG. 12.

Next, as shown in FIG. 13, the polysilicon film 103 and the silicon oxide film 102 in the nonvolatile memory cell region are removed therefrom by lithography and etching. Thereafter, a photoresist film 104 is coated, and the photoresist film 104 in the nonvolatile memory cell region is removed therefrom by lithography. Thereafter, ion implantation for adjusting the threshold of the memory cell is performed.

Figure 14:
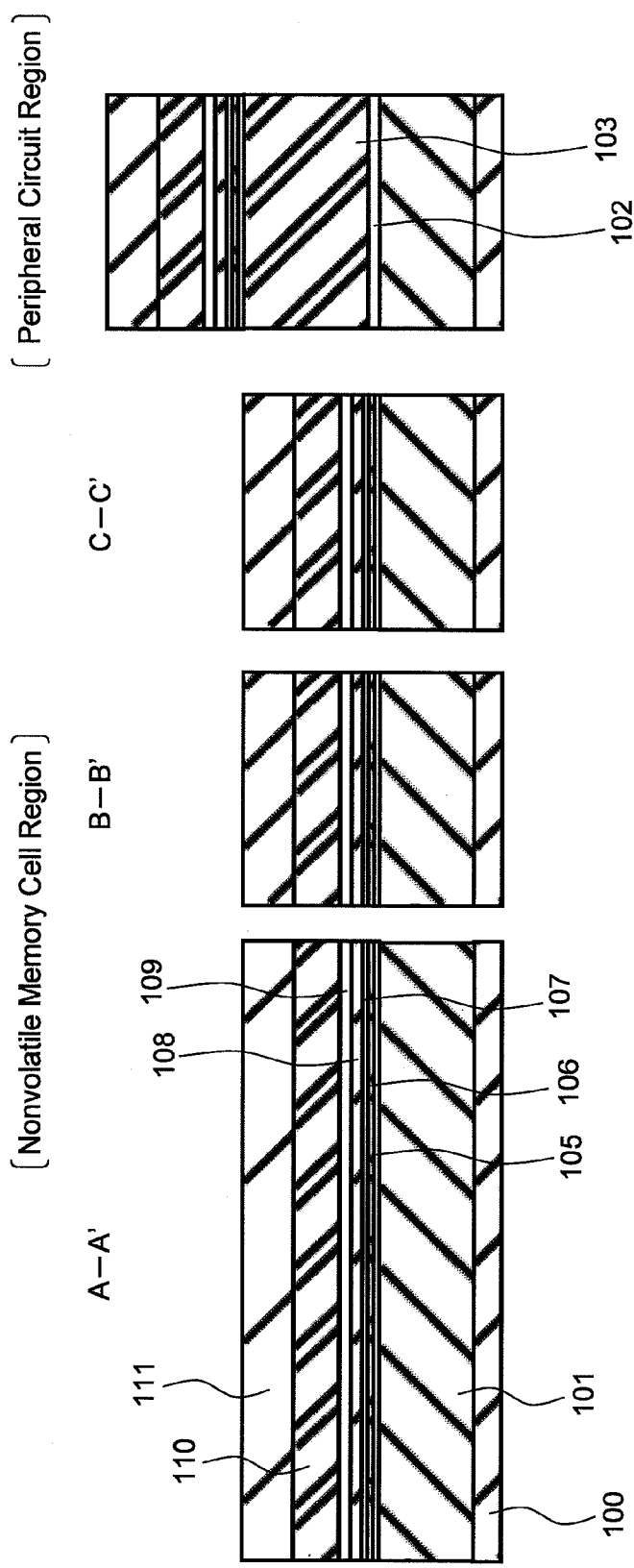
FIG. 14 is a view showing a part of the manufacturing method of the semiconductor device according to the first embodiment, which is subsequent to FIG. 13.

Next, as shown in FIG. 14, the silicon oxide film 105 having a thickness of, e.g., 1.5 nm is formed by a thermal oxidation method. Then, the doped polysilicon film 106 doped with a p-type impurity or an n-type impurity is formed to have a thickness of, e.g., 3 nm by a CVD method. Here, the doped polysilicon may also be formed to have a thickness in the range of 1 nm to 10 nm. To provide the electric field potential between the charge storage film and the silicon substrate with a gentle distribution, the doped polysilicon film is preferably a continuous film having a thickness of not less than 1 nm that can be formed by a CVD method. If the doped polysilicon film is formed to have a thickness larger than necessary, even when a voltage is applied to the memory gate electrode, the electric field may not reach a channel formation region to affect the operations of the memory cell. Accordingly, the doped polysilicon film is preferably formed to have a thickness of not more than 10 nm. To stably ensure both the data retention property and the reliability of the operations of the memory cell, the doped polysilicon film is more preferably formed to have a thickness in the range of 1.5 nm to 4 nm.

In the manufacturing method of the present embodiment, the doped polysilicon film is formed by a CVD method. However, the doped polysilicon film may also be formed by forming a non-doped polysilicon film not doped with an impurity by a CVD method, and then implanting a p-type impurity or an n-type impurity into the non-doped polysilicon film by ion implantation at a dose which achieves a required impurity concentration.

Subsequently, over the doped polysilicon film 106 described above, the silicon oxide film 107 having a thickness of, e.g., 1.5 nm is deposited by a CVD method. Further, the silicon nitride film 108 serving as the charge storage layer is formed to have a thickness of, e.g., 10 nm by a CVD method. Thereafter, a part of the silicon nitride film 108 described above is thermally oxidized to form the silicon oxide film 109 having a thickness of, e.g., 4 nm over the silicon nitride film 108.

Next, over the silicon oxide film 109 described above, the polysilicon film 110 and a silicon nitride film 111, which is to serve as a hard mask during the formation of isolations later, are formed in succession.

Figure 15:
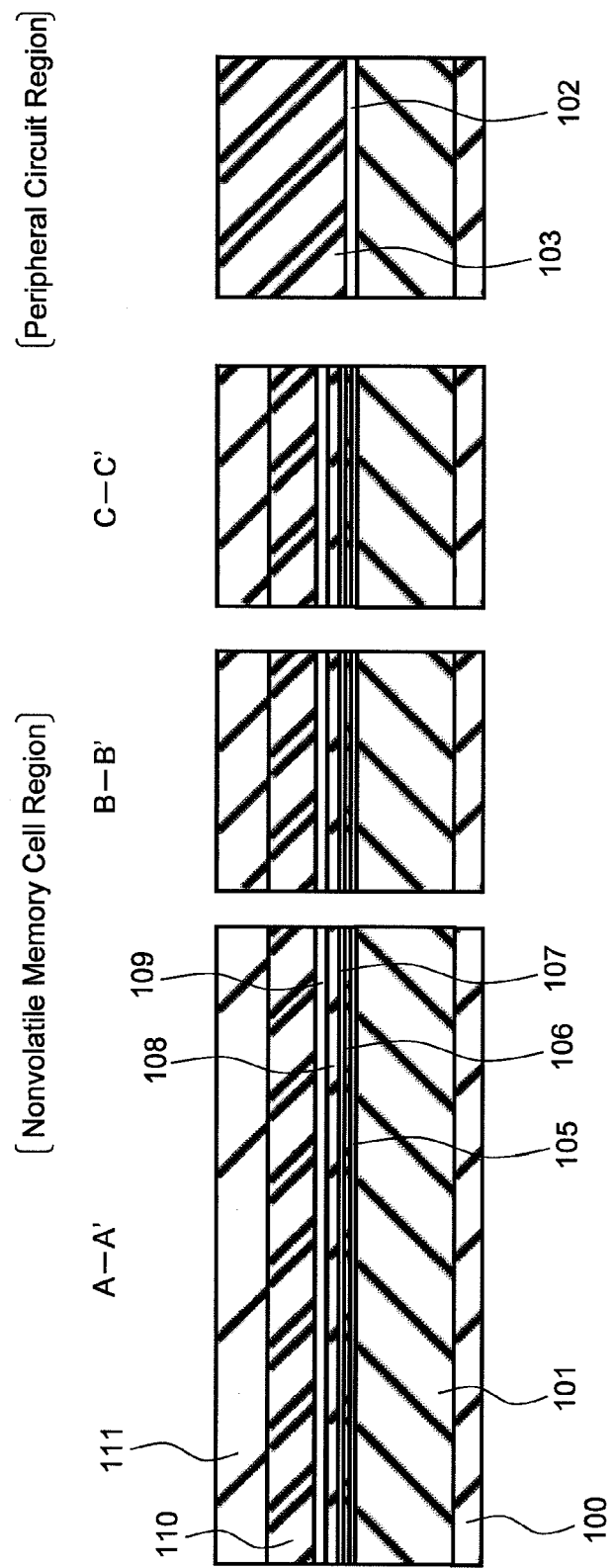
FIG. 15 is a view showing a part of the manufacturing method of the semiconductor device according to the first embodiment, which is subsequent to FIG. 14.

Next, as shown in FIG. 15, the silicon oxide film 105, the doped polysilicon film 106, the silicon oxide film 107, the silicon nitride film 108, the silicon oxide film 109, the polysilicon film 110, and the silicon nitride film 111 are removed by lithography and dry etching.

Figure 16:
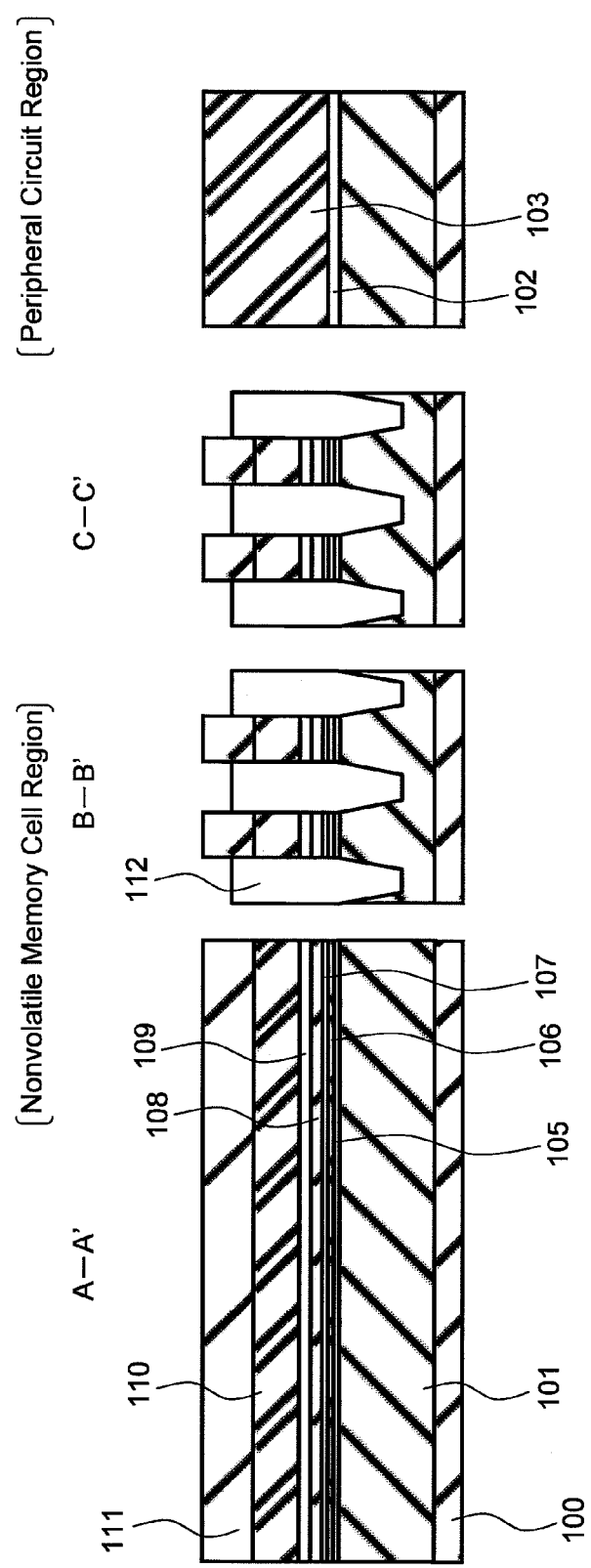
FIG. 16 is a view showing a part of the manufacturing method of the semiconductor device according to the first embodiment, which is subsequent to FIG. 15.

Next, as shown in FIG. 16, areas in the nonvolatile memory cell region serving as isolations 112 are etched to the silicon substrate 100. Then, a silicon oxide film is deposited over the silicon substrate 100, and the extra silicon oxide film over the silicon substrate 100 is removed therefrom by a CMP method so that the isolations 112 are formed.

Figure 17:
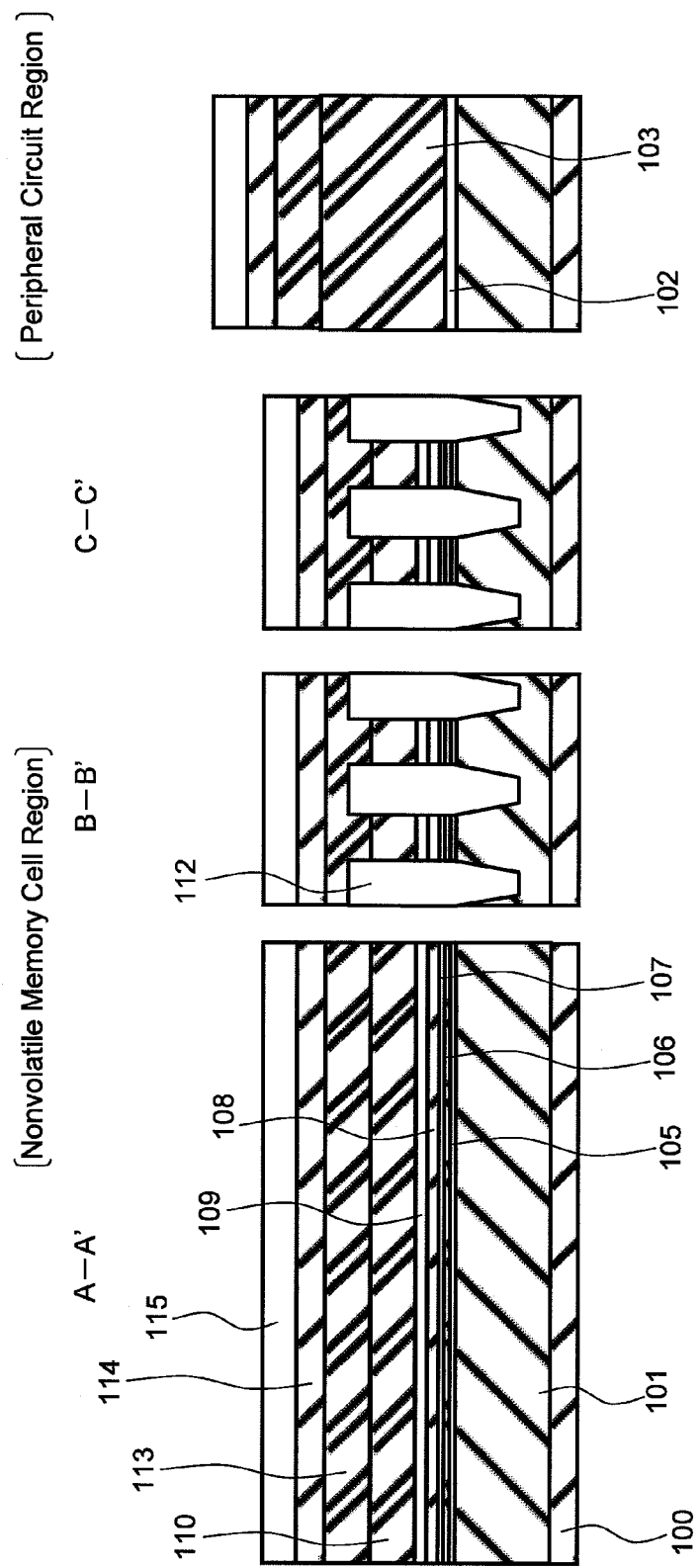
FIG. 17 is a view showing a part of the manufacturing method of the semiconductor device according to the first embodiment, which is subsequent to FIG. 16.

Next, as shown in FIG. 17, the silicon nitride film 111 is removed by wet etching. Then, the polysilicon film 113 for coupling the memory gate electrodes divided by the isolations 112 is formed, and the silicon nitride film 114 and a silicon oxide film 115 are further formed in succession.

Figure 18:
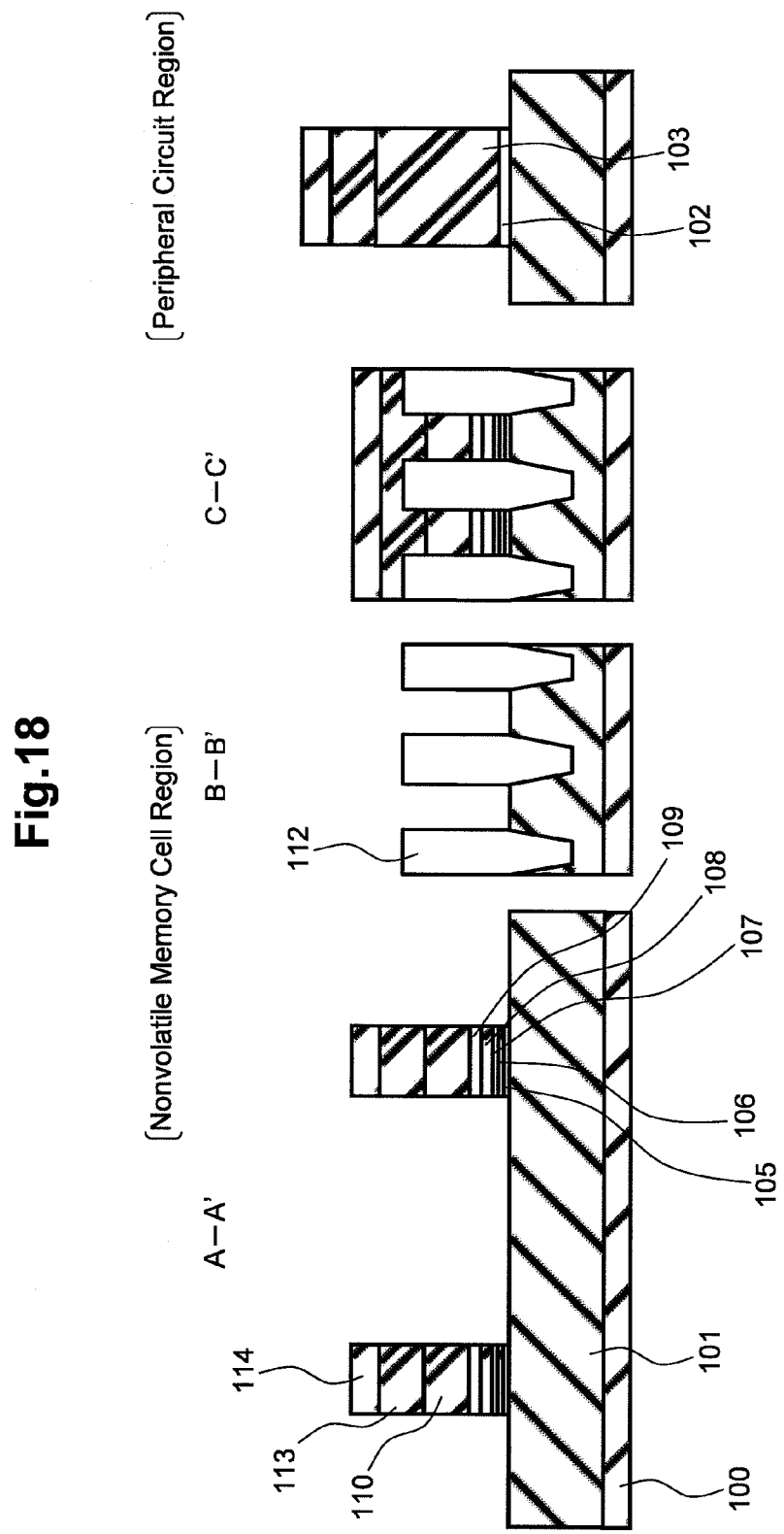
FIG. 18 is a view showing a part of the manufacturing method of the semiconductor device according to the first embodiment, which is subsequent to FIG. 17.

Next, as shown in FIG. 18, the memory gate electrodes in the nonvolatile memory region and the MOS transistor in the peripheral circuit region are formed by lithography and dry etching. At this time, the silicon oxide film 115 serves as a hard mask during dry etching.

Figure 19:
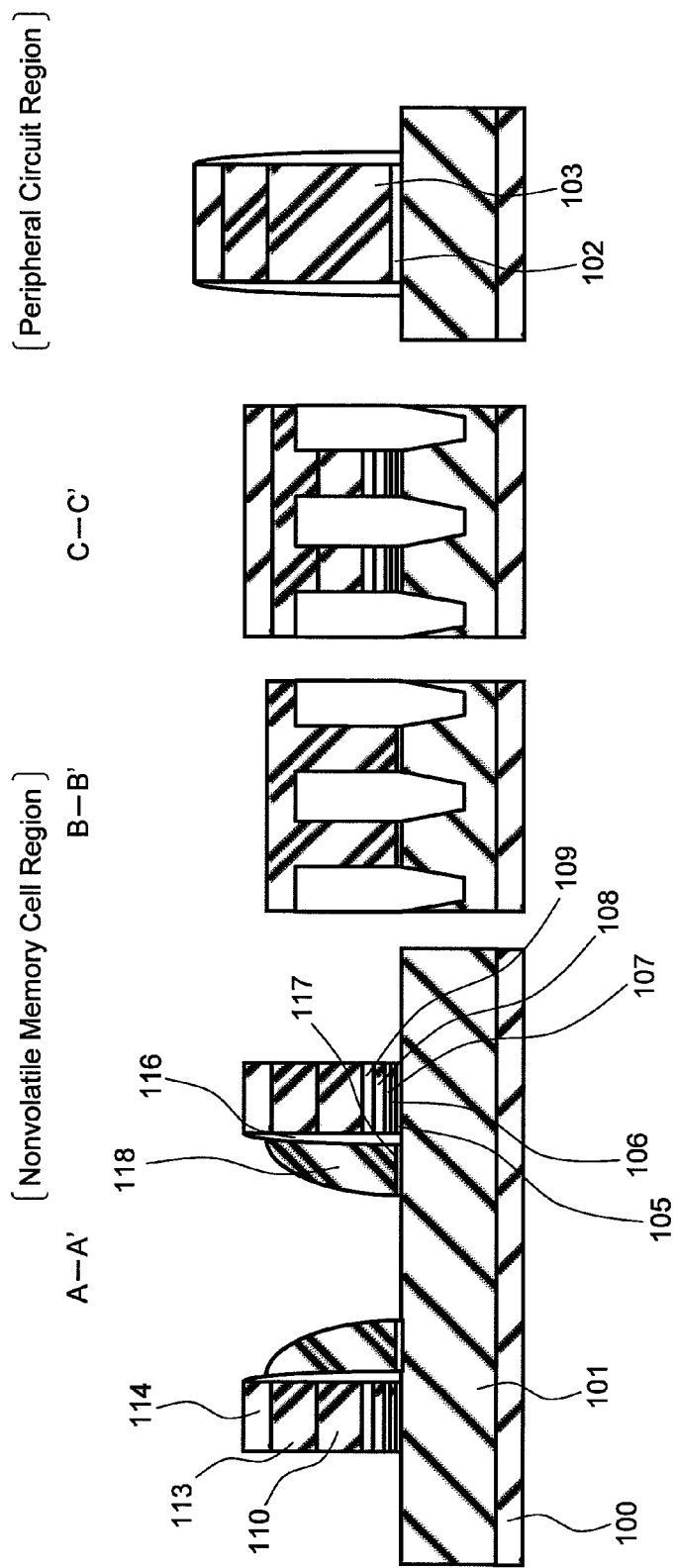
FIG. 19 is a view showing a part of the manufacturing method of the semiconductor device according to the first embodiment, which is subsequent to FIG. 18.

Next, as shown in FIG. 19, sidewalls for insulating the memory gate electrodes and the selection gate electrodes are each formed of the silicon oxide film 116, and ion implantation (not shown) for adjusting the thresholds of the selection gate electrodes is performed. Then, the silicon oxide film 117 serving as the gate insulating film of each of the selection gate electrodes is formed over the surface of the silicon substrate by a thermal oxidation method. Subsequently, over the silicon oxide film 117, the polysilicon film 118 is formed. Subsequently, by anisotropic dry etching, the silicon oxide film 117 and the polysilicon film 118 are processed into sidewall shapes to form the selection gate electrodes. At this time, selection gate electrodes having sidewall shapes are formed on both sides of each of the memory gates such that the memory gate is interposed therebetween. However, by lithography and etching, the unneeded selection gate electrode having the sidewall shape on one side of the memory gate is removed so that the selection gate electrode is left only on the other side.

Figure 20:
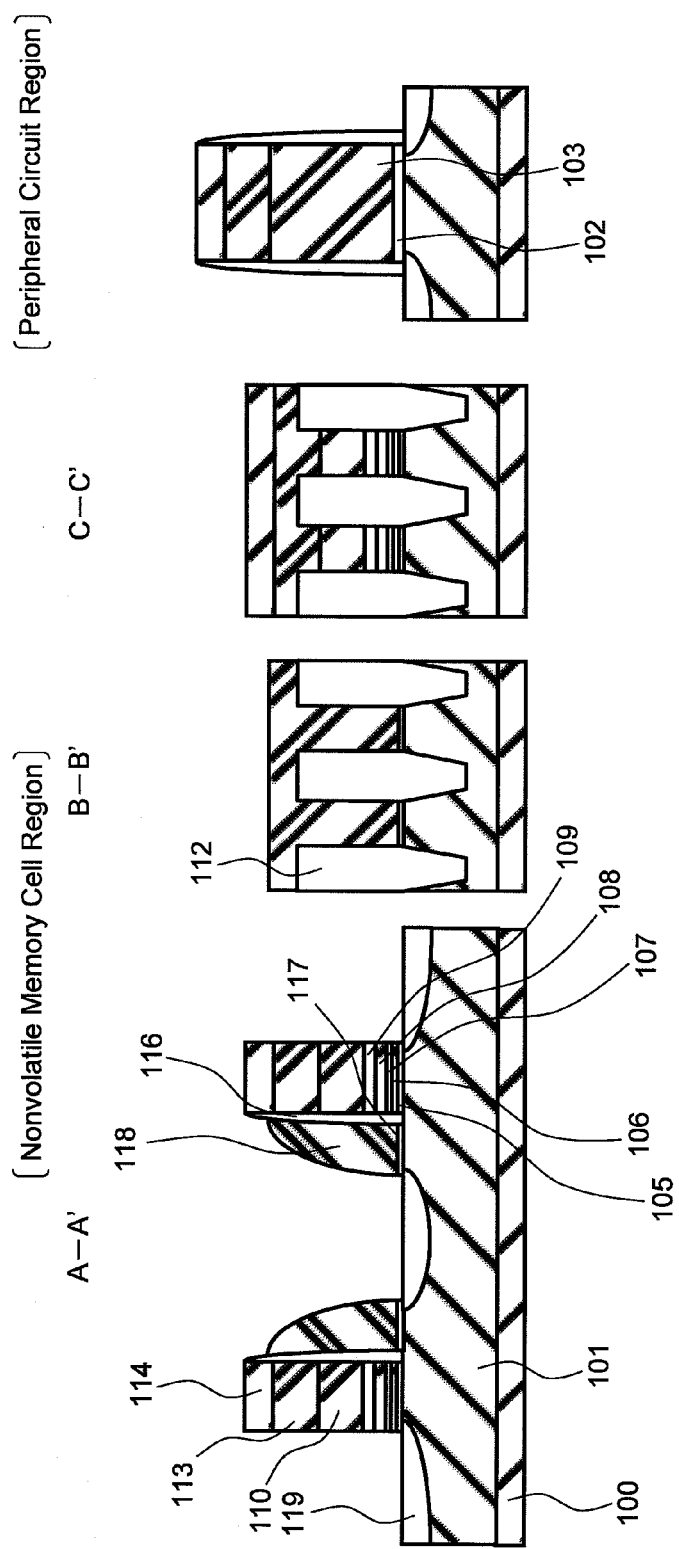
FIG. 20 is a view showing a part of the manufacturing method of the semiconductor device according to the first embodiment, which is subsequent to FIG. 19.

Next, as shown in FIG. 20, ion implantation for the diffusion layers of each of p-MOS and n-MOS transistors is performed to form the source/drain regions 119. At this time, the selection gate electrodes and the source/drain regions may also be silicidized for lower resistances.

Figure 21:
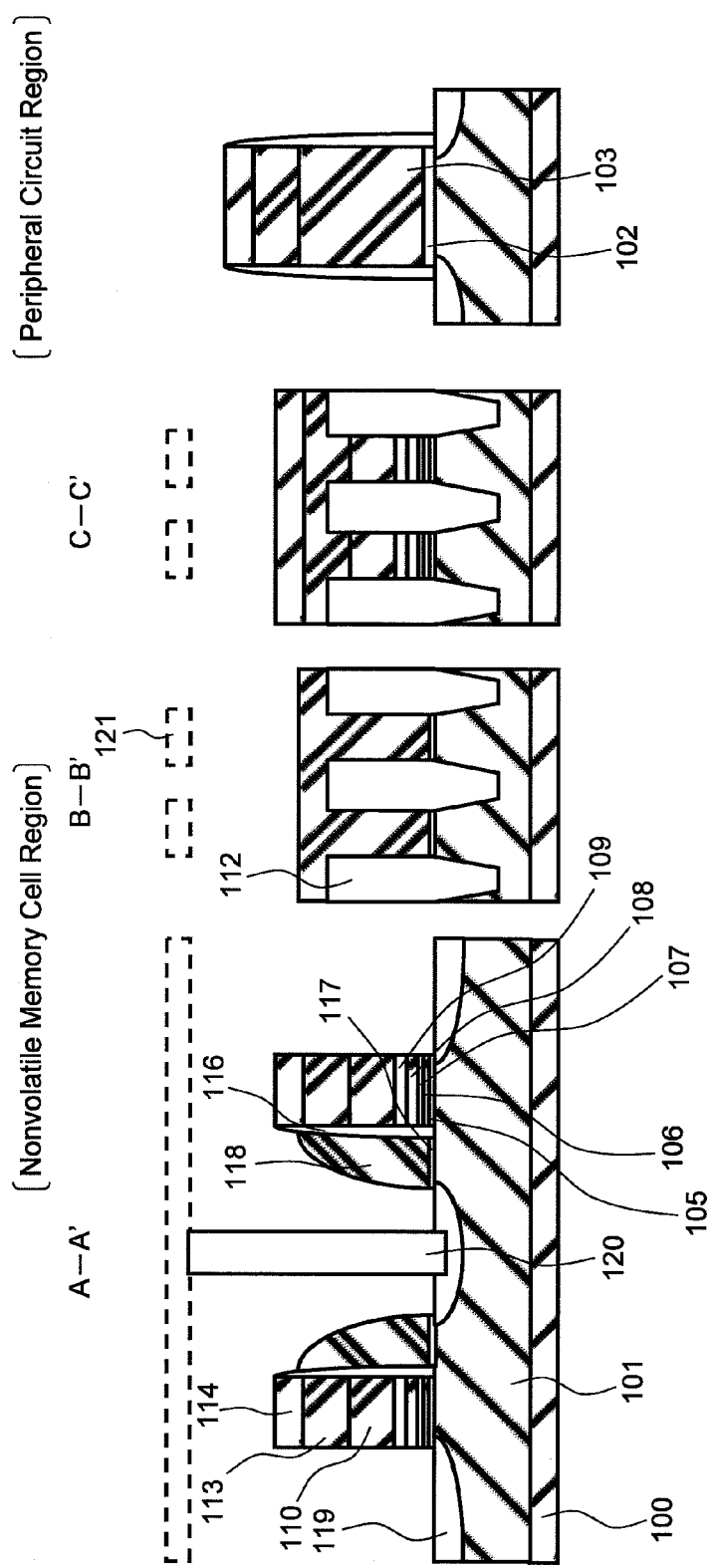
FIG. 21 is a view showing a part of the manufacturing method of the semiconductor device according to the first embodiment, which is subsequent to FIG. 20.

Thereafter, as shown in FIG. 21, an interlayer insulating film (not shown) is formed, and then a contact hole is formed in the foregoing interlayer insulating film. The contact hole described above is filled with a metal film of tungsten, aluminum, or the like to form the contact line 120. Subsequently, over the interlayer insulating film, the wiring 121 is formed so as to be electrically coupled to the contact line 120 described above, whereby the semiconductor device of the present embodiment is completed.

In the semiconductor device described in the first embodiment, the selection gate electrodes are processed into the sidewall shapes. This offers the advantage of allowing a reduction in the parasitic capacitance between the adjacent selection gate electrodes, and provides a structure appropriate for high integration of the memory cells.

In the manufacturing method described in the present embodiment, in the steps of forming the memory gate electrodes, the silicon oxide film 105 and the silicon oxide film 107 between the silicon substrate and the charge storage film are each formed to have a thickness of 1.5 nm, i.e., such that the sum of the thicknesses thereof is 3.0 nm. On the other hand, the silicon oxide film 109 formed between the charge storage film and the gate electrode is formed to have a thickness of 4.0 nm. That is, the silicon oxide films between the silicon substrate and the charge storage film are formed such that the sum of the thicknesses thereof is smaller than the thickness of the silicon oxide film between the charge storage film and the gate electrode. As a result, even when a sandwiched structure such that the conductive film is sandwiched between the oxide films is formed as in the first embodiment, transfer of charges to the charge storage film can be performed more excellently than in the case where the sum of the thicknesses of the silicon oxide films between the silicon substrate and the charge storage film is larger than the thickness of the silicon oxide film between the charge storage film and the gate electrode.

In the first embodiment, as an example of the conductive film, the doped polysilicon film doped with a p-type impurity or an n-type impurity is used in the description given above. However, it is also possible to use a metal material typically used in a semiconductor device, such as tungsten, aluminum, titanium, tantalum, nickel, or cobalt, or a silicide film thereof.

Also in the first embodiment, as an example of the charge storage film, the silicon nitride film is used in the description given above. However, the charge storage film may also be formed of a silicon oxynitride film.

In the first embodiment, the conductive film and the charge storage film are formed to two-dimensionally overlap each other in a range from the source/drain region adjacent to the silicon oxide film 105 as the insulating film to the silicon oxide film 116 insulating the memory gate electrode and the selection gate electrode. Even when the conductive film is formed in a part between the charge storage film and the silicon substrate, the intensity of the electric field (potential difference) is reduced. However, to provide the electric field potential between the charge storage film and the silicon substrate with a more gentle distribution, the conductive film is more preferably formed to two-dimensionally overlap the charge storage film, while occupying the same area as that of the charge storage film.

Second Embodiment

A semiconductor device according to a second embodiment will be described using FIGS. 22 and 23.

Figure 22:
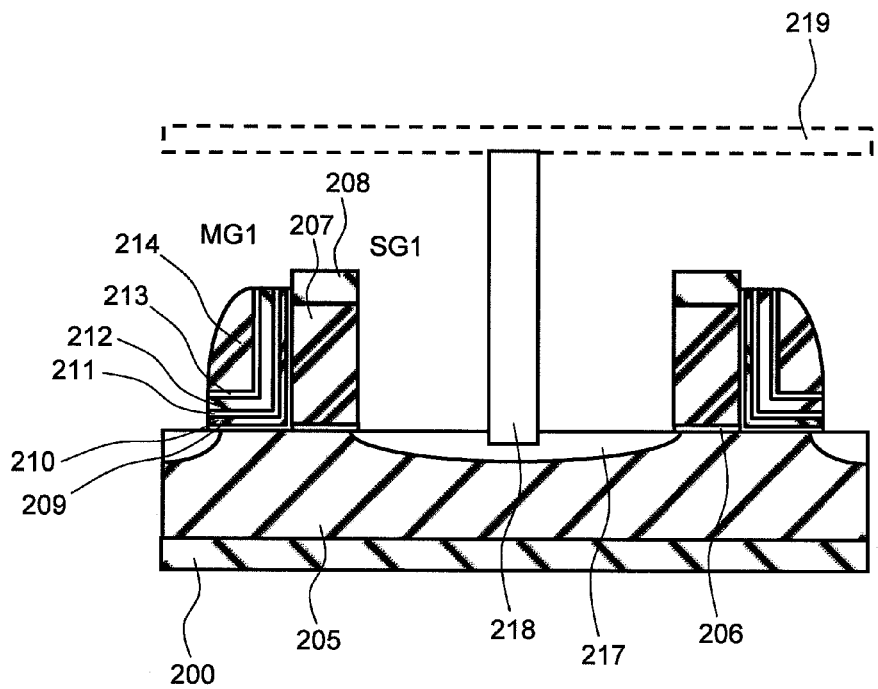
FIG. 22 is a partial cross-sectional view of a memory cell of a semiconductor device according to a second embodiment.
Figure 23:
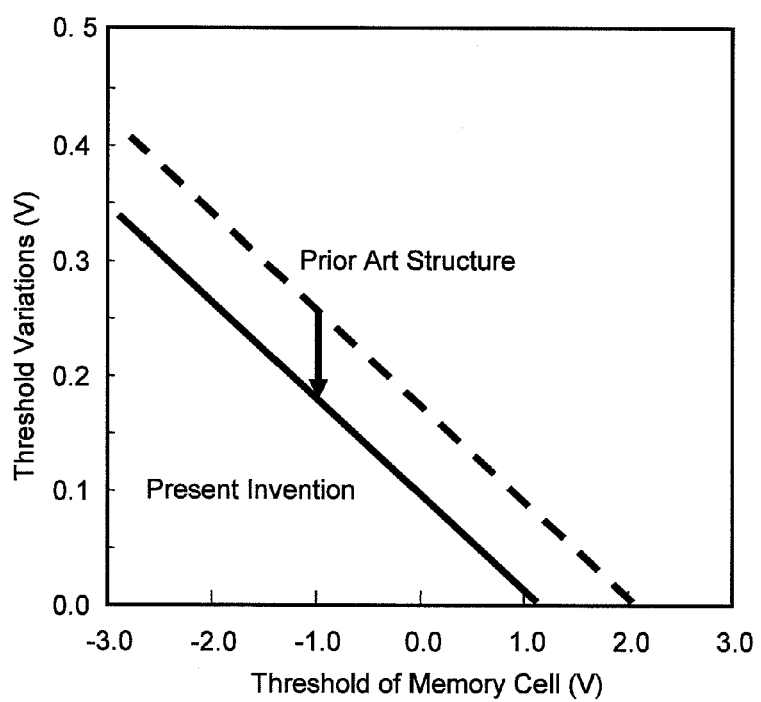
FIG. 23 is a view showing a relationship between a threshold (50% value) of the memory cell and threshold variations.

FIG. 22 is a cross-sectional view of a memory cell in a semiconductor device of the second embodiment. The structure in which the memory gate electrodes MG1 and the selection gate electrodes SG1 are formed in juxtaposition over a silicon substrate 200 formed with a p-type/n-type well 205 via silicon oxide films 209 as insulating films is the same as in the first embodiment. The semiconductor device of the second embodiment is different from the semiconductor device of the first embodiment described above in the structure of each of the memory gate electrodes. In the memory cell in the semiconductor device of the second embodiment, a stacked film structure including the silicon oxide film 209 as the insulating film, a doped polysilicon film 210 as a conductive film, a silicon oxide film 211 as an insulating film, a silicon nitride film 212 as an insulating film serving as a charge storage film, and a silicon oxide film 213 as an insulating film has an L-shaped shape. In the structure, the silicon oxide film 209 insulates a p-type/n-type well and the doped polysilicon film 210, and also further insulates the memory gate electrode MG1 and the selection gate electrode SG1. The block diagram of the semiconductor device, the structure of the memory cell array, and read, write, and erase operations to the memory cell are otherwise the same as in the first embodiment. In the memory cell structure of the second embodiment also, a sandwiched structure such that the conductive film is sandwiched between the silicon oxide films is observed between the charge storage film and the silicon substrate. Therefore, in the semiconductor device having the MONOS nonvolatile memory cell of the second embodiment also, by providing the conductive film between the charge storage film and the semiconductor substrate, a threshold shift is suppressed. This can improve the data retention property and the reliability of the semiconductor device.

Here, another effect of the second embodiment will be described. In the memory cell structure shown in the second embodiment, due to capacitive coupling present between the selection gate electrode SG1 and the doped polysilicon film 210, the effect of reducing variations in the threshold of the memory cell shown in FIG. 23 can be obtained. FIG. 23 is a view showing the initial threshold (50% value of a 4 MB array) of the memory cell in the memory cell structure of the second embodiment and variations ($\sigma$) in a distribution of the threshold in comparison with those in the prior art structure.

The broken line shows the property of the prior art structure. It can be seen that, when the threshold of the memory cell decreases, variations in the short-channel effect of each of transistors become noticeable, and therefore the values of the variations ($\sigma$) have increased. To cause the memory cell to perform a high-speed operation, 0 V is applied to each of the memory gate electrodes of the memory cell during reading, and a read current of about 20 $\mu$A is further needed. Accordingly, the memory cell is designed to have a low initial threshold of not more than 0 V, but a problem arises that the increased variations impair reliability. As a result of the study performed by the present inventors, it has been found that, in the memory cell structure of the second embodiment, there is a capacitive coupling ratio of about 0.65 between the selection gate SG1 and the doped polysilicon film 210. As a result, the threshold seems to be about 0.975 times lower than that of the memory cell of the prior art structure. Therefore, as shown by the solid line of FIG. 23, even when the threshold is the same, voltage variations in threshold can be reduced compared with those in the threshold of the memory cell of the prior art structure.

1.5 V (Voltage Applied to Control Gate during Reading)×0.65 (Capacitive Coupling Ratio)=0.975.

Next, using FIGS. 24 to 32, a manufacturing method of the semiconductor device according to the present embodiment will be described.

Figure 24:
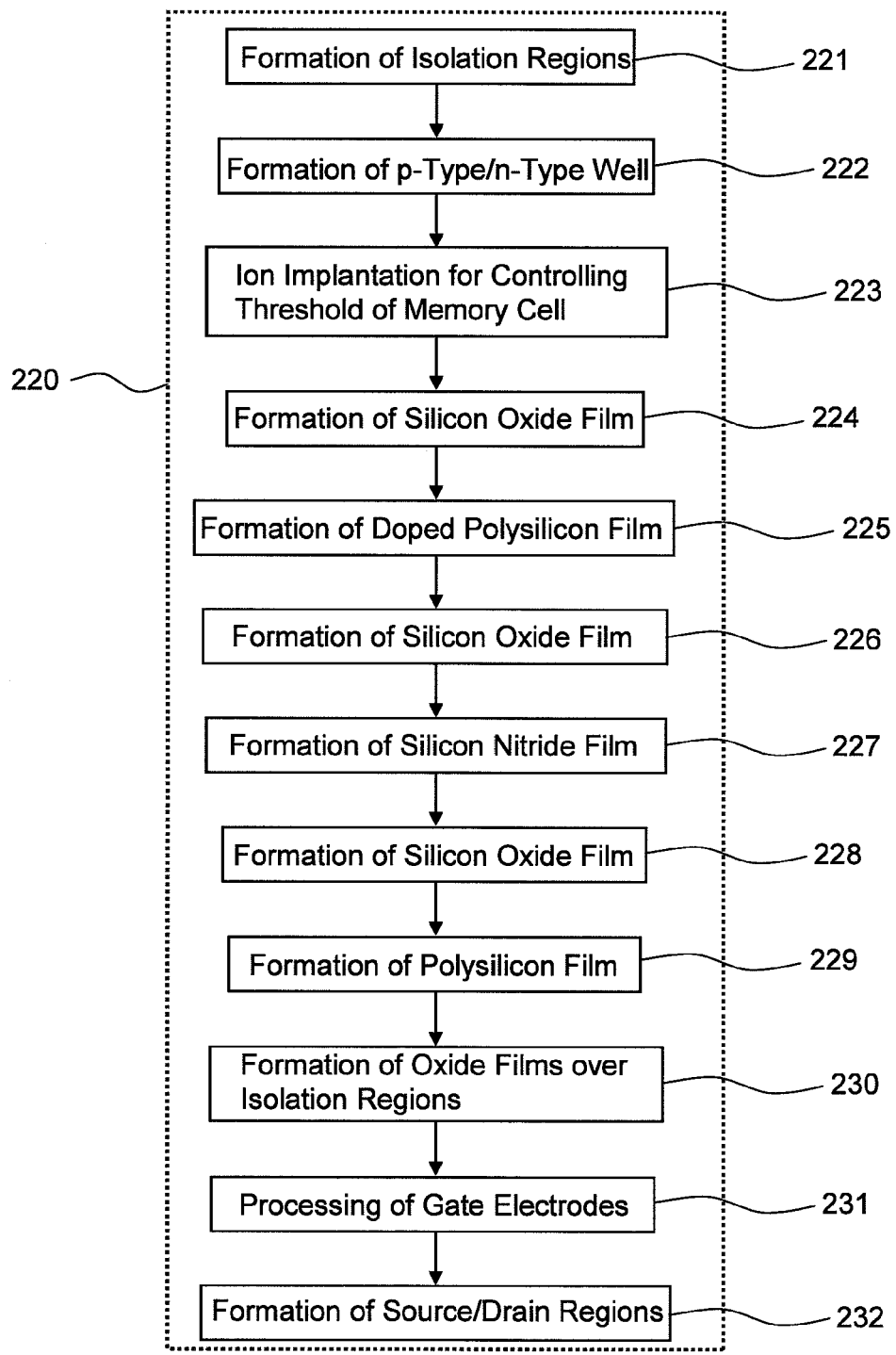
FIG. 24 is a process flow chart showing the steps of forming memory gate electrodes in the semiconductor device according to the second embodiment.

FIG. 24 is a process flow chart showing details of the steps of forming the memory gate electrodes as a main portion of the manufacturing method of the semiconductor device according to the present embodiment. FIGS. 25 to 32 show the process flow of FIG. 24 using partial cross-sectional views of the semiconductor substrate. The manufacturing method of the second embodiment described below is basically substantially the same as the manufacturing method of the first embodiment in terms of the thicknesses of the films to be formed, forming methods thereof, and other conditions. Therefore, a repeated description of overlapping portions except for the important portions thereof will be minimized.

Figure 25:
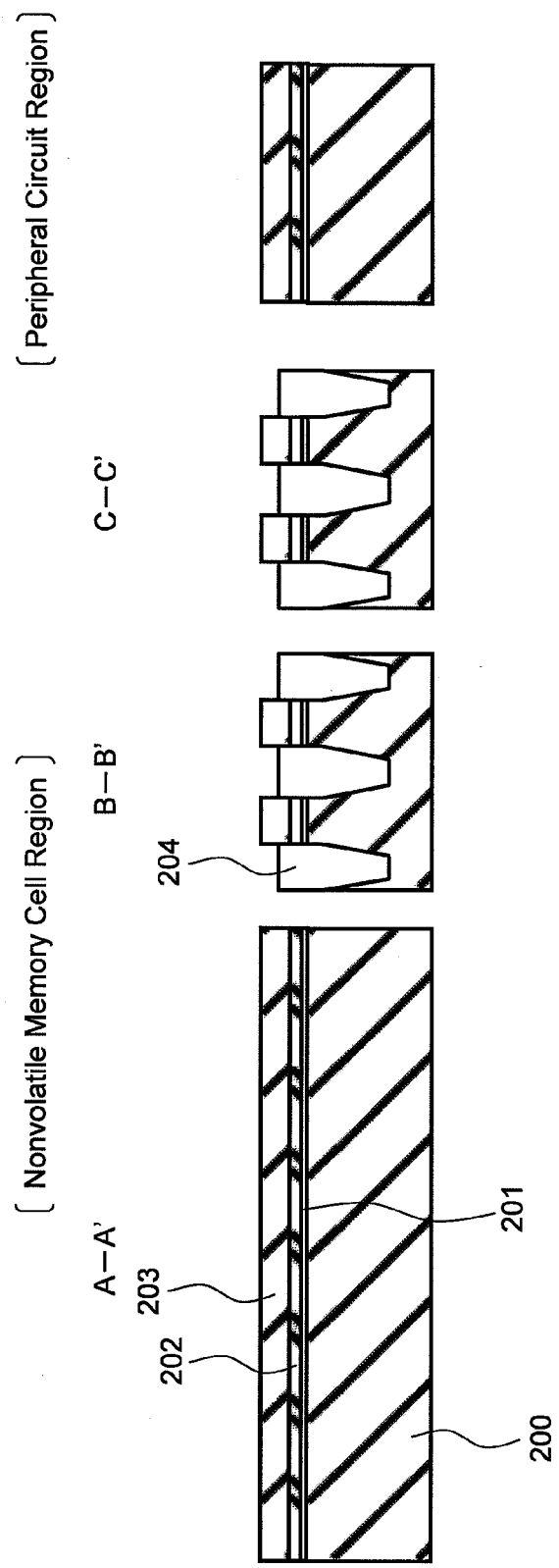
FIG. 25 is a view showing a part of a manufacturing method of the semiconductor device according to the second embodiment.

First, as shown in FIG. 25, the silicon substrate 200 is thermally oxidized to form a silicon oxide film 201. Thereafter, a polysilicon film 202 and a silicon nitride film 203 are formed in succession. By lithography and etching, regions which are to serve as isolation regions later are etched to the silicon substrate. Over the silicon substrate, a silicon oxide film is formed, and planarized by a CMP method to form isolation regions 204.

Figure 26:
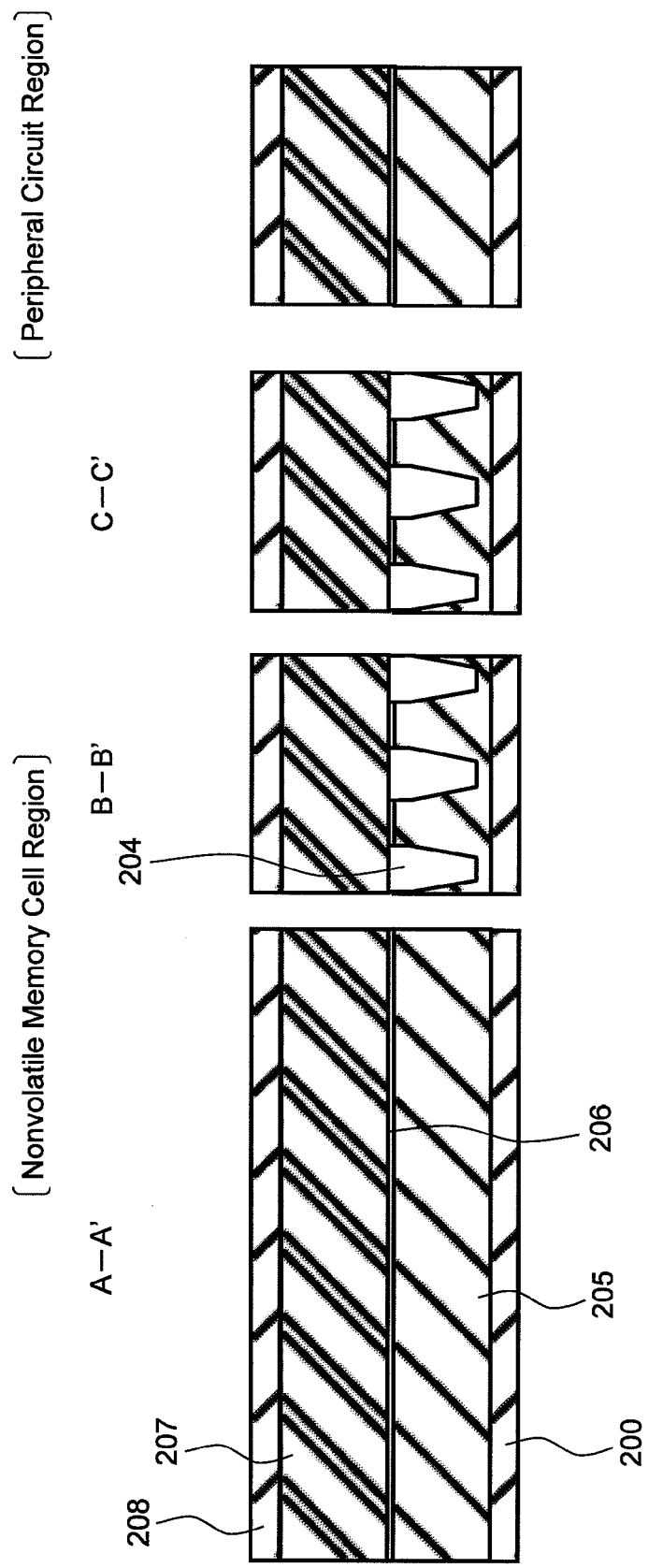
FIG. 26 is a view showing a part of the manufacturing method of the semiconductor device according to the second embodiment, which is subsequent to FIG. 25.

Next, as shown in FIG. 26, the silicon nitride film 203 and the polysilicon film 202 are removed by wet etching and dry etching, and, using the silicon oxide film 201 as a through film for ion implantation, the p-type/n-type well 205 is formed. Then, by wet etching, the silicon oxide film 201 is removed. Thereafter, a silicon oxide film 206 serving as the gate oxide films of a MOS transistor in a peripheral circuit region and the selection gate electrodes is formed by a thermal oxidation method and, over the silicon oxide film 206, a polysilicon film 207 and a silicon nitride film 208 are formed.

Figure 27:
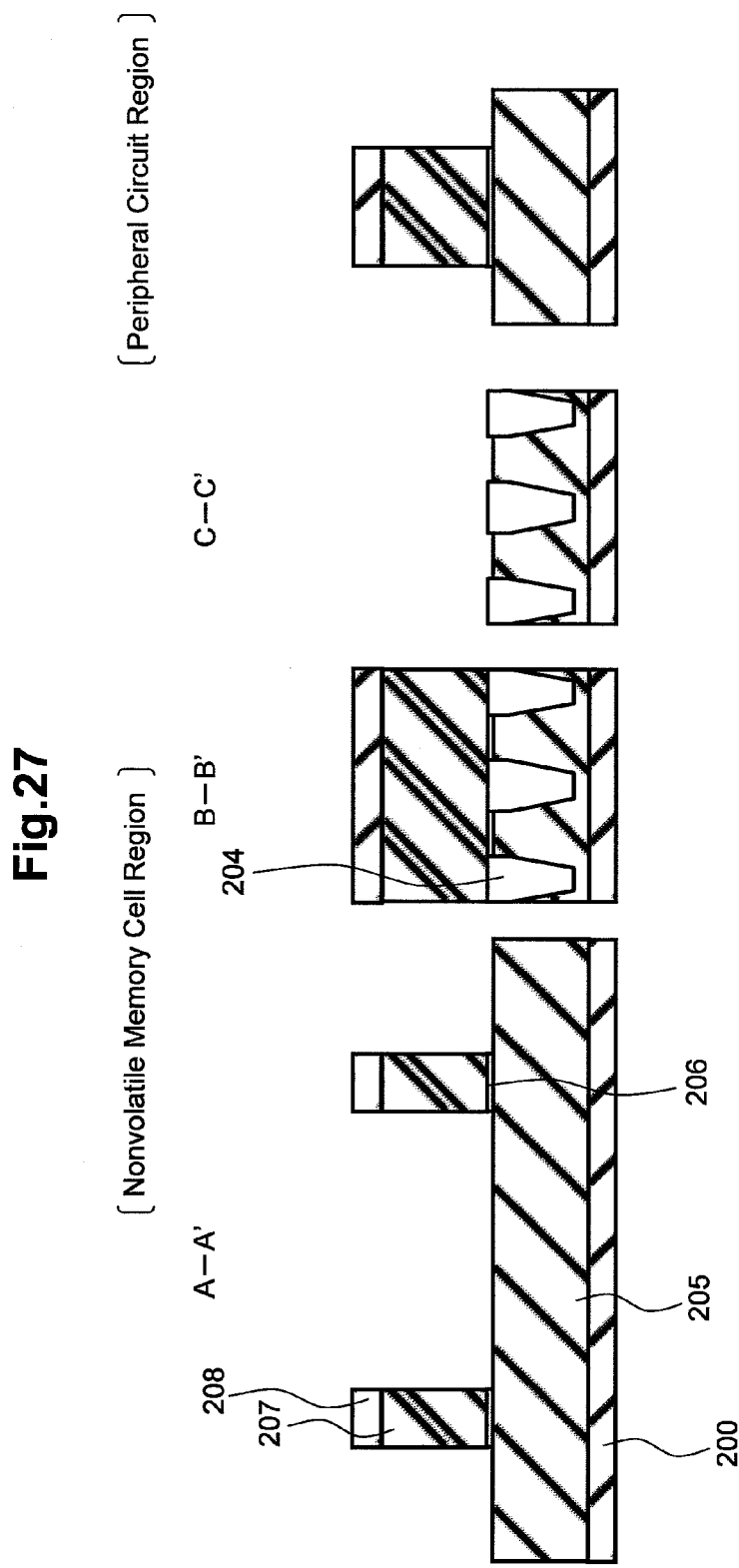
FIG. 27 is a view showing a part of the manufacturing method of the semiconductor device according to the second embodiment, which is subsequent to FIG. 26.

Next, as shown in FIG. 27, by lithography and etching, the MOS transistor in the peripheral circuit region and the selection gate electrode are formed. Subsequently, by lithography and ion implantation, ion implantation (not shown) for adjusting the threshold of the memory cell is performed.

Figure 28:
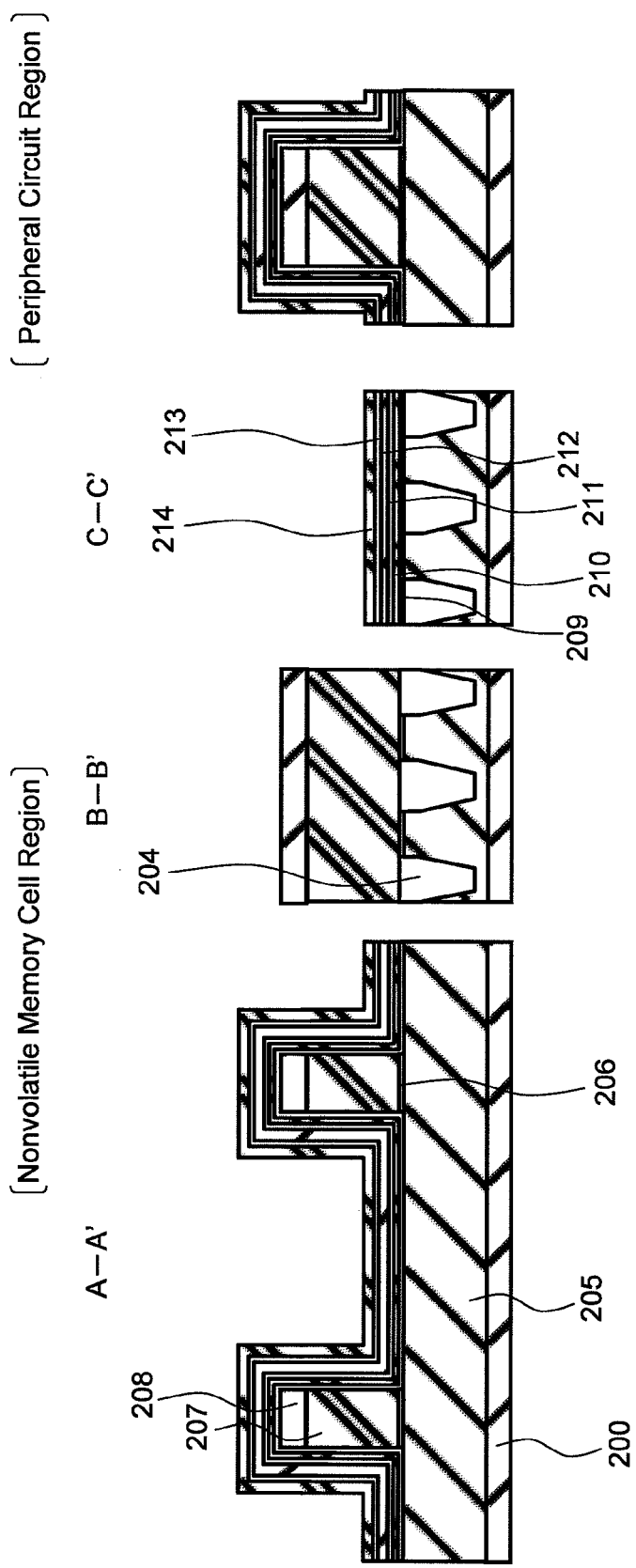
FIG. 28 is a view showing a part of the manufacturing method of the semiconductor device according to the second embodiment, which is subsequent to FIG. 27.

Next, as shown in FIG. 28, a silicon oxide film 209 having a thickness of, e.g., 1.5 nm is formed by a thermal oxidation. Then, the doped polysilicon film 210 having a thickness of, e.g., 3 nm and the silicon oxide film 211 having a thickness of, e.g., 1.5 nm are formed. Further, the silicon nitride film 212 serving as a charge storage film is formed to a thickness of, e.g., 10 nm. A part of the silicon nitride film 212 is thermally oxidized to form the silicon oxide film 213 having a thickness of, e.g., 4 nm. Further, over the silicon oxide film 213, a polysilicon film 214 is formed. Here, the doped polysilicon film may also be formed to have a thickness in the range of 1 nm to 10 nm for the same reason as stated in the first embodiment. To stably ensure both the data retention property and the reliability of the operations of the memory cell, the doped polysilicon film is more preferably formed to have a thickness in the range of 1.5 nm to 4 nm.

Figure 29:
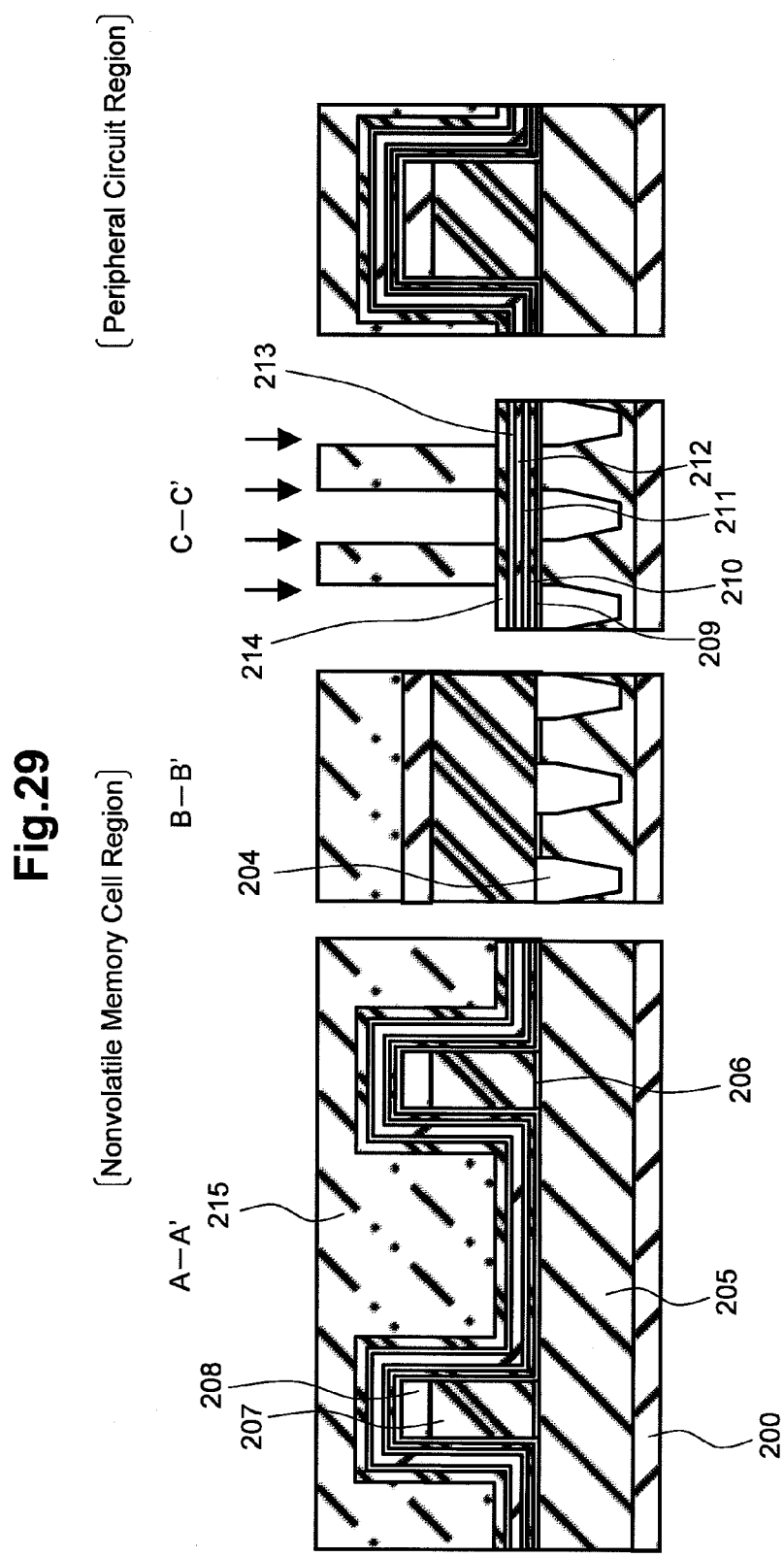
FIG. 29 is a view showing a part of the manufacturing method of the semiconductor device according to the second embodiment, which is subsequent to FIG. 28.

Next, as shown in FIG. 29, oxygen is implanted into the polysilicon film 209 present over the isolation regions 204 by ion implantation using a photoresist 215 as a mask to provide a silicon oxide film.

Figure 30:
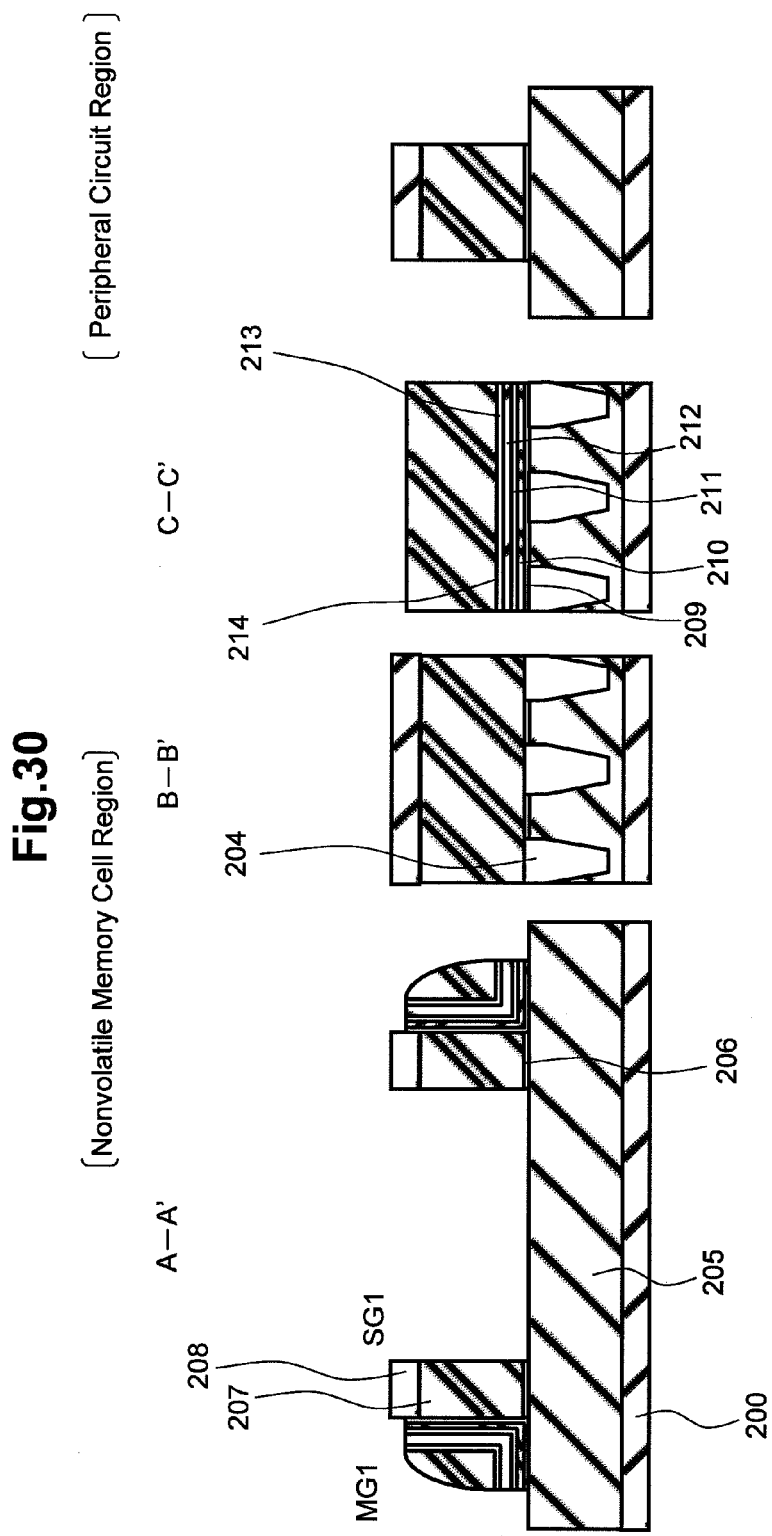
FIG. 30 is a view showing a part of the manufacturing method of the semiconductor device according to the second embodiment, which is subsequent to FIG. 29.

Next, as shown in FIG. 30, the foregoing stacked films from the silicon oxide film 209 to the polysilicon film 214 are anisotropically etched to form the memory gate electrodes MG1 having sidewall shapes. At this time, memory gate electrodes having sidewall shapes are formed on both sides of each of the selection gate electrodes such that the selection gate electrode is interposed therebetween. However, by lithography and etching, the unneeded memory gate electrode having the sidewall shape on one side of the selection gate electrode is removed so that the memory gate electrode is formed only on the other side.

Figure 31:
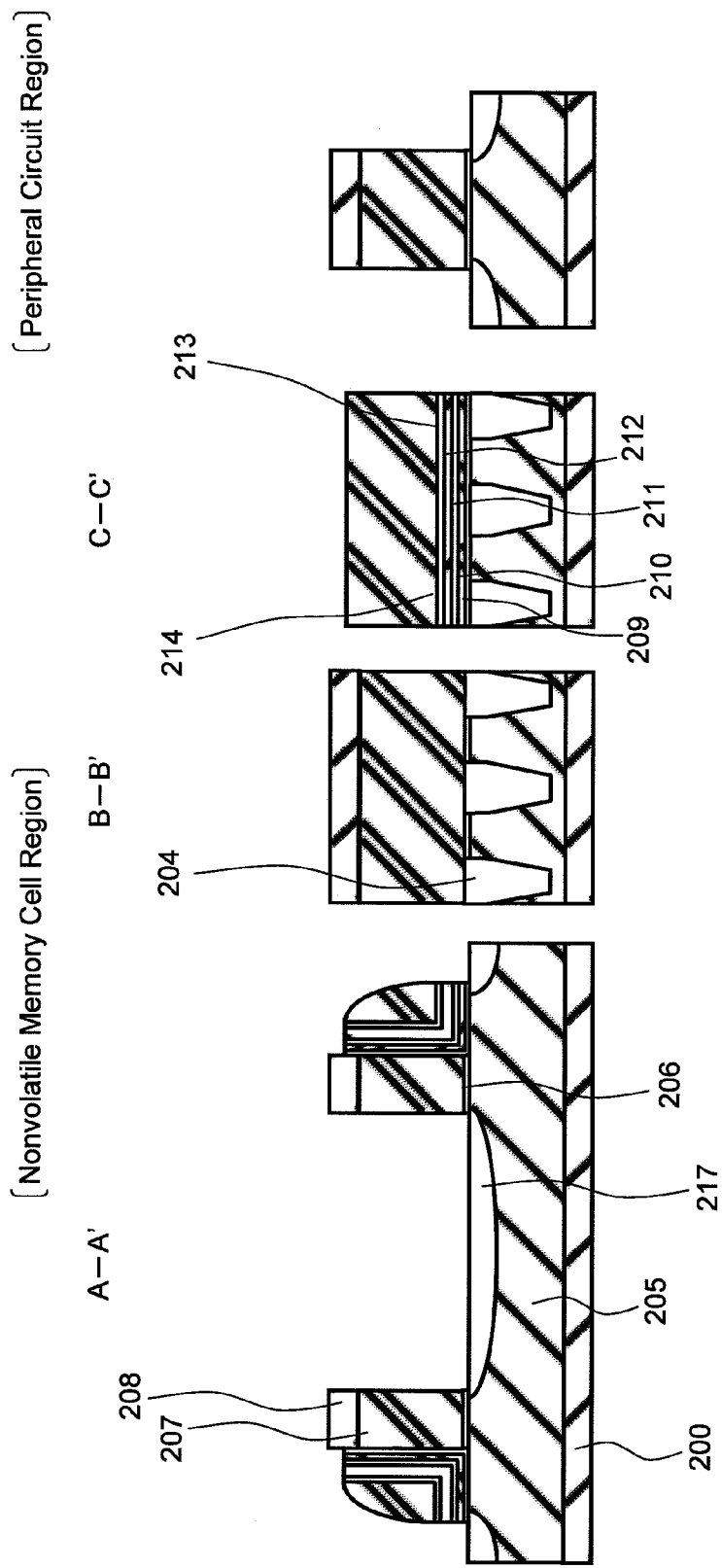
FIG. 31 is a view showing a part of the manufacturing method of the semiconductor device according to the second embodiment, which is subsequent to FIG. 30.
Figure 32:
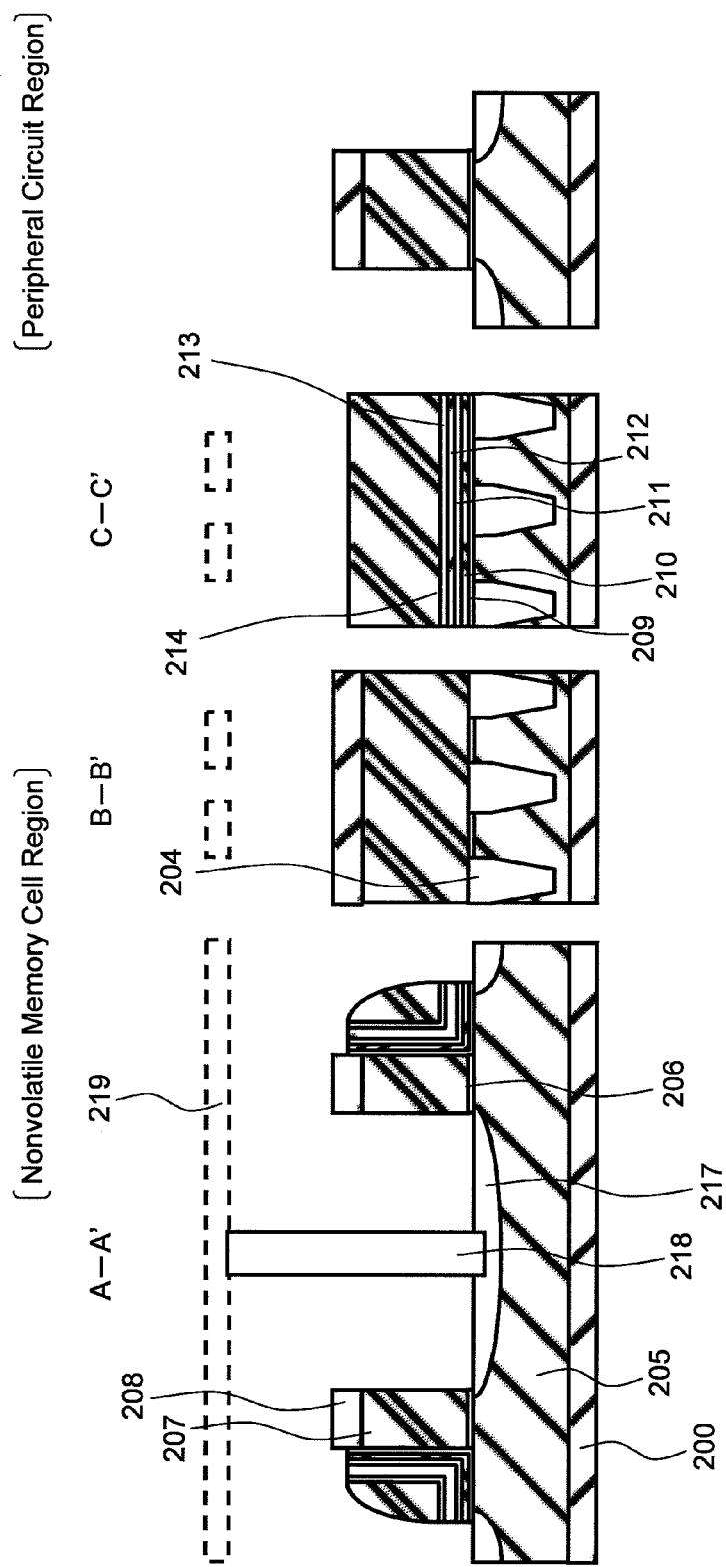
FIG. 32 is a view showing a part of the manufacturing method of the semiconductor device according to the second embodiment, which is subsequent to FIG. 31.

Next, as shown in FIG. 31, ion implantation for the diffusion layers of each of p-MOS and n-MOS transistors is performed to form source/drain regions 217. At this time, the selection gate electrodes and the source/drain regions may also be silicidized for lower resistances. Thereafter, through the same process flow as followed in the first embodiment, a semiconductor device as shown in FIG. 32 is completed.

In the semiconductor device described in the second embodiment, the memory gate electrodes are processed into the sidewall shapes. This offers the advantage of allowing a reduction in the parasitic capacitance between the adjacent selection gate electrodes, and provides a structure appropriate for high integration of the memory cells. In addition, in the manufacturing method described in the second embodiment, in the steps of forming the memory gate electrodes, the silicon oxide film 209 and the silicon oxide film 211 between the silicon substrate and the charge storage film are each formed to have a thickness of 1.5 nm, i.e., such that the sum of the thicknesses thereof is 3.0 nm, in the same manner as in the first embodiment. On the other hand, the silicon oxide film 213 between the charge storage film and the gate electrode is formed to have a thickness of 4.0 nm. That is, the silicon oxide films between the silicon substrate and the charge storage film are formed such that the sum of the thicknesses thereof is smaller than the thickness of the silicon oxide film between the charge storage film and the gate electrode. As a result, even when a sandwiched structure such that the conductive film is sandwiched between the oxide films is formed as in the second embodiment, transfer of charges to the charge storage film can be performed more excellently than in the case where the sum of the respective thicknesses of the silicon oxide films between the silicon substrate and the charge storage film is larger than the thickness of the silicon oxide film between the charge storage film and the gate electrode.

As an example of the conductive film 210 of the second embodiment, the doped polysilicon film doped with a p-type impurity or an n-type impurity is used in the description given above. However, it is also possible to use a metal material typically used in a semiconductor device, such as tungsten, aluminum, titanium, tantalum, nickel, or cobalt, or a silicide film thereof.

Also in the second embodiment, as an example of the charge storage film, the silicon nitride film is used in the description given above. However, the charge storage film may also be formed of a silicon oxynitride film.

In the second embodiment, each of the charge storage film and the conductive film is formed in the L-shaped shape having a portion extending along the main surface of the semiconductor substrate and a portion extending along the side surface of the selection gate electrode SG1.

Even when the conductive film is formed in a part of the space between the charge storage film and the silicon substrate, the intensity of the electric field (potential difference) is reduced. However, to provide the electric field potential between the charge storage film and the silicon substrate with a more gentle distribution, and further obtain the effect of capacitive coupling between each of the selection gate electrodes SG1 and the doped polysilicon film 210 as described above, the conductive film is more preferably formed to overlap the charge storage film, while occupying substantially the same area as that of the charge storage film. That is, the conductive film is more preferably formed to extend from the source/drain region adjacent to the silicon oxide film 209 to the vicinity of the uppermost portion of the surface of the memory gate electrode MG1 in contact with the insulating film 209.

Third Embodiment

A semiconductor device according to a third embodiment will be described using FIG. 33.

Figure 33:
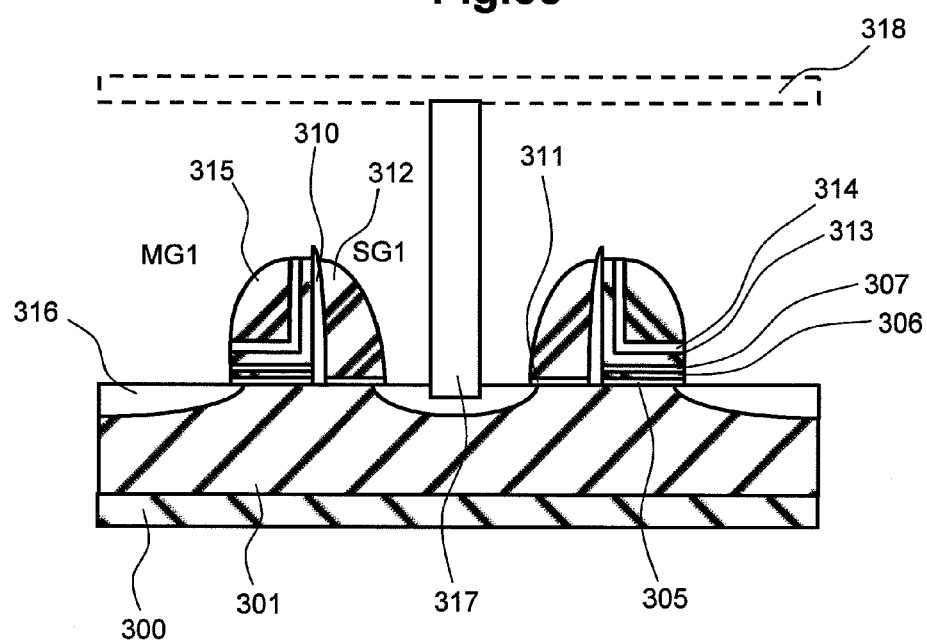
FIG. 33 is a partial cross-sectional view of a memory cell of a semiconductor device according to a third embodiment.

FIG. 33 is a cross-sectional view of a memory cell in a semiconductor device of the third embodiment. The structure in which the memory gate electrodes MG1 and the selection gate electrodes SG1 are formed in juxtaposition over a silicon substrate 300 formed with a p-type/n-type well 301 via silicon oxide films 310 as insulating films is the same as in the first and second embodiments.

The semiconductor device of the third embodiment is different from the semiconductor device of the first embodiment in the structure of each of the memory gate electrodes. In the third embodiment, the insulating film for insulating the memory gate electrode MG1 and the selection gate electrode SG1 has a stacked film structure including the silicon oxide film 310, a silicon nitride film 313, and a silicon oxide film 314. In each of the first and second embodiments, either one of the memory gate electrode and the selection gate electrode has the sidewall shape. However, in the third embodiment, both of the memory gate electrode and the selection gate electrode have sidewall shapes. This offers the advantage of allowing reductions in the parasitic capacitances between the adjacent memory gate electrodes and the adjacent selection gate electrodes, and provides a structure appropriate for high integration of the memory cells.

The block diagram of the semiconductor device, the structure of the memory cell array, and read, write, and erase operations to the memory cell are otherwise the same as in the first embodiment or the like. In the memory cell structure of the third embodiment also, a sandwiched structure such that the conductive film is sandwiched between the silicon oxide films is observed between the charge storage film and the silicon substrate. Therefore, in the semiconductor device having the MONOS nonvolatile memory cell of the third embodiment also, by providing the conductive film between the charge storage film and the semiconductor substrate, a threshold shift is suppressed. This can improve the data retention property and the reliability of the semiconductor device.

Next, using FIGS. 34 to 44, a manufacturing method of the semiconductor device according to the present embodiment will be described.

Figure 34:
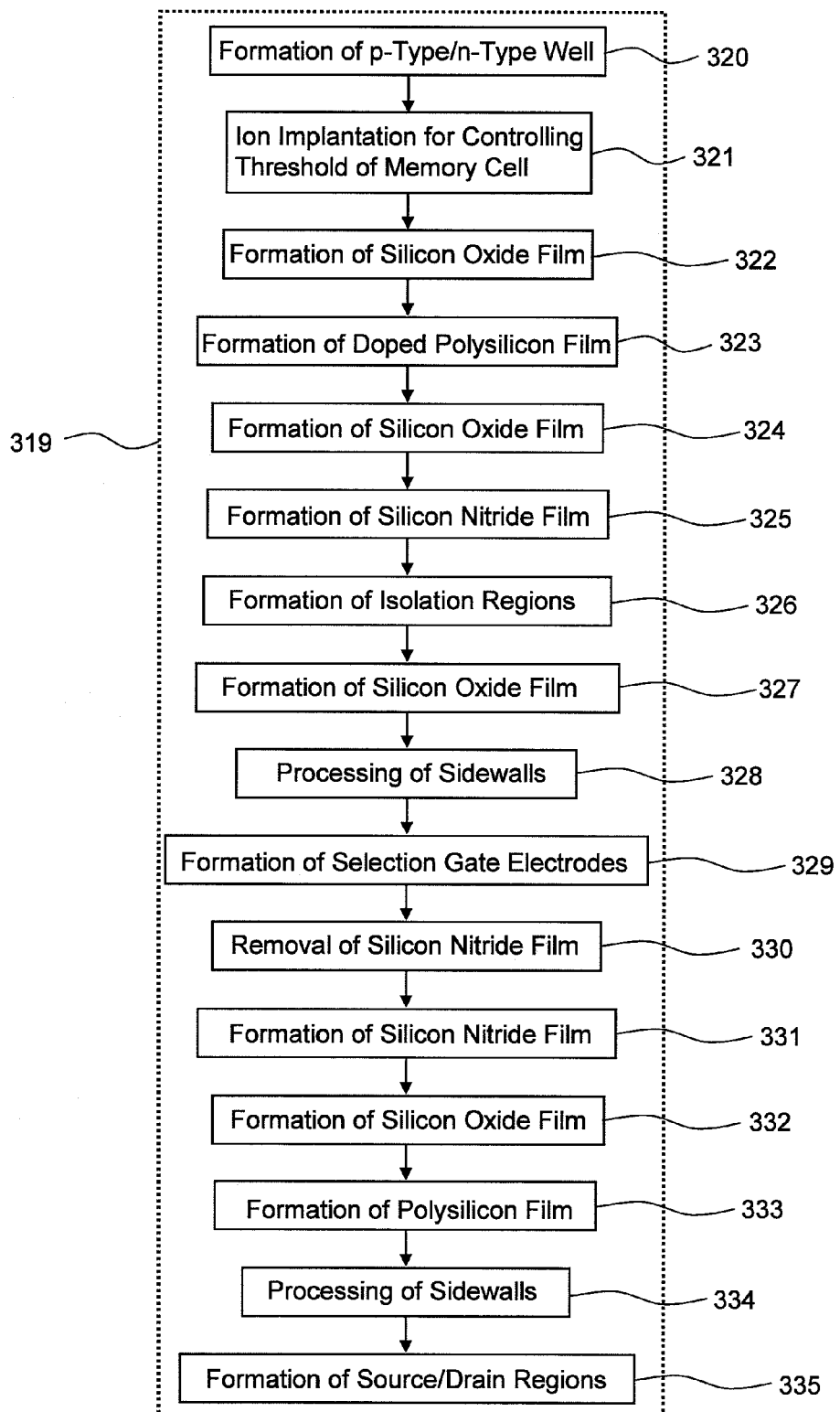
FIG. 34 is a process flow chart showing the steps of forming memory gate electrodes in the semiconductor device according to the third embodiment.

FIG. 34 is a process flow chart showing details of the steps of forming the memory gate electrodes as a main portion of the manufacturing method of the semiconductor device according to the present embodiment. FIGS. 35 to 44 show the process flow of FIG. 34 using partial cross-sectional views of the semiconductor substrate. The manufacturing method of the third embodiment described below is basically substantially the same as the manufacturing methods of the first and second embodiments in terms of the thicknesses of the films to be formed, forming methods thereof, and other conditions. Therefore, a repeated description of overlapping portions except for the important portions thereof will be minimized.

Figure 35:
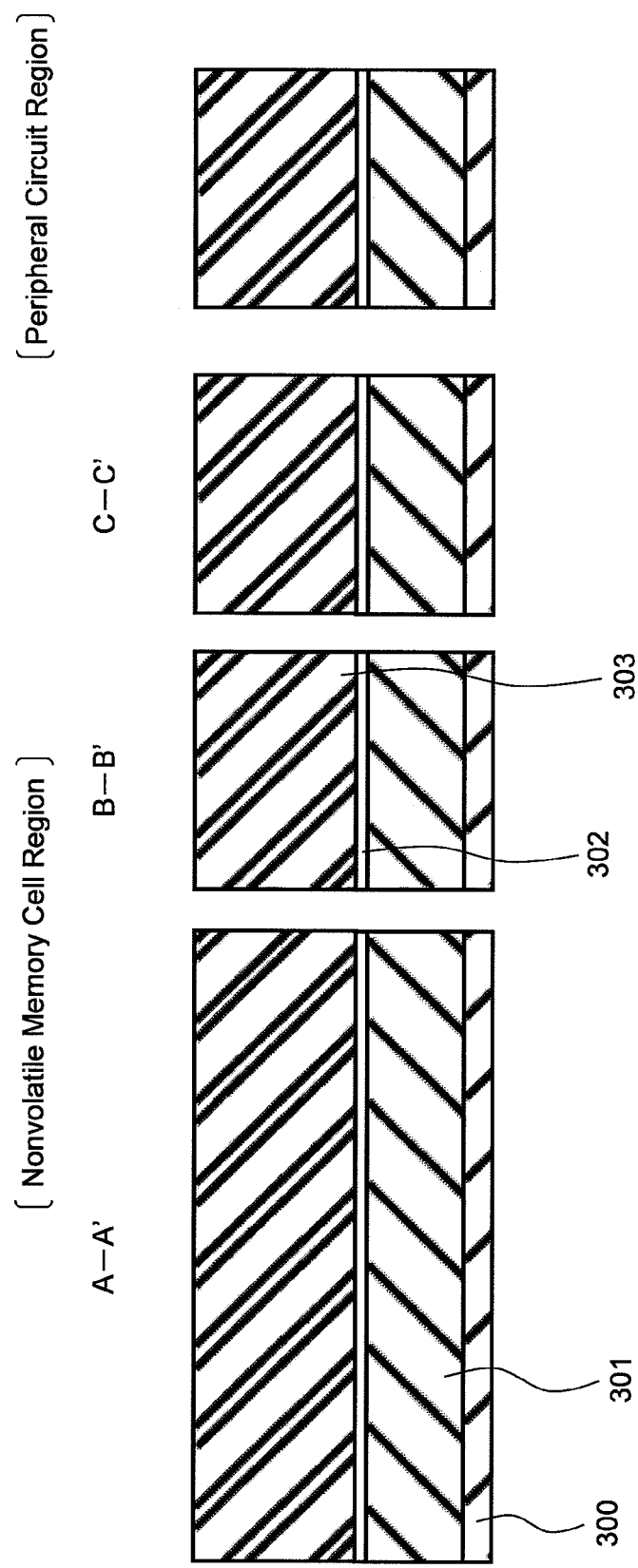
FIG. 35 is a view showing a part of a manufacturing method of the semiconductor device according to the third embodiment.

First, as shown in FIG. 35, over the silicon substrate 300, the p-type/n-type well 301 is formed. Then, by a thermal oxidation method, a silicon oxide film 302 serving as the gate oxide film of a MOS transistor in a peripheral circuit region is formed and, over the silicon oxide film 302, a polysilicon film 303 is formed by a CVD method.

Figure 36:
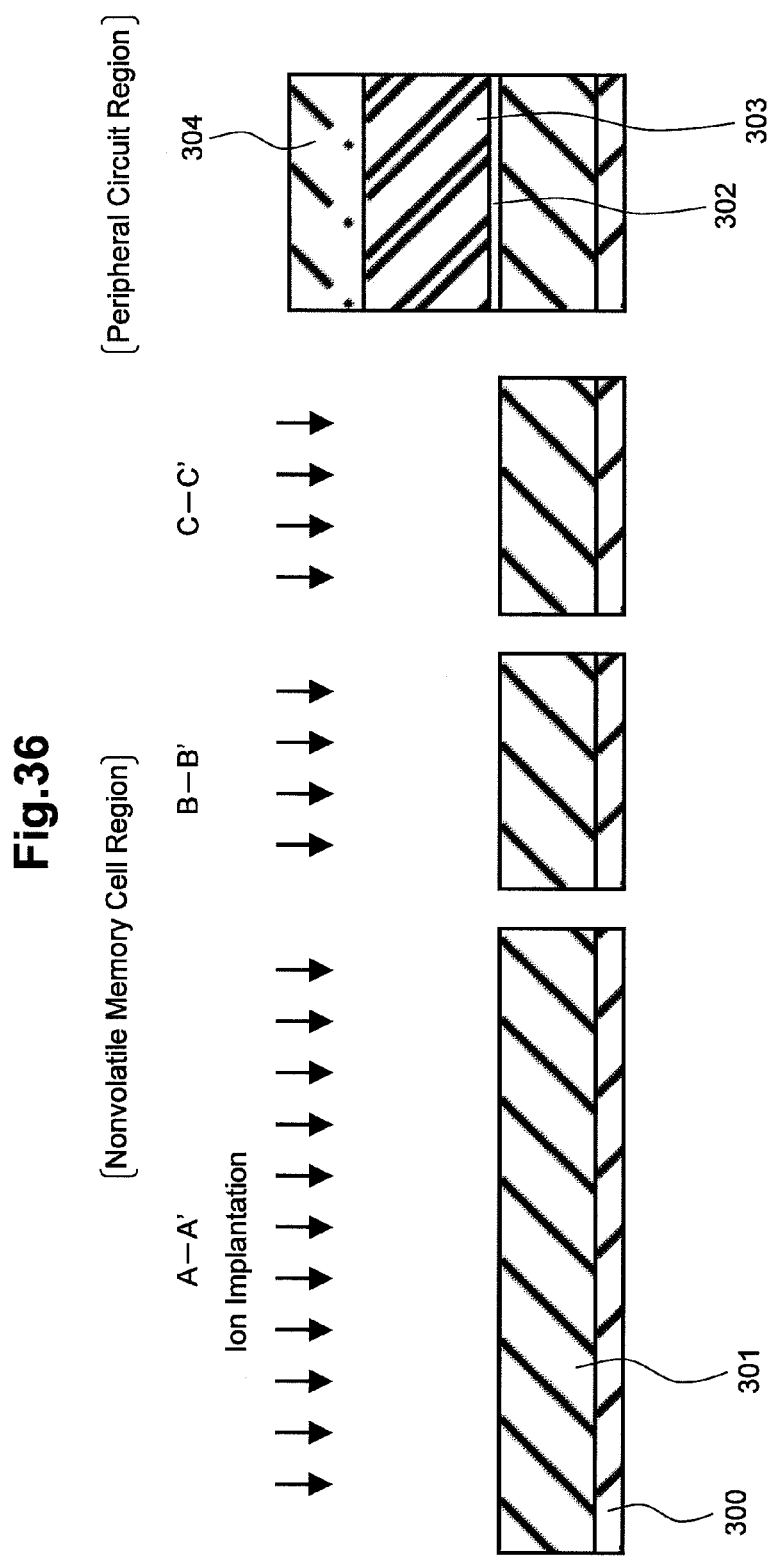
FIG. 36 is a view showing a part of the manufacturing method of the semiconductor device according to the third embodiment, which is subsequent to FIG. 35.

Next, as shown in FIG. 36, the silicon oxide film 302 and the polysilicon film 303 in the nonvolatile memory cell region are removed therefrom by lithography and dry etching. Subsequently, a photoresist film 304 is coated, and the photoresist film 304 in the nonvolatile memory cell region is removed therefrom by lithography. Thereafter, ion implantation for adjusting the threshold of the memory cell is performed.

Figure 37:
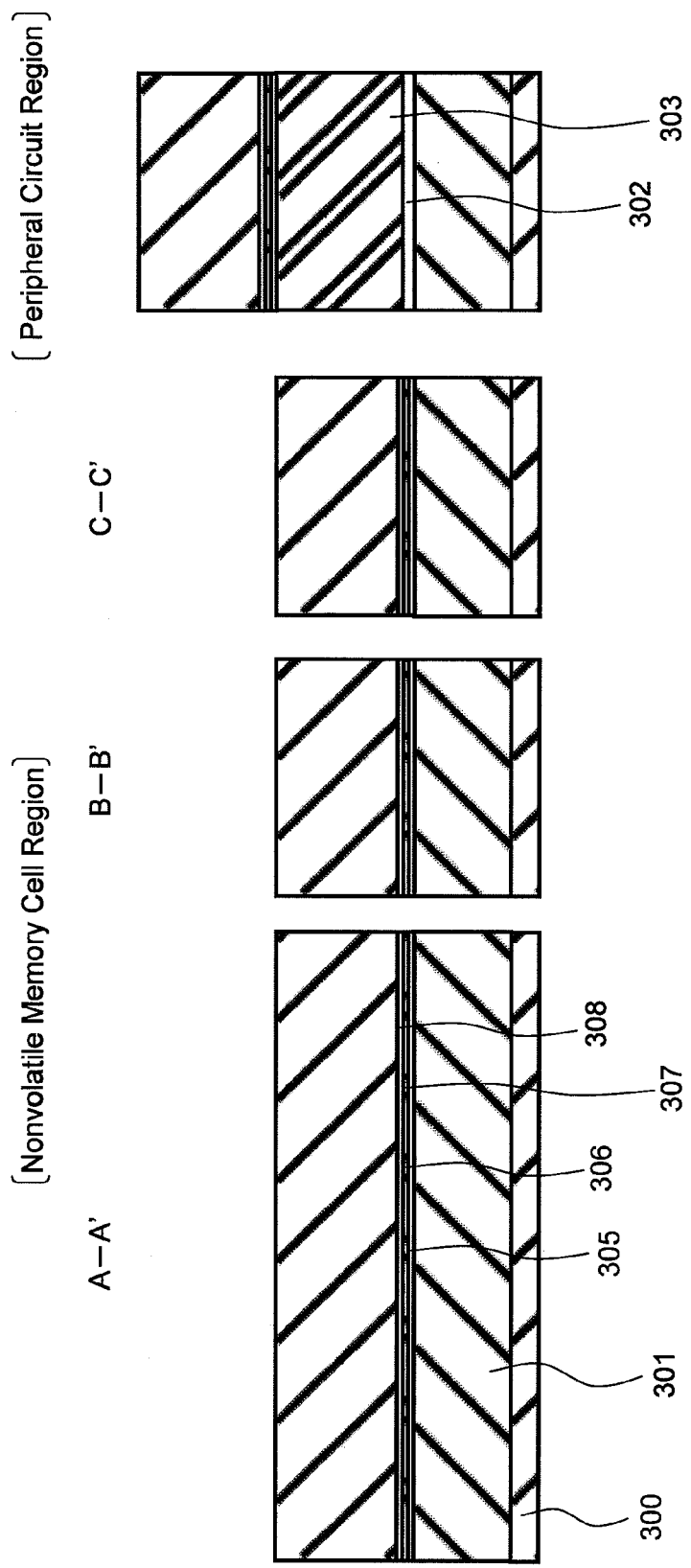
FIG. 37 is a view showing a part of the manufacturing method of the semiconductor device according to the third embodiment, which is subsequent to FIG. 36.

Next, as shown in FIG. 37, a silicon oxide film 305 having a thickness of, e.g., 1.5 nm is formed by a thermal oxidation method. Then, a doped polysilicon film 306 having a thickness of, e.g., 3 nm, a silicon oxide film 307 having a thickness of, e.g., 1.5 nm, and a silicon nitride film 308 are formed in succession. The silicon nitride film 308 is a so-called sacrificial film to be removed later by wet etching.

Figure 38:
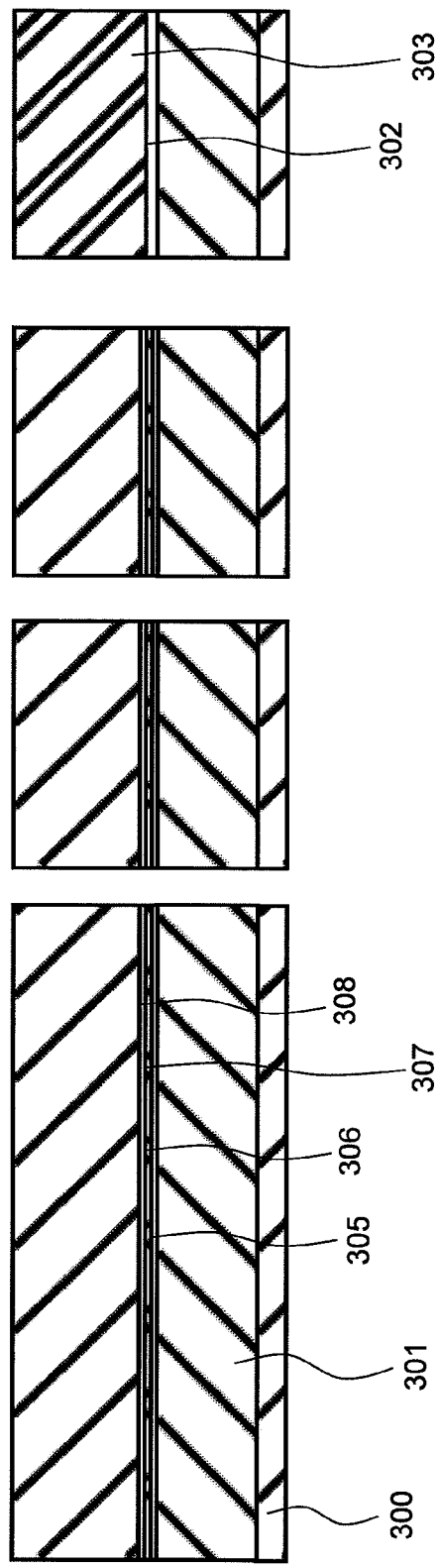
FIG. 38 is a view showing a part of the manufacturing method of the semiconductor device according to the third embodiment, which is subsequent to FIG. 37.

Next, as shown in FIG. 38, the silicon oxide film 305, the doped polysilicon film 306, the silicon oxide film 307, the silicon nitride film 308, and the silicon oxide film 109 formed in the peripheral circuit region are removed therefrom by lithography and dry etching.

Figure 39:
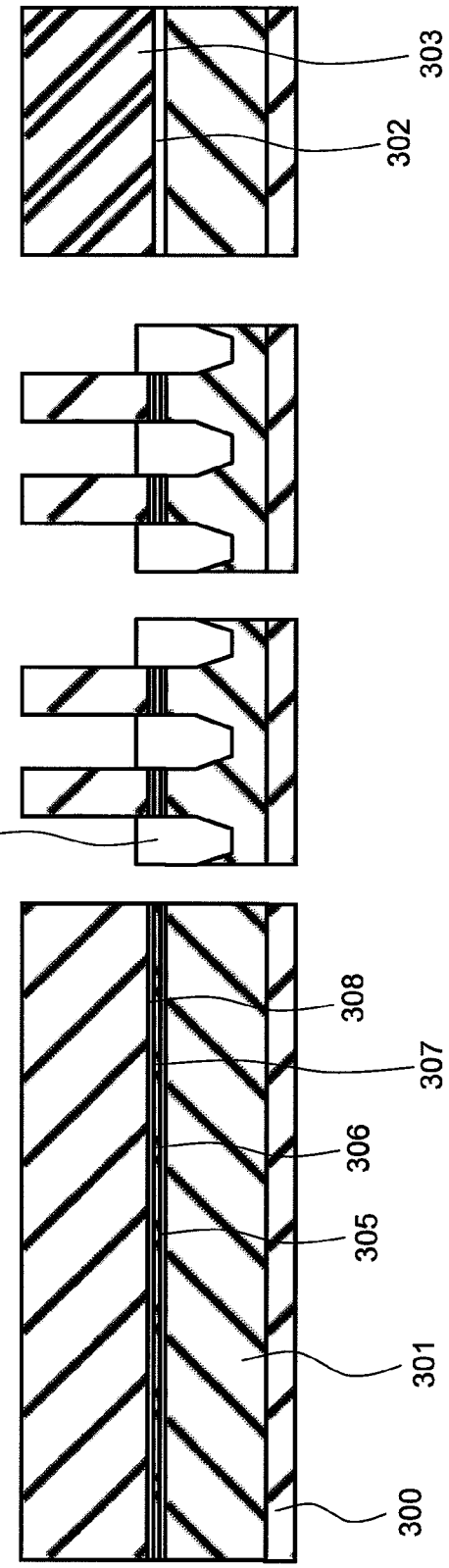
FIG. 39 is a view showing a part of the manufacturing method of the semiconductor device according to the third embodiment, which is subsequent to FIG. 38.

Next, as shown in FIG. 39, areas in the nonvolatile memory cell region serving as isolations 309 are etched to the silicon substrate 300, and a silicon oxide film is formed. Thereafter, the isolation regions 309 are formed by a CMP method and wet etching.

Figure 40:
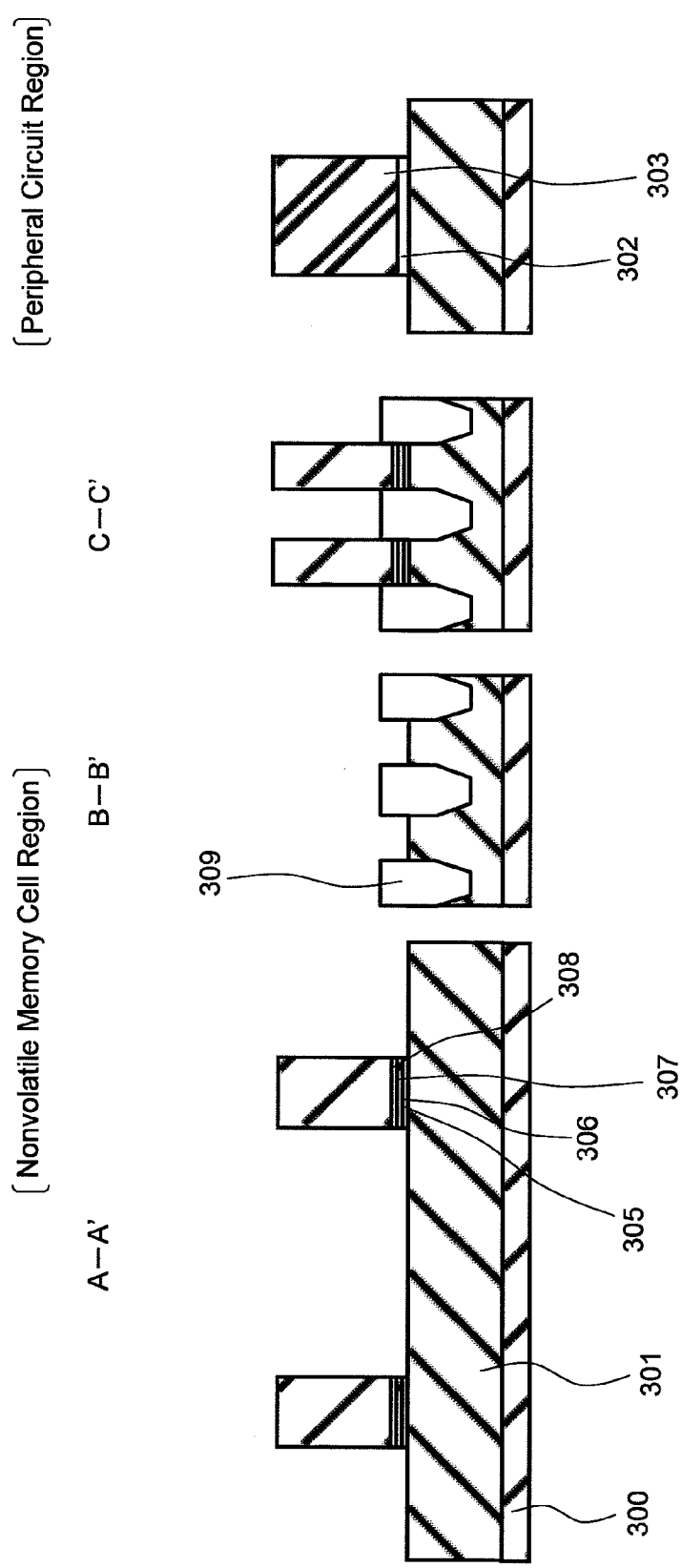
FIG. 40 is a view showing a part of the manufacturing method of the semiconductor device according to the third embodiment, which is subsequent to FIG. 39.

Next, as shown in FIG. 40, by lithography and etching, the memory gate electrodes and the MOS transistor in the peripheral circuit region are formed.

Figure 41:
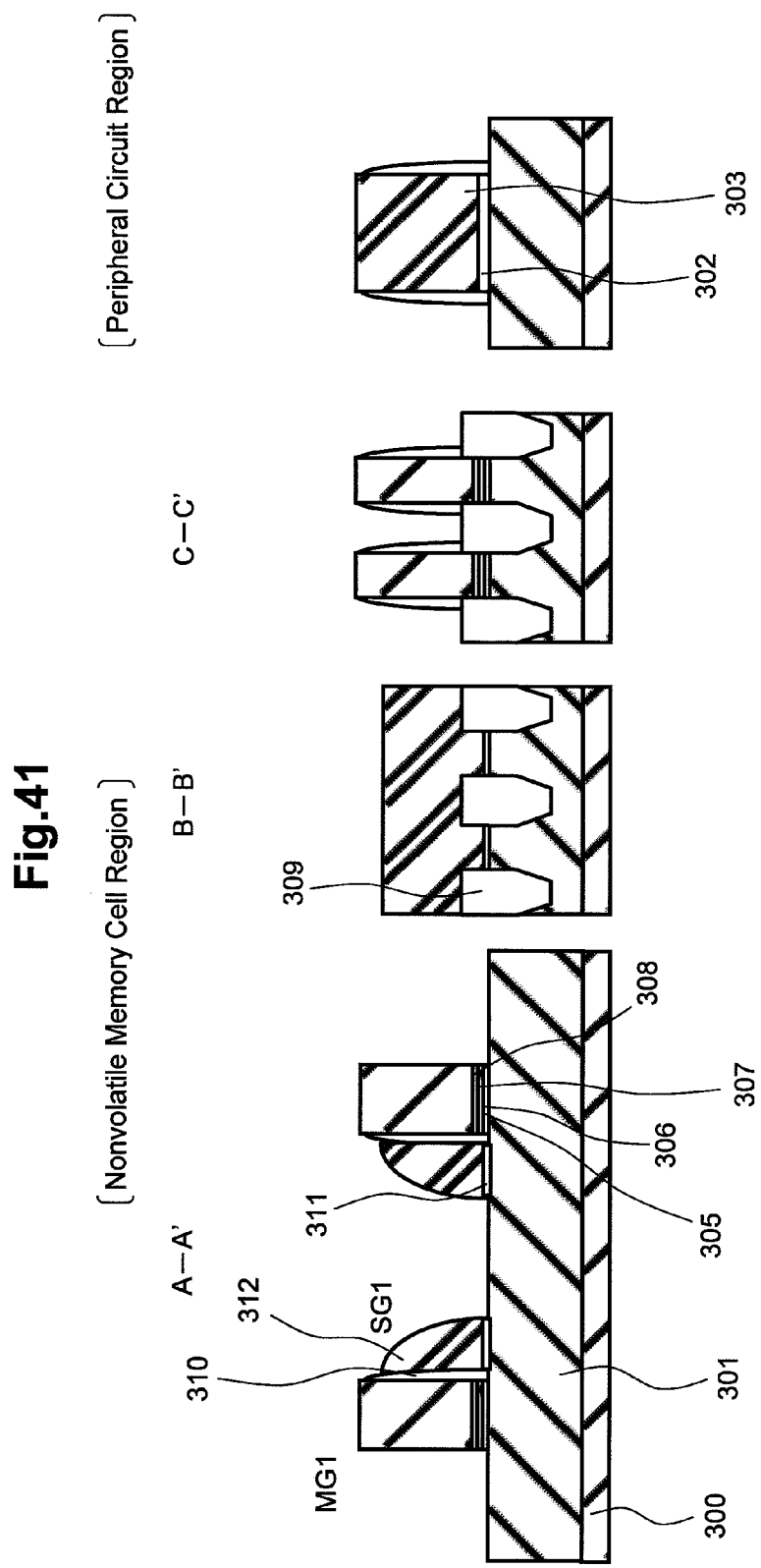
FIG. 41 is a view showing a part of the manufacturing method of the semiconductor device according to the third embodiment, which is subsequent to FIG. 40.

Next, as shown in FIG. 41, sidewalls for insulating the memory gate electrodes and the selection gate electrodes are each formed of the silicon oxide film 310, and ion implantation (not shown) for adjusting the thresholds of the selection gate electrodes is performed. Subsequently, over the silicon substrate, a silicon oxide film 311 is formed by a thermal oxidation method. Thereafter, a polysilicon film 312 is formed, and formed into the selection gate electrodes SG1 having the sidewall shapes by anisotropic etching. At this time, selection gate electrodes having sidewall shapes are formed on both sides of each of the memory gate electrodes MG such that the memory gate electrode MG is interposed therebetween. However, by lithography and etching, the unneeded selection gate electrode on one side of the memory gate electrode is removed.

Figure 42:
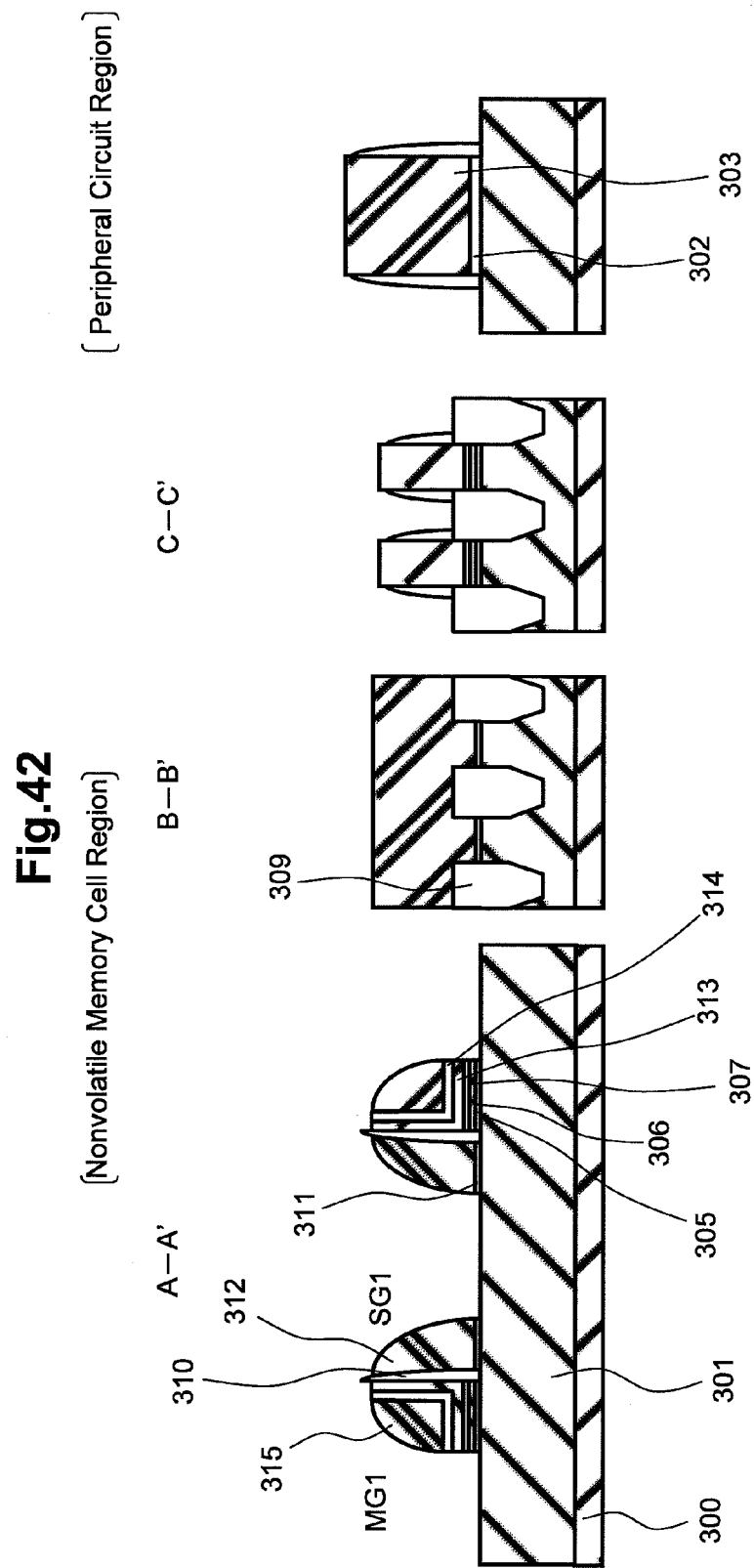
FIG. 42 is a view showing a part of the manufacturing method of the semiconductor device according to the third embodiment, which is subsequent to FIG. 41.

Next, as shown in FIG. 42, the silicon nitride film 308 as the sacrificial film is removed by wet etching, and a silicon nitride film 313 as an insulating film serving as a charge storage film is formed to have a thickness of, e.g., 10 nm. A part of the silicon nitride film 313 is thermally oxidized to form a silicon oxide film 314 having a thickness of, e.g., 4 nm. Next, over the silicon oxide film 314, a polysilicon film 315 is formed. Thereafter, by anisotropic etching, the silicon nitride film 313, the silicon oxide film 314, and the polysilicon film 315 are processed to form the memory gate electrodes MG1. At this time, the polysilicon film 315 is processed into sidewall shapes.

Figure 43:
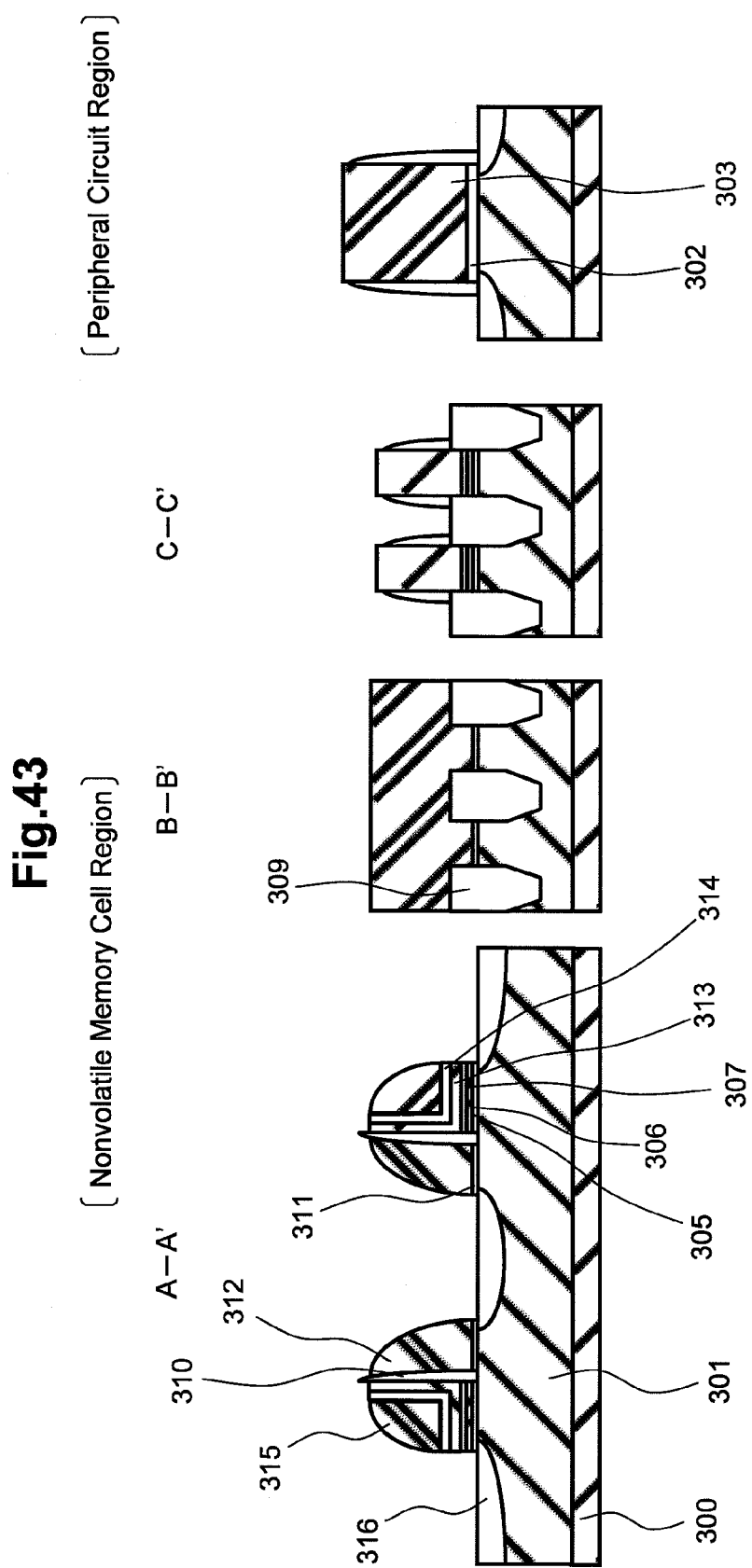
FIG. 43 is a view showing a part of the manufacturing method of the semiconductor device according to the third embodiment, which is subsequent to FIG. 42.
Figure 44:
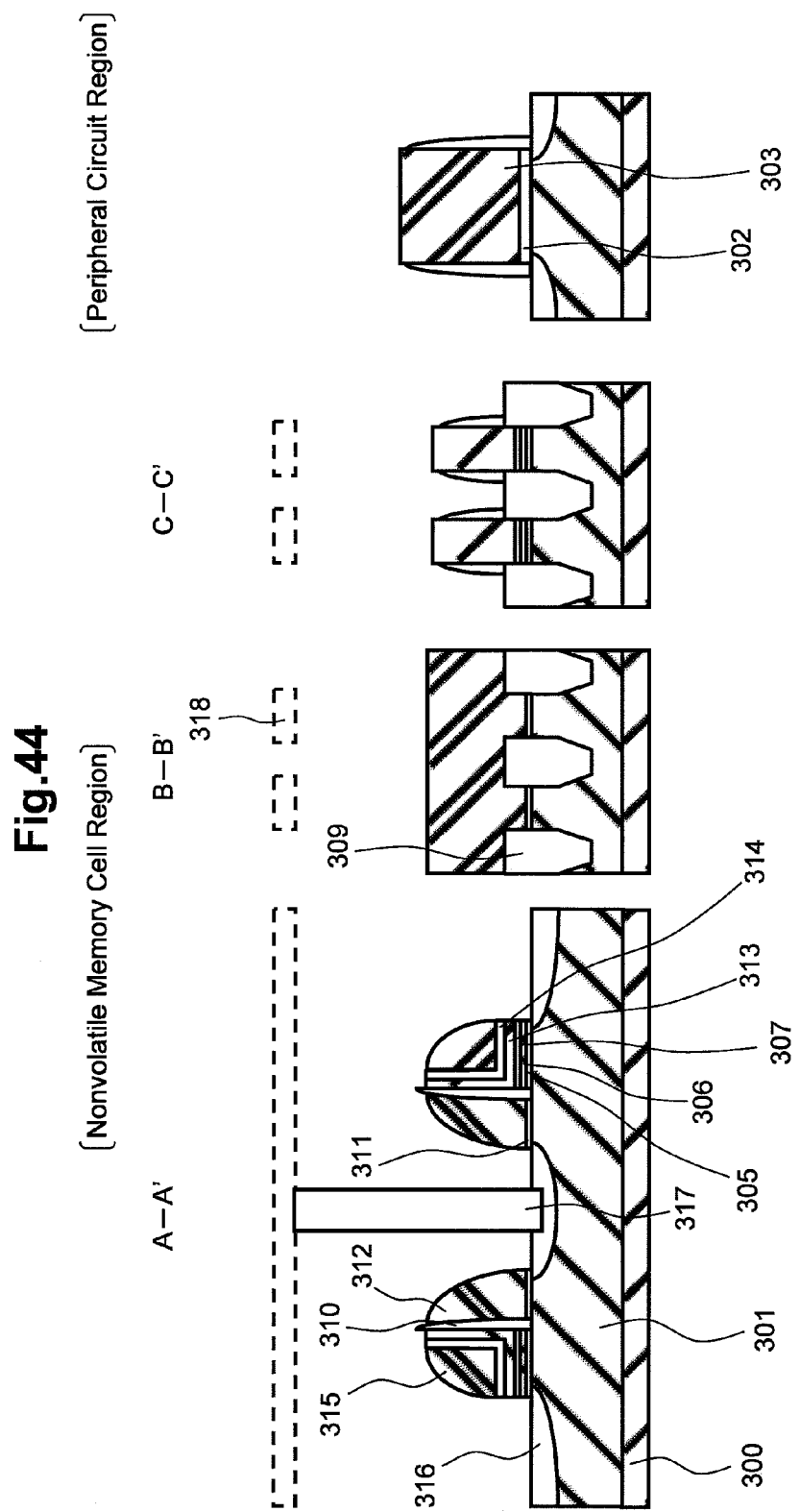
FIG. 44 is a view showing a part of the manufacturing method of the semiconductor device according to the third embodiment, which is subsequent to FIG. 43.

Next, as shown in FIG. 43, ion implantation for the diffusion layers of each of p-MOS and n-MOS transistors is performed to form source/drain regions 316. At this time, the selection gate electrodes and the source/drain regions may also be silicidized for lower resistances. Thereafter, through the same process flow as followed in the first embodiment or the second embodiment, a semiconductor device as shown in FIG. 44 is completed.

In the semiconductor device described in the third embodiment, both of the memory gate electrode and the selection gate electrode are processed into the sidewall shapes. This offers the advantage of allowing reductions in the parasitic capacitances between the adjacent memory gate electrodes and between the adjacent selection gate electrodes, and provides a structure appropriate for high integration of the memory cells. In addition, in the manufacturing method described in the third embodiment also, in the steps of forming the memory gate electrodes, the silicon oxide film 305 and the silicon oxide film 307 between the silicon substrate and the charge storage film are each formed to have a thickness of 1.5 nm, i.e., such that the sum of the thicknesses thereof is 3.0 nm, in the same manner as in the first embodiment or the second embodiment. On the other hand, the silicon oxide film 314 between the charge storage film and the gate electrode is formed to have a thickness of 4.0 nm. That is, the silicon oxide films between the silicon substrate and the charge storage film are formed such that the sum of the thicknesses thereof is smaller than the thickness of the silicon oxide film between the charge storage film and the gate electrode. As a result, even when a sandwiched structure such that the conductive film is sandwiched between the oxide films is formed as in the third embodiment, transfer of charges to the charge storage film can be performed more excellently than in the case where the sum of the respective thicknesses of the silicon oxide films between the silicon substrate and the charge storage film is larger than the thickness of the silicon oxide film between the charge storage film and the gate electrode.

Additionally, in the semiconductor device of the third embodiment, each of the insulating films between the memory gate electrodes and the selection gate electrodes has a stacked layer structure insulating the silicon oxide film, the silicon nitride film, and the silicon oxide film, resulting in a structure having a high dielectric breakdown voltage between the memory gate electrode and the selection gate electrode.

As an example of the conductive film 306 of the third embodiment, the doped polysilicon film doped with a p-type impurity or an n-type impurity is used in the description given above. However, it is also possible to use a metal material typically used in a semiconductor device, such as tungsten, aluminum, titanium, tantalum, nickel, or cobalt, or a silicide film thereof.

Also in the third embodiment, as an example of the charge storage film, the silicon nitride film is used in the description given above. However, the charge storage film may also be formed of a silicon oxynitride film.

In the third embodiment, the conductive film is formed to extend from the source/drain region adjacent to the silicon oxide film 305 to the silicon oxide film 310. Even when the conductive film is formed in a part of the space between the charge storage film and the silicon substrate, the intensity of the electric field (potential difference) is reduced. However, to provide the electric field potential between the charge storage film and the silicon substrate with a more gentle distribution, the conductive film is more preferably formed to two-dimensionally overlap the charge storage film, while occupying the same area as that of the portion of the charge storage film formed along the silicon substrate.

Fourth Embodiment

A semiconductor device according to a fourth embodiment will be described using FIG. 45.

Figure 45:
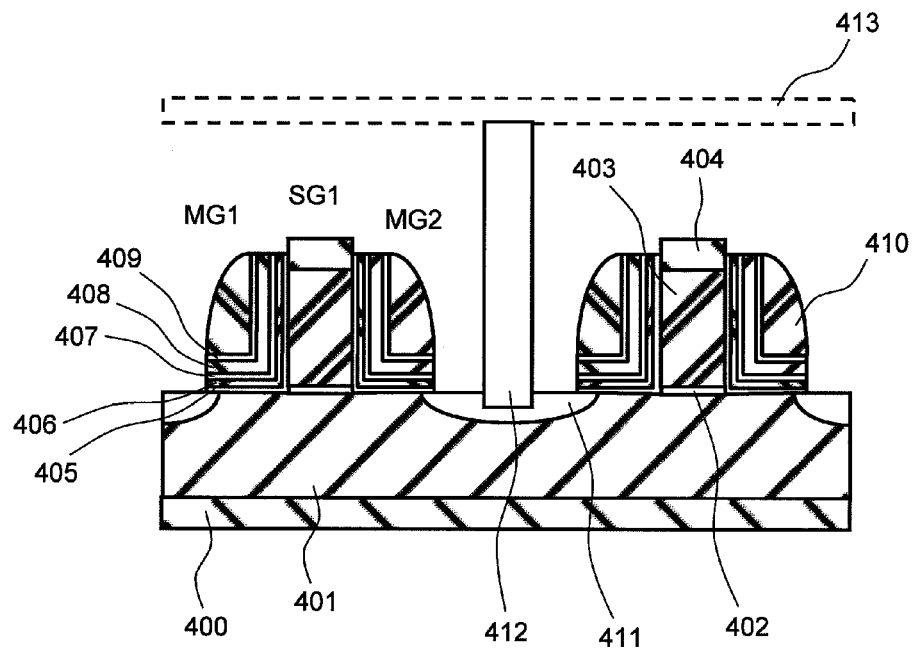
FIG. 45 is a partial cross-sectional view of a memory cell of a semiconductor device according to a fourth embodiment.

The memory cell of the fourth embodiment has a so-called twin MONOS structure as shown in FIG. 45. Data writing/erasing methods are hot electron injection using source-side injection and hot hole injection using band-to-band tunneling, in the same manner as in the first embodiment or the like.

In the semiconductor device of the fourth embodiment, the memory gate electrodes are formed on both sides of each of the selection gate electrodes such that the selection gate electrode is interposed therebetween, and a memory capacity is double the memory capacity in, e.g., the semiconductor device of the second embodiment. The memory cell structure of the fourth embodiment also has a sandwiched structure such that a conductive film is sandwiched between silicon oxide films between the charge storage film and the silicon substrate. Therefore, in the same manner as in, e.g., the semiconductor device of the second embodiment, it is possible to improve the data retention property of the semiconductor device having a MONOS nonvolatile memory, and improve the reliability of the semiconductor device.

In a manufacturing method of the semiconductor device of the fourth embodiment, the twin MONOS structure can be formed by, e.g., not removing the memory gate electrode on one side in FIG. 30 of the second embodiment. The thicknesses of films to be formed, forming methods thereof, and other conditions are basically substantially the same as in the second embodiment or the like, and therefore a description of overlapping portions will not be repeated.

Fifth Embodiment

A semiconductor device according to a fifth embodiment will be described using FIG. 46.

Figure 46:
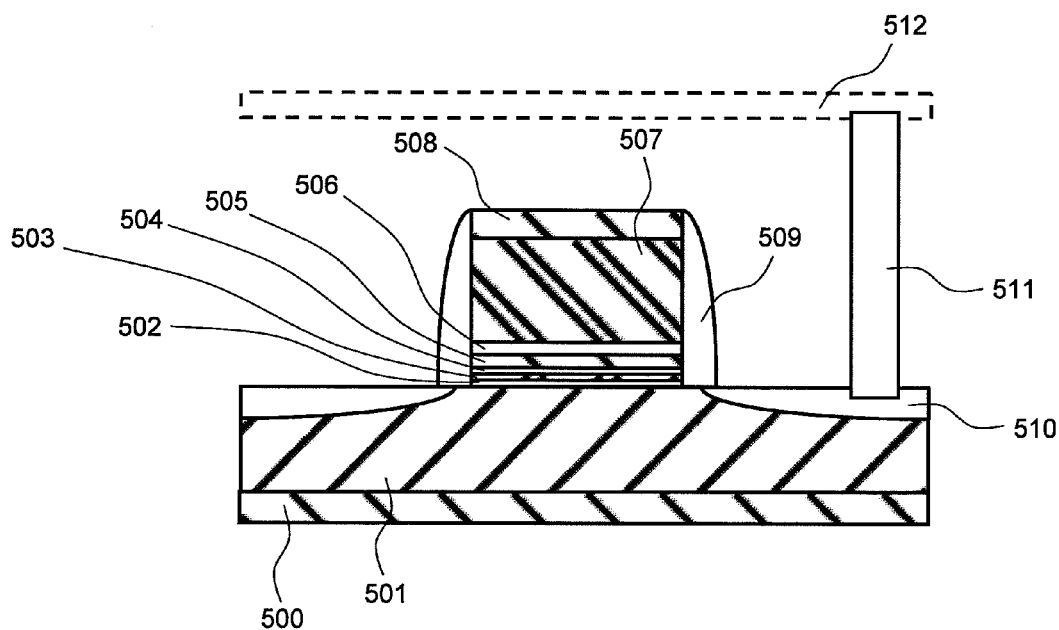
FIG. 46 is a partial cross-sectional view of a memory cell of a semiconductor device according to a fifth embodiment.
Figure 47:
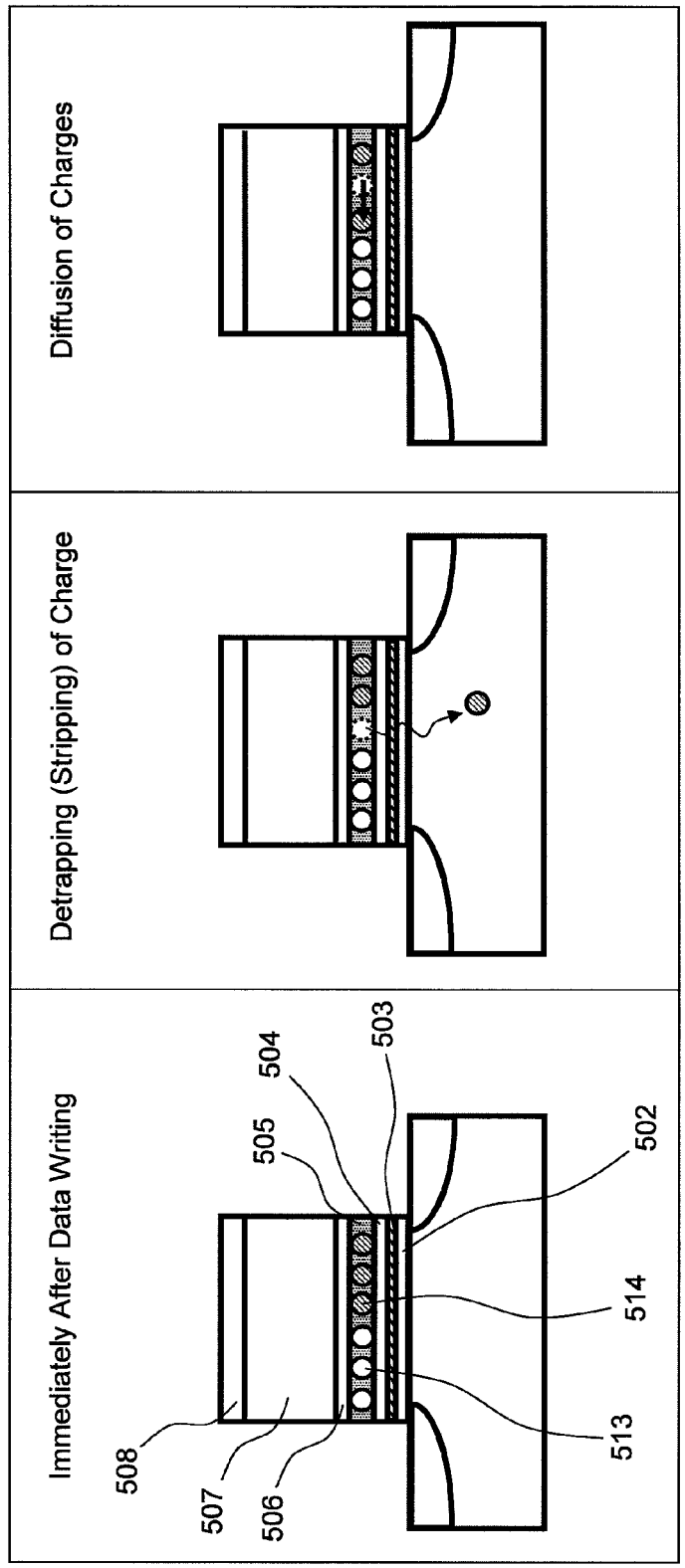
FIG. 47 is a view showing a conceptual image of detrapping and diffusion of charges in a memory cell.
Figure 48:
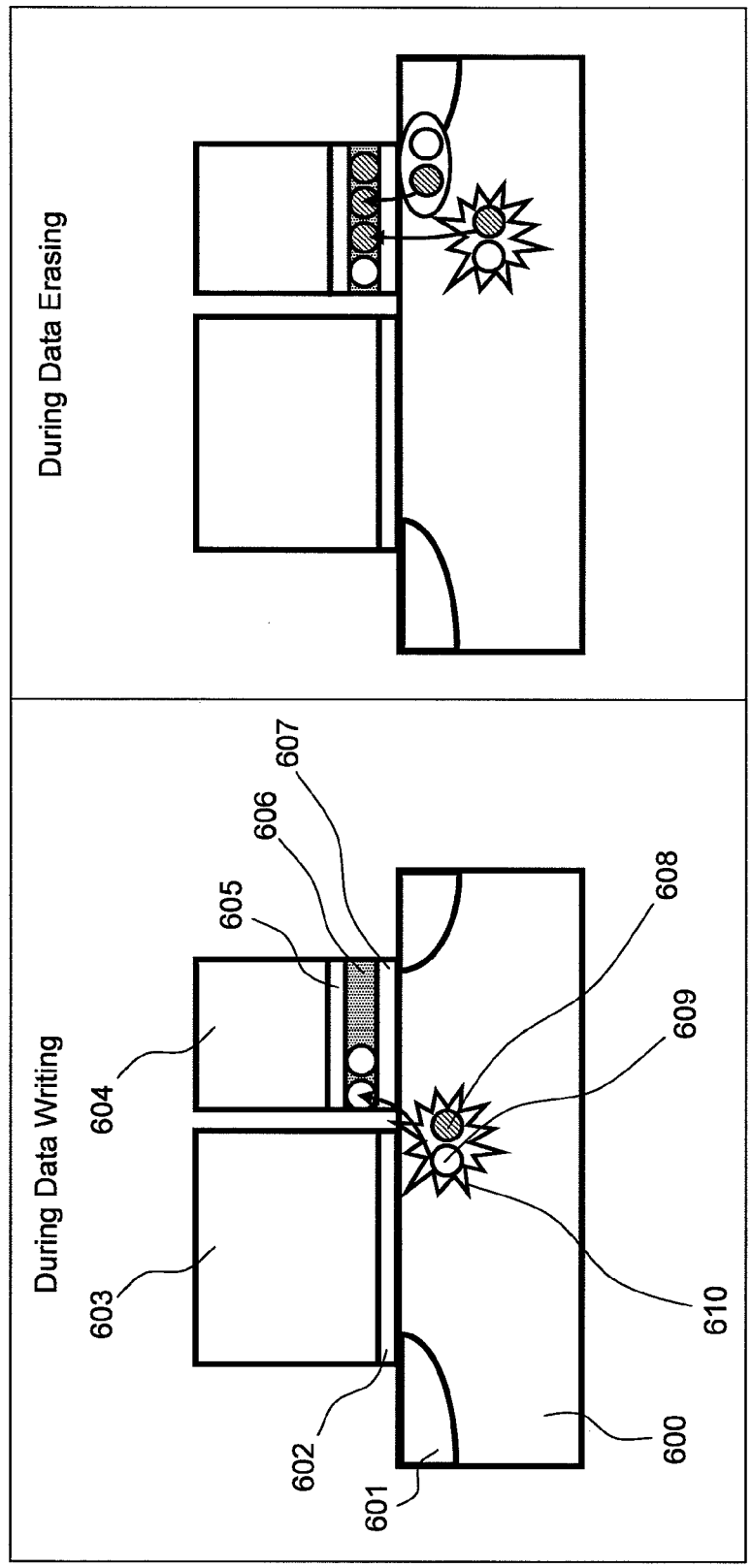
FIG. 48 is a view showing a conceptual image of a data write operation and a data erase operation in a memory cell.
Figure 49:
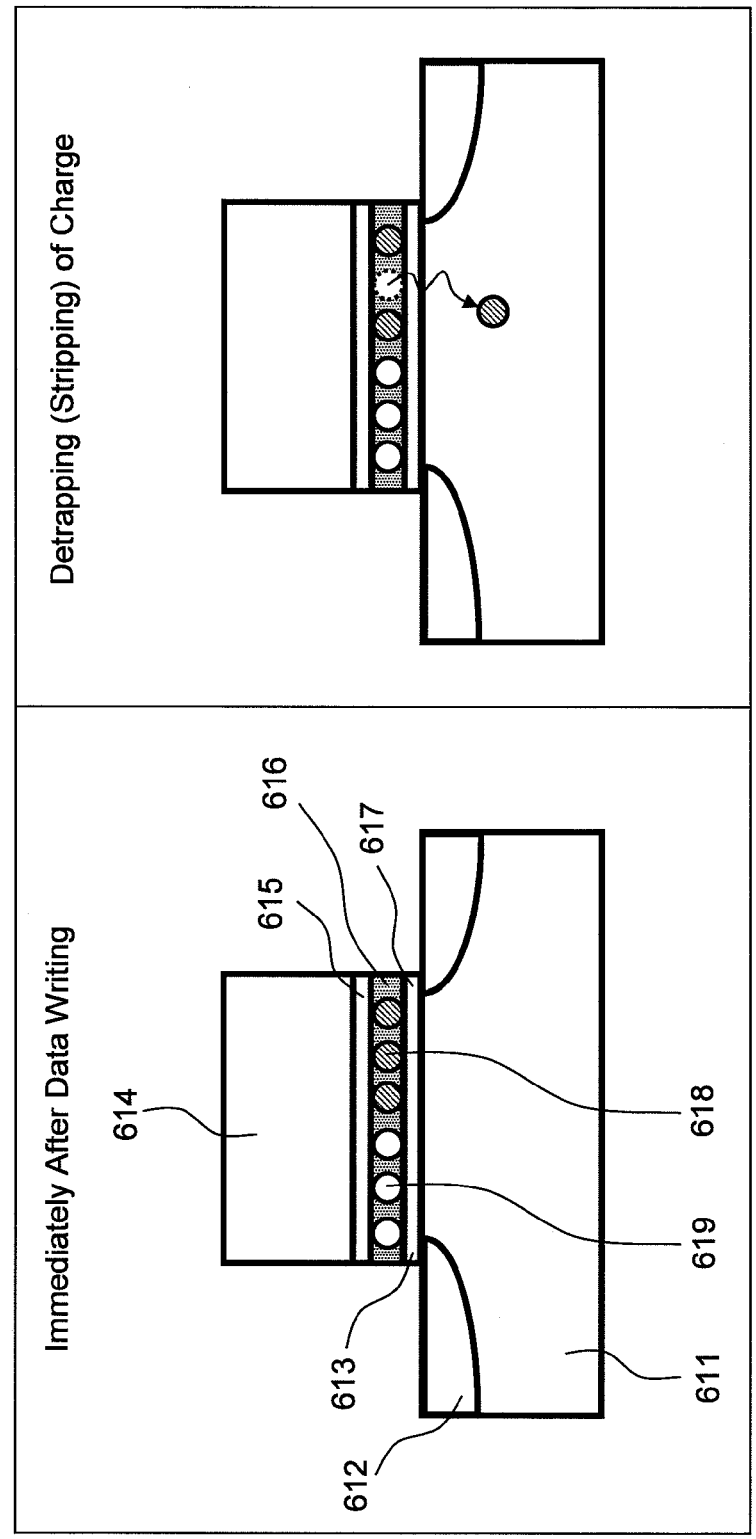
FIG. 49 is a view showing a conceptual image of detrapping of charges in the memory cell.

The memory cell of the fifth embodiment has a single transistor structure as shown in FIG. 46. Data writing/erasing methods are channel hot electron injection and hot hole injection using band-to-band tunneling. The memory cell structure of the fifth embodiment also has a sandwiched structure such that a conductive film is sandwiched between silicon oxide films between a charge storage film and a silicon substrate. Therefore, even when a charge is detrapped (stripped) from a silicon nitride film 505 serving as the charge storage film in which charges are stored, and diffusion and recombination of charges occur in the charge storage film as shown in FIG. 47, the conductive film provided between the charge storage film and the semiconductor substrate suppresses a threshold shift. As a result, it is possible to improve the data retention property and the reliability of the semiconductor device.

In a manufacturing method of the semiconductor device of the fifth embodiment, a memory gate electrode can be formed by substantially the same steps as included in, e.g., the flow of the memory gate electrode formation of the steps of forming the memory gate electrodes of the first embodiment. The thicknesses of films to be formed, forming methods thereof, and other conditions are basically substantially the same as in the first embodiment or the like, and therefore a description of overlapping portions will not be repeated.

While the invention achieved by the present inventors has been described heretofore based on the embodiments thereof, the present invention is not limited thereto. It will be appreciated that various changes and modifications can be made in the invention within the scope not departing from the gist thereof.

For example, in each of the embodiments described above, the description has been given specifically by using, as an example, the case where the CVD method is primarily used as the methods of forming the various films. However, it will be appreciated that another film formation method, such as a sputtering method, is also applicable to the present invention.

What is claimed is:

1. A semiconductor device, comprising:
a nonvolatile memory cell formed in a main surface of a semiconductor substrate,
wherein the nonvolatile memory cell comprises:
a first insulating film formed over the semiconductor substrate;
a conductive film formed over the first insulating film;
a second insulating film formed over the conductive film;
a charge storage film formed over the second insulating film to be capable of storing therein charges;
a third insulating film formed over the charge storage film;
a first gate electrode formed over the third insulating film;
a fourth insulating film formed to come in contact with the set of stacked films from the first insulating film to the first gate electrode;
a fifth insulating film formed over the semiconductor substrate so as to be juxtaposed with the first insulating film;
a second gate electrode formed over the fifth insulating film and in a side surface of the fourth insulating film so as to be adjacent to the first gate electrode; and
source/drain regions formed in the semiconductor substrate such that the first gate electrode and the second gate electrode are each interposed therebetween, and
wherein the conductive film and the charge storage film are formed to two-dimensionally overlap each other.

2. A semiconductor device according to claim 1,
wherein the conductive film and the charge storage film are each formed to extend from the source/drain region adjacent to the first insulating film to the fourth insulating film.

3. A semiconductor device according to claim 1,
wherein the conductive film is a doped polysilicon film doped with a p-type impurity or an n-type impurity.

4. A semiconductor device according to claim 1,
wherein the charge storage film is a silicon nitride film.

5. A semiconductor device according to claim 1,
wherein the conductive film has a thickness of 1 to 10 nm.

6. A semiconductor device according to claim 1,
wherein a sum of respective thicknesses of the first insulating film and the second insulating film is smaller than a thickness of the third insulating film.

7. A semiconductor device according to claim 1,
wherein the second gate electrode has a sidewall shape.

8. A semiconductor device according to claim 1,
wherein a first voltage is applied to the first gate electrode, a second voltage is applied to the second gate electrode, a third voltage is applied to the drain region closer to the first gate electrode, and a fourth voltage lower than the third voltage is applied to the source region closer to the second gate electrode to cause transfer of charges to and from the charge storage film.

9. A semiconductor device, comprising:
a nonvolatile memory cell formed in a main surface of a semiconductor substrate,
wherein the nonvolatile memory cell comprises:
a first insulating film formed over the semiconductor substrate;
a conductive film formed over the first insulating film;
a second insulating film formed over the conductive film;
a charge storage film formed over the second insulating film to be capable of storing therein charges;
a third insulating film formed over the charge storage film;
a first gate electrode formed over the third insulating film;
a fourth insulating film formed over the semiconductor substrate so as to be juxtaposed with the first insulating film;
a second gate electrode formed over the fourth insulating film and in a side surface of the first insulating film so as to be adjacent to the first gate electrode; and
source/drain regions formed in the semiconductor substrate such that the first gate electrode and the second gate electrode are each interposed therebetween, and
wherein the set of stacked films from the first insulating film to the third insulating film comprise respective portions each extending along the main surface of the semiconductor substrate and respective portions each extending along a side surface of the second gate electrode.

10. A semiconductor device according to claim 9,
wherein the set of stacked films from the first insulating film to the third insulating films are formed to extend from the source/drain region adjacent to the first insulating film to a vicinity of an uppermost portion of a surface of the second gate electrode in contact with the first insulating film.

11. A semiconductor device according to claim 9,
wherein the conductive film is a doped polysilicon film doped with a p-type impurity or an n-type impurity.

12. A semiconductor device according to claim 9,
wherein the charge storage film is a silicon nitride film.

13. A semiconductor device according to claim 9,
wherein the conductive film has a thickness of 1 to 10 nm.

14. A semiconductor device according to claim 9,
wherein a sum of respective thicknesses of the first insulating film and the second insulating film is smaller than a thickness of the third insulating film.

15. A semiconductor device according to claim 9,
wherein the first gate electrode has a sidewall shape.

16. A semiconductor device according to claim 9,
wherein a first voltage is applied to the first gate electrode, a second voltage is applied to the second gate electrode, a third voltage is applied to the drain region closer to the first gate electrode, and a fourth voltage lower than the third voltage is applied to the source region closer to the second gate electrode to cause transfer of charges to and from the charge storage film.

17. A semiconductor device, comprising:
a nonvolatile memory cell formed in a main surface of a semiconductor substrate,
wherein the nonvolatile memory cell comprises:
a first insulating film formed over the semiconductor substrate;
a conductive film formed over the first insulating film;
a second insulating film formed over the conductive film;
a charge storage film formed over the second insulating film to be capable of storing therein charges;
a third insulating film formed over the charge storage film;
a first gate electrode formed over the third insulating film;
a fourth insulating film formed to come in contact with the set of stacked films from the first insulating film to the charge storage film;
a fifth insulating film formed over the semiconductor substrate so as to be juxtaposed with the first insulating film;
a second gate electrode formed over the fifth insulating film and in a side surface of the fourth insulating film so as to be adjacent to the first gate electrode; and
source/drain regions formed in the semiconductor substrate such that the first gate electrode and the second gate electrode are each interposed therebetween, and
wherein the charge storage film and the third insulating film comprise respective portions each extending along the main surface of the semiconductor substrate and respective portions each extending along a side surface of the second gate electrode.

18. A semiconductor device according to claim 17,
wherein the conductive film is formed to extend from the source/drain region adjacent to the first insulating film to the fourth insulating film.

19. A semiconductor device according to claim 17,
wherein the conductive film is a doped polysilicon film doped with a p-type impurity or an n-type impurity.

20. A semiconductor device according to claim 17,
wherein the charge storage film is a silicon nitride film.

21. A semiconductor device according to claim 17,
wherein the conductive film has a thickness of 1 to 10 nm.

22. A semiconductor device according to claim 17,
wherein a sum of respective thicknesses of the first insulating film and the second insulating film is smaller than a thickness of the third insulating film.

23. A semiconductor device according to claim 17,
wherein the first gate electrode has a sidewall shape.

24. A semiconductor device according to claim 17,
wherein a first voltage is applied to the first gate electrode, a second voltage is applied to the second gate electrode, a third voltage is applied to the drain region closer to the first gate electrode, and a fourth voltage lower than the third voltage is applied to the source region closer to the second gate electrode to cause transfer of charges to and from the charge storage film.

25. A semiconductor device, comprising:
a nonvolatile memory cell formed in a main surface of a semiconductor substrate,
wherein the nonvolatile memory cell comprises:
a first insulating film formed over the semiconductor substrate;
a first gate electrode formed over the first insulating film;
a second insulating film and a third insulating film formed along side surfaces of the first gate electrode and the main surface of the semiconductor substrate;

a first conductive film and a second conductive film respectively formed over the second insulating film and the third insulating film;

a fourth insulating film and a fifth insulating film respectively formed over the first conductive film and the second conductive film;

a first charge storage film and a second charge storage film respectively formed over the fourth insulating film and the fifth insulating film to be capable of storing therein charges;

a sixth insulating film and a seventh insulating film respectively formed over the first charge storage film and the second charge storage film;

a second gate electrode and a third gate electrode respectively formed over the sixth insulating film and the seventh insulating film; and source/drain regions formed in the semiconductor substrate such that the first gate electrode, the second gate electrode, and the third gate electrode are each interposed therebetween, wherein the set of films from the second insulating film to the seventh insulating film comprise respective portions each extending along the main surface of the semiconductor substrate and respective portions each extending along a side surface of the second gate electrode.

26. A semiconductor device, comprising:

a nonvolatile memory cell formed in a main surface of a semiconductor substrate, wherein the nonvolatile memory cell comprises:

a first insulating film formed over the semiconductor substrate;

a conductive film formed over the first insulating film;

a second insulating film formed over the conductive film;

a charge storage film formed over the second insulating film to be capable of storing therein charges;

a third insulating film formed over the charge storage film;

a gate electrode formed over the third insulating film; and source/drain regions formed in the semiconductor substrate such that the gate electrode is interposed therebetween, and wherein the conductive film and the charge storage film are formed to two-dimensionally overlap each other.

27. A method of manufacturing a semiconductor device comprising a nonvolatile memory cell, comprising the steps of:

(a) forming a first insulating film over a semiconductor substrate;

(b) forming a conductive film over the first insulating film;

(c) forming a second insulating film over the conductive film;

(d) forming a charge storage film capable of storing therein charges over the second insulating film;

(e) forming a third insulating film over the charge storage film;

(f) forming a first gate electrode film over the third insulating film;

(g) processing the set of stacked films from the first insulating film to the first gate electrode film by dry etching to form a first gate electrode;

(h) after the step (g), forming a fourth insulating film over a side surface of the first gate electrode;

(i) after the step (h), forming a fifth insulating film over the semiconductor substrate;

(j) after the step (i), forming a second gate electrode film over the fifth insulating film;

(k) after the step (j), processing the second gate electrode film into a sidewall shape by dry etching to form a second gate electrode; and (l) after the step (k), introducing an impurity into the semiconductor substrate to form source/drain regions of the nonvolatile memory cell.

28. A manufacturing method of a semiconductor device according to claim 27, wherein, in the step (b), the conductive film is formed of a doped polysilicon film doped with a p-type impurity or an n-type impurity.

29. A manufacturing method of a semiconductor device according to claim 27, wherein, in the step (d), the charge storage film is formed of a silicon nitride film.

30. A manufacturing method of a semiconductor device according to claim 27, wherein, in the step (b), the conductive film is formed to have a thickness of 1 to 10 nm.

* * * * *